(12) United States Patent
Chou et al.

(10) Patent No.: US 8,592,977 B2
(45) Date of Patent: Nov. 26, 2013

(54) INTEGRATED CIRCUIT (IC) CHIP AND METHOD FOR FABRICATING THE SAME

(75) Inventors: Chiu-Ming Chou, Kao-suing (TW); Jin-Yuan Lee, Hsin-Chu (TW)

(73) Assignee: Megit Acquisition Corp., San Diego, CA (US)

( * ) Notice: Subject to any disclaimer, the term of this patent is extended or adjusted under 35 U.S.C. 154(b) by 629 days.

(21) Appl. No.: 11/769,735

(22) Filed: Jun. 28, 2007

(65) Prior Publication Data

US 2008/0001290 A1 Jan. 3, 2008

Related U.S. Application Data

(60) Provisional application No. 60/805,986, filed on Jun. 28, 2006.

(51) Int. Cl.
*H01L 23/48* (2006.01)
*H01L 23/52* (2006.01)

(52) U.S. Cl.
USPC ..... 257/751; 257/762; 257/765; 257/E23.145

(58) Field of Classification Search
USPC ........... 257/751, E23.079, 762, 765, E23.145
See application file for complete search history.

(56) References Cited

U.S. PATENT DOCUMENTS

| | | | |
|---|---|---|---|
| 6,008,543 A * | 12/1999 | Iwabuchi | 257/778 |
| 6,184,143 B1 | 2/2001 | Ohashi et al. | |
| 6,187,615 B1 * | 2/2001 | Kim et al. | 438/113 |
| 6,218,302 B1 | 4/2001 | Braeckelmann et al. | |
| 6,239,021 B1 * | 5/2001 | Pramanick et al. | 438/627 |
| 6,451,681 B1 | 9/2002 | Greer | |
| 6,614,119 B1 * | 9/2003 | Asahina et al. | 257/758 |
| 6,713,381 B2 | 3/2004 | Barr et al. | |
| 6,809,020 B2 | 10/2004 | Sakurai et al. | |
| 7,091,609 B2 * | 8/2006 | Matsumoto et al. | 257/753 |
| 7,314,819 B2 | 1/2008 | Hua et al. | |
| 7,319,277 B2 | 1/2008 | Lin | |
| 7,470,997 B2 | 12/2008 | Lin et al. | |
| 2001/0045651 A1 | 11/2001 | Saito et al. | |
| 2001/0051426 A1 | 12/2001 | Pozder et al. | |
| 2002/0000665 A1 * | 1/2002 | Barr et al. | 257/758 |
| 2002/0033531 A1 | 3/2002 | Matsushima et al. | |

(Continued)

FOREIGN PATENT DOCUMENTS

TW I249822 2/2006

OTHER PUBLICATIONS

Decision of Taiwan Application No. 096123393 dated Jan. 10, 2012 with English summary translation.

(Continued)

*Primary Examiner* — Nitin Parekh
(74) *Attorney, Agent, or Firm* — Seyfarth Shaw LLP

(57) ABSTRACT

A method for fabricating an integrated circuit (IC) chip includes providing a passivation layer over a circuit structure, an opening in the passivation layer exposing a pad of the circuit structure, next forming a first titanium-containing layer over the pad exposed by the opening, next performing an annealing process by heating the titanium-containing layer at a temperature of between 300 and 410° C. for a time of between 20 and 150 minutes in a nitrogen ambient with a nitrogen purity of great than 99%, next forming a second titanium-containing layer on the first titanium-containing layer, and then forming a metal layer on the second titanium-containing layer.

22 Claims, 36 Drawing Sheets

(56) References Cited

U.S. PATENT DOCUMENTS

| | | | |
|---|---|---|---|
| 2003/0216039 A1* | 11/2003 | Wang et al. | 438/684 |
| 2005/0017361 A1* | 1/2005 | Lin et al. | 257/756 |
| 2005/0020021 A1 | 1/2005 | Fujiwara et al. | |
| 2005/0037609 A1* | 2/2005 | Nakatani | 438/637 |
| 2006/0091536 A1* | 5/2006 | Huang et al. | 257/734 |

OTHER PUBLICATIONS

Mistry, K. et al. "A 45nm Logic Technology with High-k+ Metal Gate Transistors, Strained Silicon, 9 Cu Interconnect Layers, 193nm Dry Patterning, and 100% Pb-free Packaging," IEEE International Electron Devices Meeting (2007) pp. 247-250.

Edelstein, D.C., "Advantages of Copper Interconnects," Proceedings of the 12th International IEEE VLSI Multilevel Interconnection Conference (1995) pp. 301-307.

Theng, C. et al. "An Automated Tool Deployment for ESD (Electro-Static-Discharge) Correct-by-Construction Strategy in 90 nm Process," IEEE International Conference on Semiconductor Electronics (2004) pp. 61-67.

Gao, X. et al. "An improved electrostatic discharge protection structure for reducing triggering voltage and parasitic capacitance," Solid-State Electronics, 27 (2003), pp. 1105-1110.

Yeoh, A. et al. "Copper Die Bumps (First Level Interconnect) and Low-K Dielectrics in 65nm High Volume Manufacturing," Electronic Components and Technology Conference (2006) pp. 1611-1615.

Hu, C-K. et al. "Copper-Polyimide Wiring Technology for VLSI Circuits," Materials Research Society Symposium Proceedings VLSI V (1990) pp. 369-373.

Roesch, W. et al. "Cycling copper flip chip interconnects," Microelectronics Reliability, 44 (2004) pp. 1047-1054.

Lee, Y-H. et al. "Effect of ESD Layout on the Assembly Yield and Reliability," International Electron Devices Meeting (2006) pp. 1-4.

Yeoh, T-S. "ESD Effects on Power Supply Clamps," Proceedings of the 6th International Sympoisum on Physical & Failure Analysis of Integrated Circuits (1997) pp. 121-124.

Edelstein, D. et al. "Full Copper Wiring in a Sub-0.25 pm CMOS ULSI Technology," Technical Digest IEEE International Electron Devices Meeting (1997) pp. 773-776.

Venkatesan, S. et al. "A High Performance 1.8V, 0.20 pm CMOS Technology with Copper Metallization," Technical Digest IEEE International Electron Devices Meeting (1997) pp. 769-772.

Jenei, S. et al. "High Q Inductor Add-on Module in Thick Cu/SiLK™ single damascene," Proceedings from the IEEE International Interconnect Technology Conference (2001) pp. 107-109.

Groves, R. et al. "High Q Inductors in a SiGe BiCMOS Process Utilizing a Thick Metal Process Add-on Module," Proceedings of the Bipolar/BiCMOS Circuits and Technology Meeting (1999) pp. 149-152.

Sakran, N. et al. "The Implementation of the 65nm Dual-Core 64b Merom Processor," IEEE International Solid-State Circuits Conference, Session 5, Microprocessors, 5.6 (2007) pp. 106-107, p. 590.

Kumar, R. et al. "A Family of 45nm IA Processors," IEEE International Solid-State Circuits Conference, Session 3, Microprocessor Technologies, 3.2 (2009) pp. 58-59.

Bohr, M. "The New Era of Scaling in an SoC World," International Solid-State Circuits Conference (2009) Presentation Slides 1-66.

Bohr, M. "The New Era of Scaling in an SoC World," International Solid-State Circuits Conference (2009) pp. 23-28.

Ingerly, D. et al. "Low-K Interconnect Stack with Thick Metal 9 Redistribution Layer and Cu Die Bump for 45nm High Volume Manufacturing," International Interconnect Technology Conference (2008) pp. 216-218.

Kurd, N. et al. "Next Generation Intel® Micro-architecture (Nehalem) Clocking Architecture," Symposium on VLSI Circuits Digest of Technical Papers (2008) pp. 62-63.

Maloney, T. et al. "Novel Clamp Circuits for IC Power Supply Protection," IEEE Transactions on Components, Packaging, and Manufacturing Technology, Part C, vol. 19, No. 3 (Jul. 1996) pp. 150-161.

Geffken, R. M. "An Overview of Polyimide Use in Integrated Circuits and Packaging," Proceedings of the Third International Symposium on Ultra Large Scale Integration Science and Technology (1991) pp. 667-677.

Luther, B. et al. "Planar Copper-Polyimide Back End of the Line Interconnections for ULSI Devices," Proceedings of the 10th International IEEE VLSI Multilevel Interconnection Conference (1993) pp. 15-21.

Master, R. et al. "Ceramic Mini-Ball Grid Array Package for High Speed Device," Proceedings from the 45th Electronic Components and Technology Conference (1995) pp. 46-50.

Maloney, T. et al. "Stacked PMOS Clamps for High Voltage Power Supply Protection," Electrical Overstress/Electrostatic Discharge Symposium Proceedings (1999) pp. 70-77.

Lin, M.S. et al. "A New System-on-a-Chip (SOC) Technology—High Q Post Passivation Inductors," Proceedings from the 53rd Electronic Components and Technology Conference (May 30, 2003) pp. 1503-1509.

MEGIC Corp. "MEGIC way to system solutions through bumping and redistribution," (Brochure) (Feb. 6, 2004) pp. 1-3.

Lin, M.S. "Post Passivation Technology™—MEGIC® Way to System Solutions," Presentation given at TSMC Technology Symposium, Japan (Oct. 1, 2003) pp. 1-32.

Lin, M.S. et al. "A New IC Interconnection Scheme and Design Architecture for High Performance ICs at Very Low Fabrication Cost—Post Passivation Interconnection," Proceedings of the IEEE Custom Integrated Circuits Conference (Sep. 24, 2003) pp. 533-536.

Office Action issued Sep. 14, 2010 for Taiwan Application No. 096123393 with English Summary Translation.

* cited by examiner

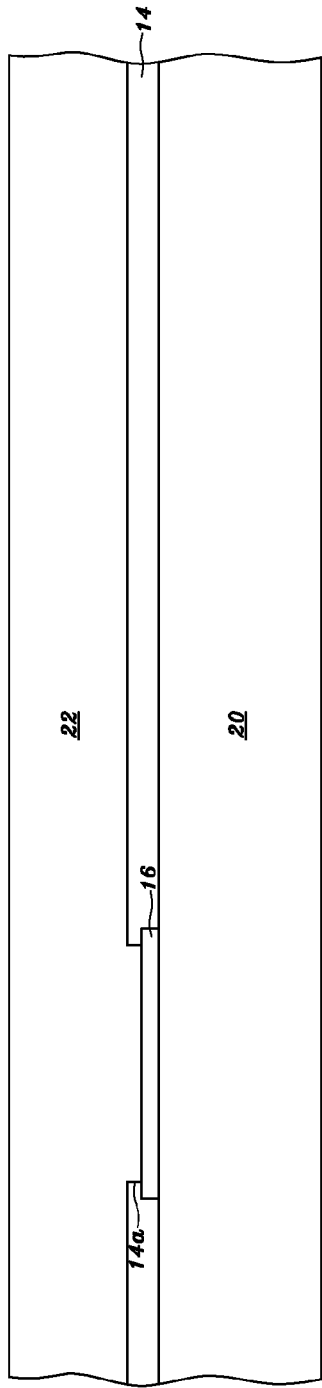
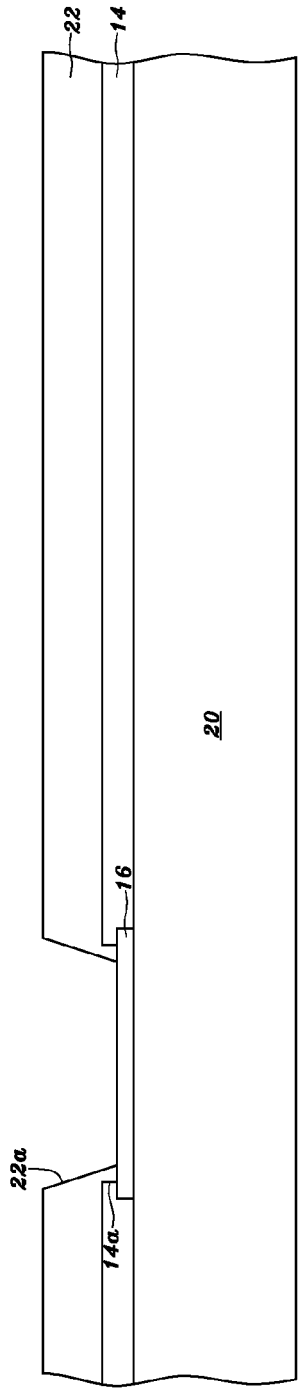
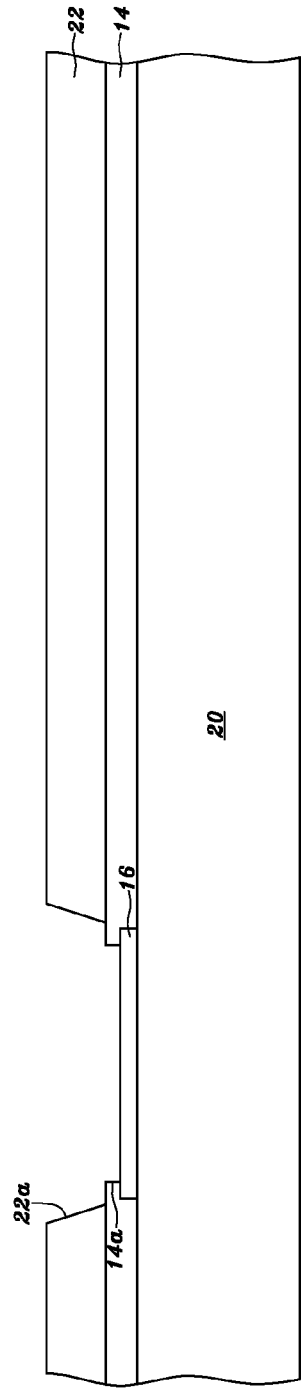
Fig. 2A
Fig. 2B
Fig. 2C

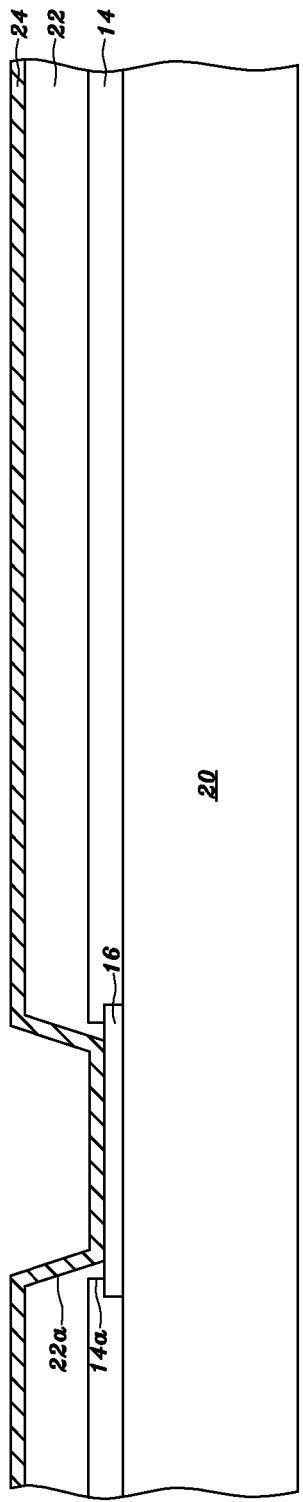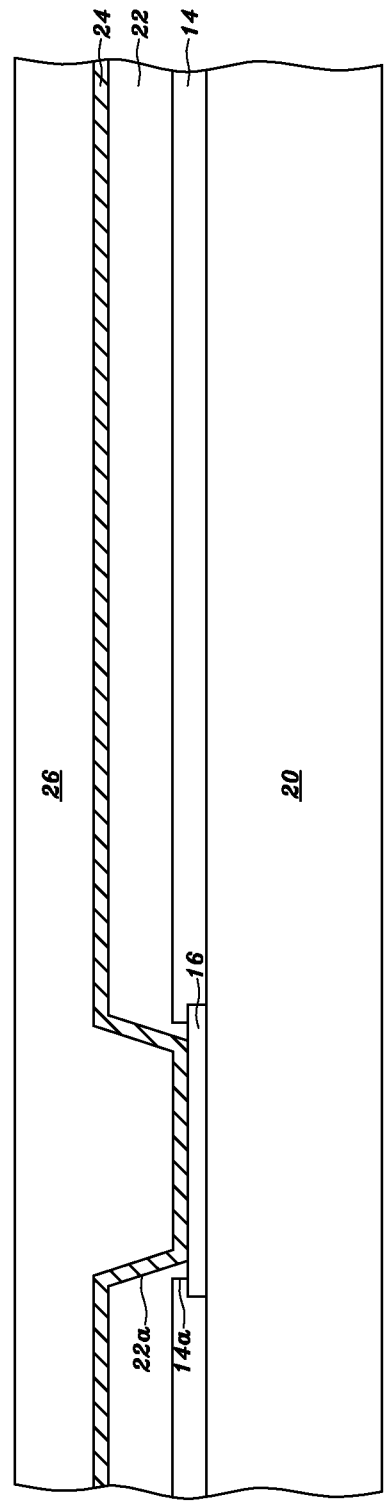

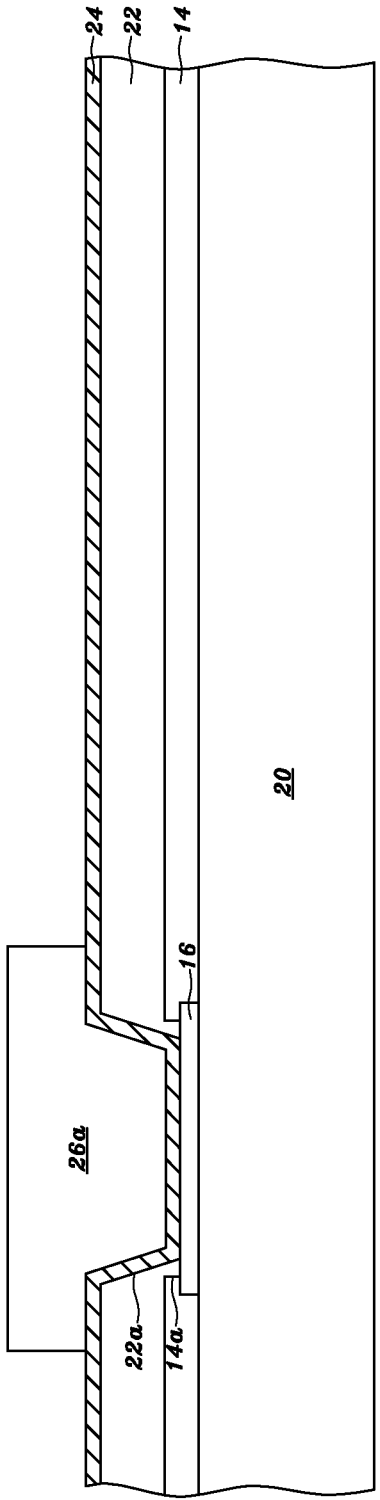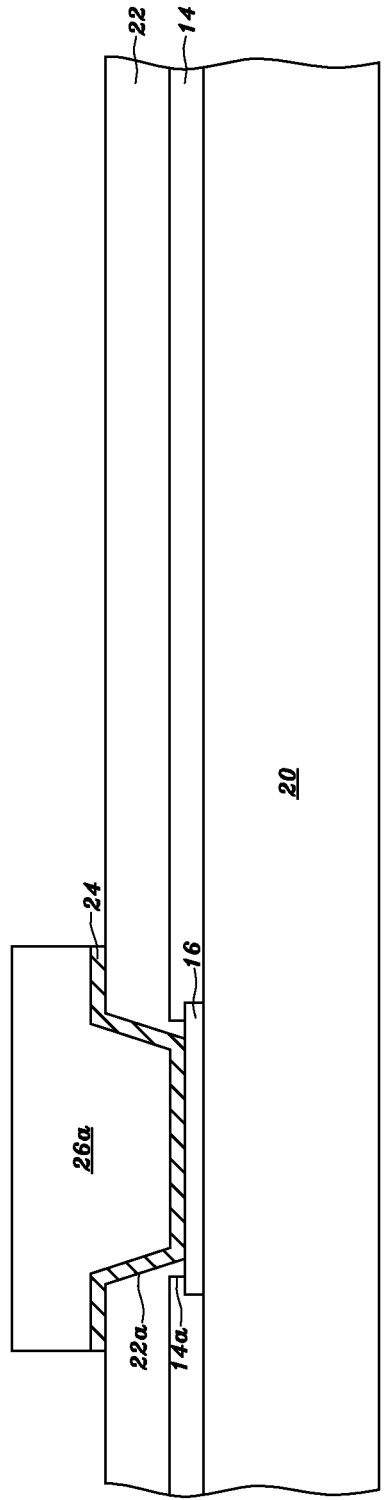

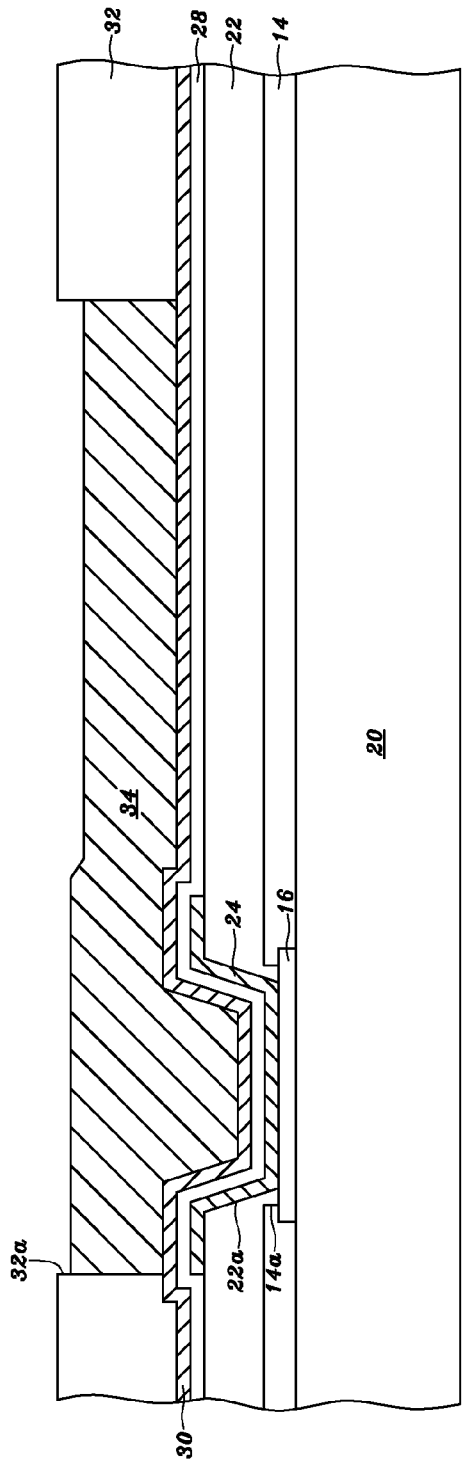
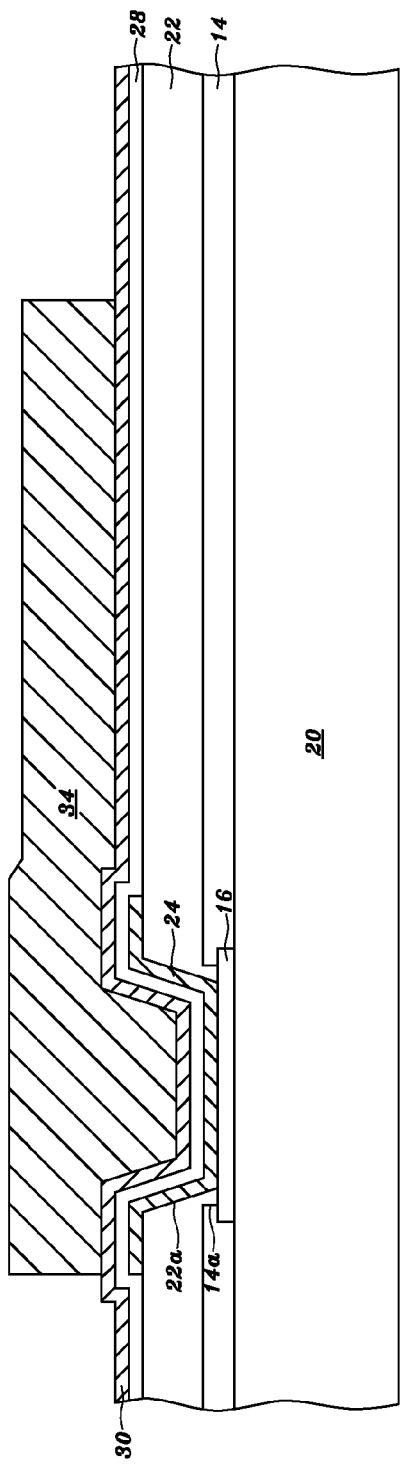

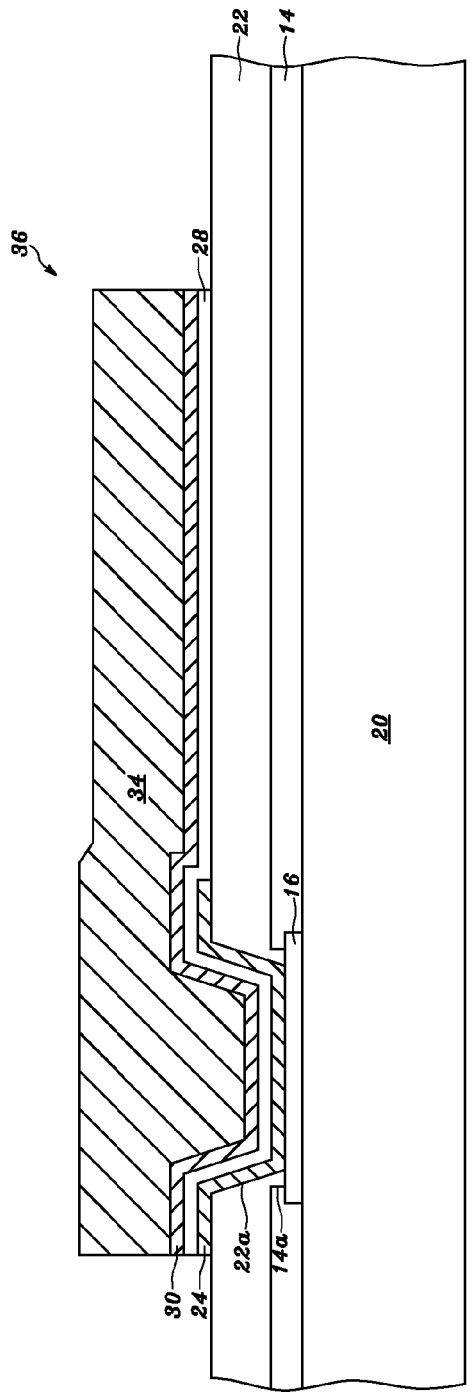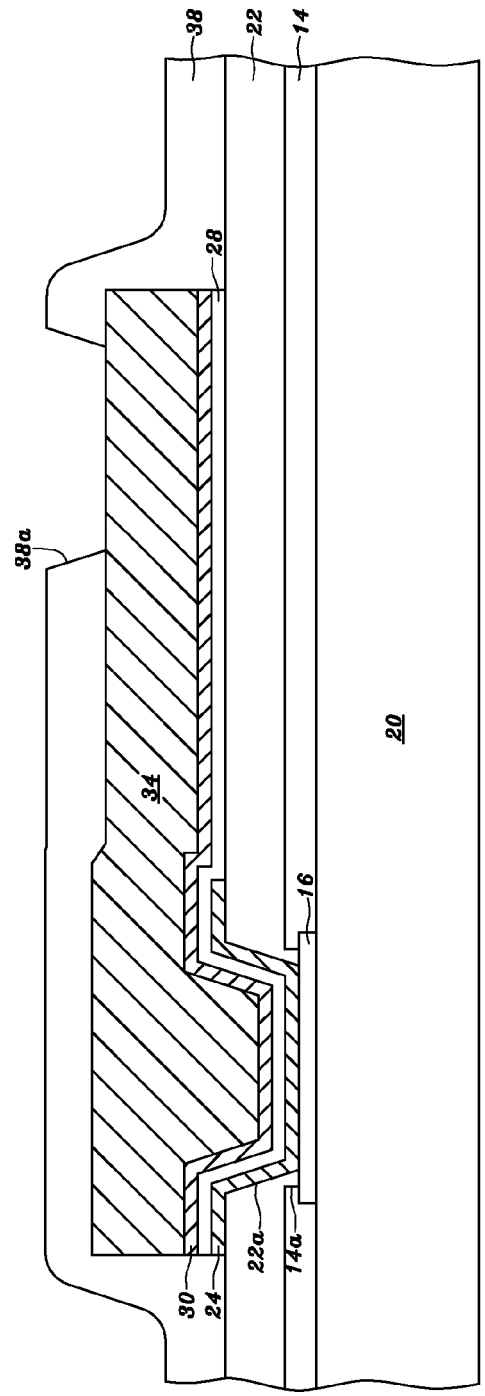

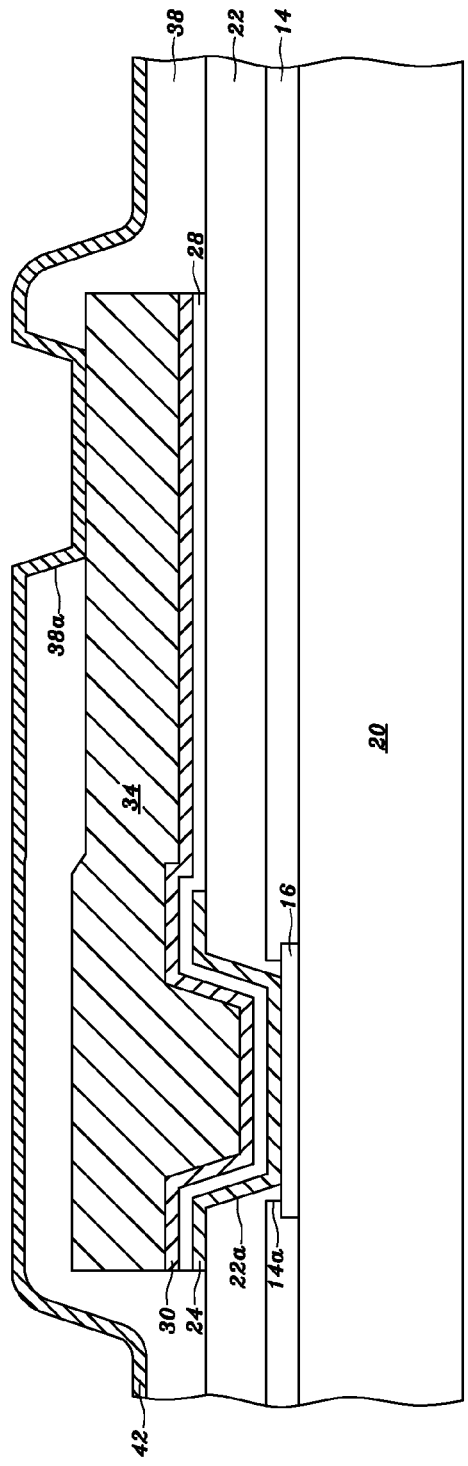
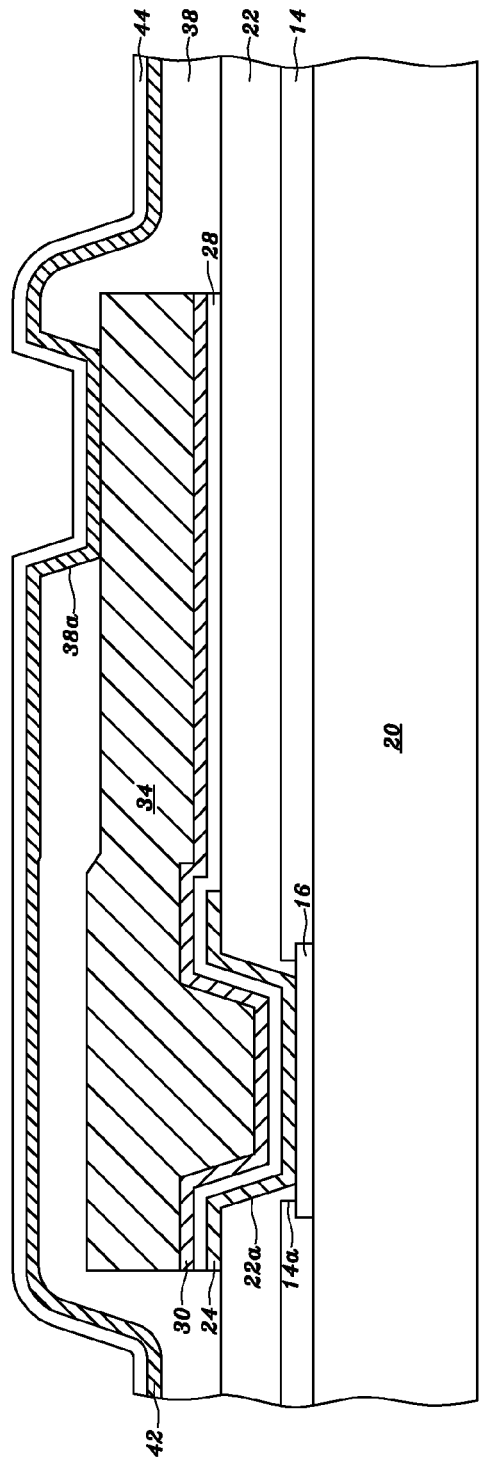
Fig. 3A
Fig. 3B

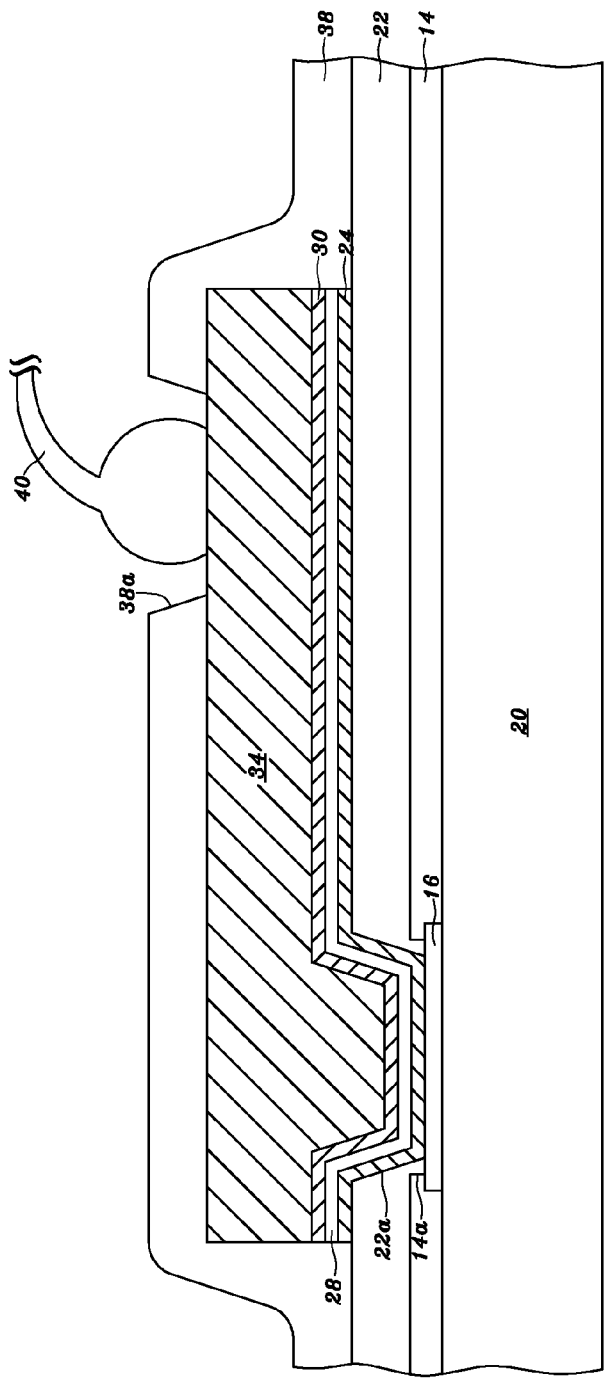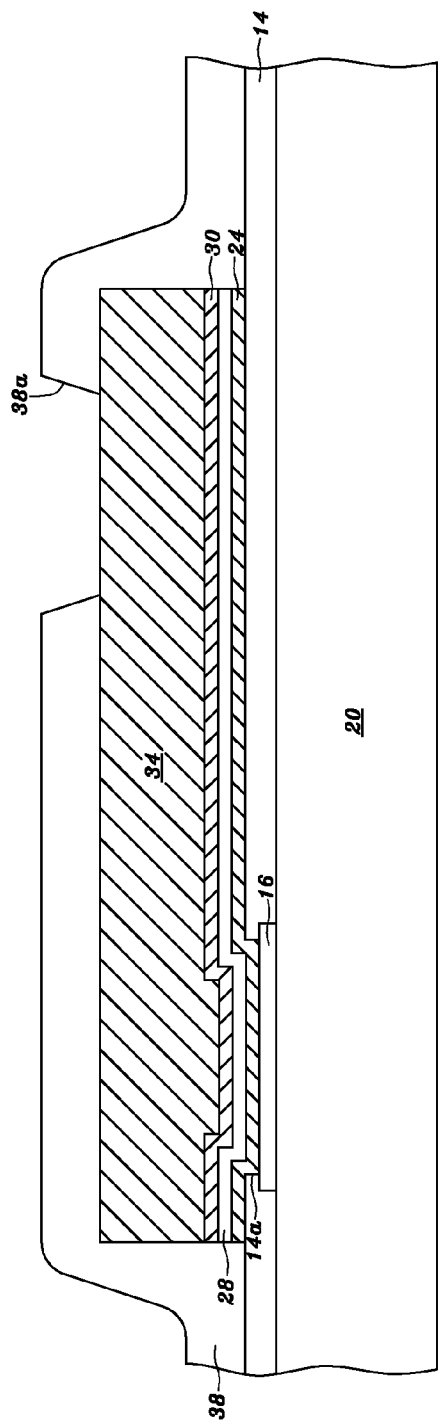

US 8,592,977 B2

INTEGRATED CIRCUIT (IC) CHIP AND METHOD FOR FABRICATING THE SAME

This application claims priority to U.S. provisional application No. 60/805,986, filed on Jun. 28, 2006, which is herein incorporated by reference in its entirety.

BACKGROUND OF THE INVENTION

1. Field of the Invention

The invention relates to an integrated circuit (IC) chip, and, more specifically, to an IC chip with a post-passivation metallization structure having a good ability to barrier against the entrance of metal particles in the post-passivation metallization structure into a pad exposed by a passivation layer or into a metal cap on a pad exposed by the passivation layer.

2. Brief Description of the Related Art

In a conventional process of forming a post-passivation metallization structure over a passivation layer of a wafer, an under bump metal (UBM) layer is first formed by sputtering an adhesion/barrier layer, such as titanium layer or titanium-tungsten-alloy layer, to have the post-passivation metallization structure adhere onto the wafer and to avoid an diffusion reaction between the post-passivation metallization structure and a pad exposed by an opening in the passivation layer, then sputtering a seed layer, beneficial to having a metal layer electroplated thereon, on the adhesion/barrier layer. Thereafter, a patterned photoresist layer is formed on the under bump metal (UBM) layer, an opening in the patterned photoresist layer exposing the seed layer. Next, a metal layer is electroplated on the seed layer exposed by the opening in the patterned photoresist layer.

However, the adhesion/barrier layer is not reliable enough if the following processes are performed in a high temperature. In a high temperature, gold atoms from a gold layer formed on the adhesion/barrier layer could penetrate through the adhesion/barrier layer to a pad made of aluminum exposed by an opening in a passivation layer or to a metal cap including aluminum on a pad made of copper exposed by an opening in a passivation layer. A brittle intermetallic compound (IMC), aluminum-gold alloy, could be formed, leading the post-passivation metallization structure with a bad reliability.

SUMMARY OF THE INVENTION

It is the primary objective of the invention to provide an integrated circuit (IC) chip with a post-passivation metallization structure having a good ability to barrier against the entrance of metal particles in the post-passivation metallization structure into a pad exposed by a passivation layer or into a metal cap on a pad exposed by the passivation layer.

In order to reach the above objectives, the present invention provides an IC chip comprising: a circuit structure over a semiconductor substrate; a passivation layer over the circuit structure, an opening in the passivation layer exposing a pad of the circuit structure; a first titanium -containing layer, such as titanium-tungsten-alloy layer or titanium-nitride layer, over the pad exposed by the opening; a second titanium-containing layer, such as titanium-tungsten-alloy layer or titanium-nitride layer, on the first titanium-containing layer and on the passivation layer; a metal layer made of gold on the second titanium-containing layer; and a polymer layer, such as polyimide, on the metal layer.

In order to reach the above objectives, the present invention provides an IC chip comprising: a circuit structure over a semiconductor substrate; a passivation layer over the circuit structure, an opening in the passivation layer exposing a pad of the circuit structure, wherein the pad comprises electroplated copper; a metal cap including aluminum on the pad exposed by the opening; a first titanium-containing layer, such as titanium-tungsten-alloy layer or titanium-nitride layer, on the metal cap; a second titanium-containing layer, such as titanium-tungsten-alloy layer or titanium layer, on the first titanium-containing layer; a metal layer made of gold on the second titanium-containing layer; and a polymer layer, such as polyimide, on the metal layer.

In order to reach the above objectives, the present invention provides an IC chip comprising: a circuit structure over a semiconductor substrate; a passivation layer over the circuit structure, a first opening in the passivation layer exposing a pad of the circuit structure, wherein the pad comprises electroplated copper; a metal cap including aluminum on the pad exposed by the first opening; a first polymer layer, such as polyimide, on the passivation layer, a second opening in the first polymer layer exposing the metal cap; a first titanium-containing layer, such as titanium-tungsten-alloy layer or titanium-nitride layer, on the metal cap exposed by the second opening and on the first polymer layer; a second titanium-containing layer, such as titanium-tungsten-alloy layer or titanium layer, on the first titanium-containing layer; a metal layer made of gold on the second titanium-containing layer; and a second polymer layer, such as polyimide, on the metal layer.

In order to reach the above objectives, a method for fabricating IC chip comprises the following steps: providing a circuit structure over a semiconductor substrate; forming a first titanium-containing layer, such as titanium-tungsten-alloy layer or titanium-nitride layer, over a pad of the circuit structure, wherein the pad comprises aluminum or electroplated copper; performing an annealing process for the first titanium-containing layer in a nitrogen ambient; forming a second titanium-containing layer, such as titanium-tungsten-alloy layer or titanium layer, on the first titanium-containing layer after the annealing process; forming a seed layer made of gold on the second titanium-containing layer; forming a photoresist layer on the seed layer, an opening in the photoresist layer exposing the seed layer; forming a metal layer made of gold on the seed layer exposed by the opening; removing the photoresist layer; removing the seed layer and the second titanium-containing layer not under the metal layer; and forming a polymer layer, such as polyimide, on the metal layer.

In order to reach the above objectives, a method for fabricating IC chip comprises the following steps: providing a circuit structure over a semiconductor substrate, a passivation layer over the circuit structure, a first opening in the passivation layer exposing a pad of the circuit structure, and a metal cap on the pad exposed by the first opening, wherein the pad comprises electroplated copper and the metal cap includes aluminum; forming a first titanium-containing layer, such as titanium-tungsten-alloy layer or titanium-nitride layer, on the metal cap; performing an annealing process for the first titanium-containing layer in a nitrogen ambient; forming a second titanium-containing layer, such as titanium-tungsten-alloy layer or titanium layer, on the first titanium-containing layer after the annealing process; forming a seed layer made of gold on the second titanium-containing layer; forming a photoresist layer on the seed layer, a second opening in the photoresist layer exposing the seed layer; forming a metal layer made of gold on the seed layer exposed by the second opening; removing the photoresist layer; removing the seed layer and the second titanium-containing layer not under the metal layer; and forming a polymer layer, such as polyimide, on the metal layer.

In order to reach the above objectives, a method for fabricating IC chip comprises the following steps: providing a circuit structure over a semiconductor substrate; forming a first polymer layer, such as polyimide, over the circuit structure, a first opening in the polymer layer exposing a pad of the circuit structure, wherein the pad comprises aluminum; forming a first titanium-containing layer, such as titanium-tungsten-alloy layer or titanium-nitride layer, on the pad; performing an annealing process for the first titanium-containing layer in a nitrogen ambient; forming a second titanium-containing layer, such as titanium-tungsten-alloy layer or titanium layer, on the first titanium-containing layer after the annealing process; forming a seed layer made of gold on the second titanium-containing layer; forming a photoresist layer on the seed layer, a second opening in the photoresist layer exposing the seed layer; forming a metal layer made of gold on the seed layer exposed by the second opening; removing the photoresist layer; removing the seed layer and the second titanium-containing layer not under the metal layer; and forming a second polymer layer, such as polyimide, on the metal layer.

In order to reach the above objectives, a method for fabricating IC chip comprises the following steps: providing a circuit structure over a semiconductor substrate, a passivation layer over the circuit structure, a first opening in the passivation layer exposing a pad of the circuit structure, and a metal cap on the pad exposed by the first opening, wherein the pad comprises electroplated copper and the metal cap includes aluminum; forming a first polymer layer, such as polyimide, on the passivation layer, a second opening in the polymer layer exposing the metal cap; forming a first titanium-containing layer, such as titanium-tungsten-alloy layer or titanium -nitride layer, on the metal cap; performing an annealing process for the first titanium-containing layer in a nitrogen ambient; forming a second titanium-containing layer, such as titanium-tungsten-alloy layer or titanium layer, on the first titanium-containing layer after the annealing process; forming a seed layer made of gold on the second titanium-containing layer; forming a photoresist layer on the seed layer, a third opening in the photoresist layer exposing the seed layer; forming a metal layer made of gold on the seed layer exposed by the third opening; removing the photoresist layer; removing the seed layer and the second titanium-containing layer not under the metal layer; and forming a second polymer layer, such as polyimide, on the metal layer.

To enable the objectives, technical contents, characteristics and accomplishments of the present invention, the embodiments of the present invention are to be described in detail in cooperation with the attached drawings below.

BRIEF DESCRIPTION OF THE DRAWINGS

FIGS. 3A through 3K are cross-sectional views showing a process according to one embodiment of the present invention.

FIGS. 4A through 4K are cross-sectional views showing a process according to one embodiment of the present invention.

DETAILED DESCRIPTION OF THE INVENTION

Figure 1A:
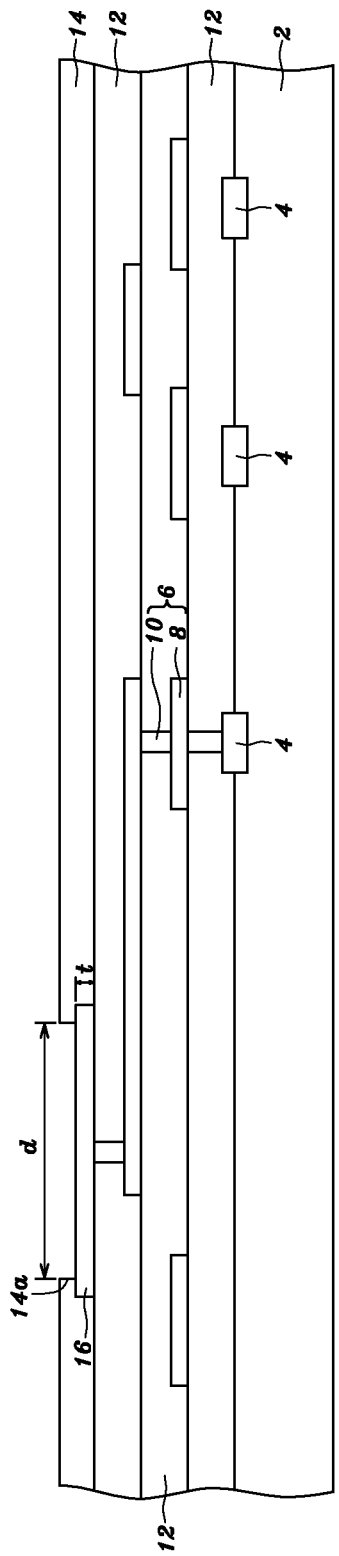
FIGS. 1A through 1B are cross-sectional views schematically showing various structures according to the present invention.

Referring to FIG. 1A, a semiconductor substrate or semiconductor blank wafer 2 may be a silicon substrate or silicon wafer, a GaAs substrate or GaAs wafer, or a SiGe substrate or SiGe wafer. Multiple semiconductor devices 4 are formed in or over the semiconductor substrate 2. The semiconductor device 4 may be a passive device, such as resistor, capacitor, inductor or filter, or an active device, such as p-channel MOS device, n-channel MOS device, CMOS (Complementary Metal Oxide Semiconductor), BJT (Bipolar Junction Transistor) or BiCMOS (Bipolar CMOS) device.

A circuit structure 6, fine line metal trace structure, is formed over the semiconductor substrate 2. The circuit structure 6 comprises multiple patterned metal layers 8 having a thickness of less than 3 µm (such as between 0.2 and 2 µm) and multiple metal plugs 10. For example, the patterned metal layers 8 and the metal plugs 10 are principally made of copper. Alternatively, the patterned metal layer 8 is principally made of aluminum or aluminum-alloy, and the metal plug 10 is principally made of tungsten. One of the patterned metal layers 8 may be formed by a damascene process including sputtering an adhesion/barrier layer, such tantalum or tantalum nitride, on an insulating layer, composed of Low-K oxide and oxynitride, and in an opening in the insulating layer, then sputtering a first copper layer on the adhesion/barrier layer, then electroplating a second copper layer on the first copper layer, then removing the first and second copper layers and the adhesion/barrier layer outside the opening in the insulating layer using a chemical mechanical polishing (CMP) process. Alternatively, one of the patterned metal layer 8 may be formed by a process including sputtering an aluminum-alloy layer, containing more than 90 wt % aluminum and less than 10 wt % copper, on an insulating layer, such as oxide, then patterning the aluminum-alloy layer using photolithography and etching processes.

Multiple dielectric layers 12 having a thickness of less than 3 micrometers, such as between 0.3 and 3 µm, are located over the semiconductor substrate 2 and interposed respectively between the neighboring patterned metal layers 8, and the neighboring patterned metal layers 8 are interconnected through the metal plugs 10 inside the dielectric layer 12. The dielectric layer 12 is commonly formed by a chemical vapor deposition (CVD) process. The material of the dielectric layer 12 may include silicon oxide, silicon oxynitride, TEOS (Tetraethoxysilane), a compound containing silicon, carbon, oxygen and hydrogen (such as $Si_wC_xO_yH_z$), silicon nitride (such as $Si_3N_4$), FSG (Fluorinated Silicate Glass), Black Diamond, SiLK, a porous silicon oxide, a porous compound containing nitrogen, oxygen and silicon, SOG (Spin-On Glass), BPSG (borophosphosilicate glass), a polyarylene ether, PBO (Polybenzoxazole), or a material having a low dielectric constant (K) of between 1.5 and 3, for example.

A passivation layer 14 is formed over the circuit structure 6 and over the dielectric layers 12. The passivation layer 14 can protect the semiconductor devices 4 and the circuit structure 6 from being damaged by moisture and foreign ion contamination. In other words, mobile ions (such as sodium ion), transition metals (such as gold, silver and copper) and impurities can be prevented from penetrating through the passivation layer 14 to the semiconductor devices 4, such as transistors, polysilicon resistor elements and polysilicon-polysilicon capacitor elements, and to the circuit structure 6.

The passivation layer 14 is commonly made of silicon oxide (such as SiO$_2$), silicon oxynitride, silicon nitride (such as Si$_3$N$_4$), or PSG (phosphosilicate glass). The passivation layer 14 commonly has a thickness of more than 0.3 μm, such as between 0.3 and 1.5 μm. In a preferred case, the silicon nitride layer in the passivation layer 14 has a thickness of more than 0.3 μm. Ten methods for depositing the passivation layer 14 are described as below.

In a first method, the passivation layer 14 is formed by depositing a silicon oxide layer with a thickness of between 0.2 and 1.2 μm using a CVD method and then depositing a silicon nitride layer with a thickness of 0.2 and 1.2 μm on the silicon oxide layer using a CVD method.

In a second method, the passivation layer 14 is formed by depositing a silicon oxide layer with a thickness of between 0.2 and 1.2 μm using a CVD method, next depositing a silicon oxynitride layer with a thickness of between 0.05 and 0.15 μm on the silicon oxide layer using a Plasma Enhanced CVD (PECVD) method, and then depositing a silicon nitride layer with a thickness of between 0.2 and 1.2 μm on the silicon oxynitride layer using a CVD method.

In a third method, the passivation layer 14 is formed by depositing a silicon oxynitride layer with a thickness of between 0.05 and 0.15 μm using a CVD method, next depositing a silicon oxide layer with a thickness of between 0.2 and 1.2 μm on the silicon oxynitride layer using a CVD method, and then depositing a silicon nitride layer with a thickness of between 0.2 and 1.2 μm on the silicon oxide layer using a CVD method.

In a fourth method, the passivation layer 14 is formed by depositing a first silicon oxide layer with a thickness of between 0.2 and 0.5 μm using a CVD method, next depositing a second silicon oxide layer with a thickness of between 0.5 and 1 μm on the first silicon oxide layer using a spin-coating method, next depositing a third silicon oxide layer with a thickness of between 0.2 and 0.5 μm on the second silicon oxide layer using a CVD method, and then depositing a silicon nitride layer with a thickness of 0.2 and 1.2 μm on the third silicon oxide using a CVD method.

In a fifth method, the passivation layer 14 is formed by depositing a silicon oxide layer with a thickness of between 0.5 and 2 μm using a High Density Plasma CVD (HDP-CVD) method and then depositing a silicon nitride layer with a thickness of 0.2 and 1.2 μm on the silicon oxide layer using a CVD method.

In a sixth method, the passivation layer 14 is formed by depositing an Undoped Silicate Glass (USG) layer with a thickness of between 0.2 and 3 μm, next depositing an insulating layer of TEOS, PSG or BPSG (borophosphosilicate glass) with a thickness of between 0.5 and 3 μm on the USG layer, and then depositing a silicon nitride layer with a thickness of 0.2 and 1.2 μm on the insulating layer using a CVD method.

In a seventh method, the passivation layer 14 is formed by optionally depositing a first silicon oxynitride layer with a thickness of between 0.05 and 0.15 μm using a CVD method, next depositing a silicon oxide layer with a thickness of between 0.2 and 1.2 μm on the first silicon oxynitride layer using a CVD method, next optionally depositing a second silicon oxynitride layer with a thickness of between 0.05 and 0.15 μm on the silicon oxide layer using a CVD method, next depositing a silicon nitride layer with a thickness of between 0.2 and 1.2 μm on the second silicon oxynitride layer or on the silicon oxide using a CVD method, next optionally depositing a third silicon oxynitride layer with a thickness of between 0.05 and 0.15 μm on the silicon nitride layer using a CVD method, and then depositing a silicon oxide layer with a thickness of between 0.2 and 1.2 μm on the third silicon oxynitride layer or on the silicon nitride layer using a CVD method.

In a eighth method, the passivation layer 14 is formed by depositing a first silicon oxide layer with a thickness of between 0.2 and 1.2 μm using a CVD method, next depositing a second silicon oxide layer with a thickness of between 0.5 and 1 μm on the first silicon oxide layer using a spin-coating method, next depositing a third silicon oxide layer with a thickness of between 0.2 and 1.2 μm on the second silicon oxide layer using a CVD method, next depositing a silicon nitride layer with a thickness of between 0.2 and 1.2 μm on the third silicon oxide layer using a CVD method, and then depositing a fourth silicon oxide layer with a thickness of between 0.2 and 1.2 μm on the silicon nitride layer using a CVD method.

In a ninth method, the passivation layer 14 is formed by depositing a first silicon oxide layer with a thickness of between 0.5 and 2 μm using a HDP-CVD method, next depositing a silicon nitride layer with a thickness of between 0.2 and 1.2 μm on the first silicon oxide layer using a CVD method, and then depositing a second silicon oxide layer with a thickness of between 0.5 and 2 μm on the silicon nitride using a HDP-CVD method.

In a tenth method, the passivation layer 14 is formed by depositing a first silicon nitride layer with a thickness of between 0.2 and 1.2 μm using a CVD method, next depositing a silicon oxide layer with a thickness of between 0.2 and 1.2 μm on the first silicon nitride layer using a CVD method, and then depositing a second silicon nitride layer with a thickness of between 0.2 and 1.2 μm on the silicon oxide layer using a CVD method.

An opening 14a in the passivation layer 14 exposes a pad 16 of the circuit structure 6 used to input or output signals or to be connected to a power source or a ground reference. The pad 16 may have a thickness t of between 0.4 and 3 μm or between 0.5 and 3 μm. For example, the pad 16 may be composed of a sputtered aluminum layer or a sputtered aluminum-copper-alloy layer with a thickness of between 0.5 and 3 μm. Alternatively, the pad 16 may include an electroplated copper layer with a thickness of between 0.4 and 3 μm or between 0.5 and 3 μm, and a barrier layer, such as tantalum or tantalum nitride, on a bottom surface and side walls of the electroplated copper layer.

The opening 14a may have a maximum transverse dimension d, from a top view, of between 2 and 30 μm or between 30 and 300 μm. The shape of the opening 14a from a top view may be a circle, and the diameter of the circle-shaped opening 14a may be between 2 and 30 μm or between 30 and 300 μm. Alternatively, the shape of the opening 14a from a top view may be a square, and the greatest diagonal length of the square-shaped opening 14a may be between 2 and 30 μm or between 30 and 300 μm. Alternatively, the shape of the opening 14a from a top view may be a polygon, and the polygon-shaped opening 14a may have a greatest diagonal length of between 3 and 30 μm or between 30 and 300 μm. Alternatively, the shape of the opening 14a from a top view may also be a rectangle, and the rectangle-shaped opening 14a may have a shorter width of between 2 and 40 μm. Further, there may be some of the semiconductor devices 4 under the pad 16 exposed by the opening 14a. Alternatively, there may be no active devices under the pad 16 exposed by the opening 14a.

Figure 1B:
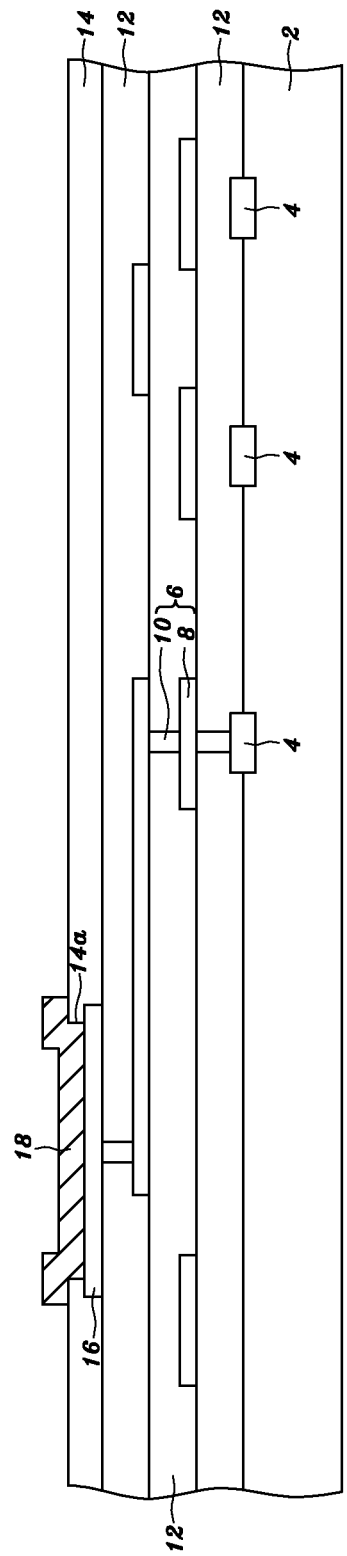

Referring to FIG. 1B, a metal cap 18 having a thickness of between 0.4 and 3 μm can be optionally formed on the pad 16 exposed by the opening 14a in the passivation layer 14 to prevent the pad 16 from being oxidized or contaminated. The material of the metal cap 18 may include aluminum, an aluminum-copper alloy, an Al—Si—Cu alloy or gold. For example, when the pad 16 is a copper pad, the metal cap 18 including aluminum is used to protect the copper pad 16 from being oxidized. The metal cap 18 may comprise a barrier layer having a thickness of between 0.01 and 0.5 µm on the pad 16. The barrier layer may be made of titanium, titanium nitride, titanium-tungsten alloy, tantalum, tantalum nitride, chromium or nickel. For example, the metal cap 18 may include a tantalum-containing layer, such as tantalum layer or tantalum-nitride layer, on the pad 16, principally made of electroplated copper, exposed by the opening 14a, and an aluminum-containing layer, such as aluminum layer or aluminum-alloy layer, having a thickness of between 0.5 and 3 µm on the tantalum-containing layer. Such a structure with the metal cap 18 may be applied to the following embodiments. Below, only the cases without the metal cap 18 are discussed.

The semiconductor substrate 2, the circuit structure 6, the dielectric layer 12, the passivation layer 14 and the pad 16 are described in the above paragraphs. Below, the scheme 20 under the passivation layer 14 may be any one of the structures shown in FIGS. 1A and 1B under the passivation layer 14; the scheme 20 represents the combination of the semiconductor substrate 2, the semiconductor devices 4, the circuit structure 6 (including the metal layers 8 and the metal plugs 10) and the dielectric layers 12 in FIG. 1A and FIG. 1B.

Embodiment 1

Figure 2H:
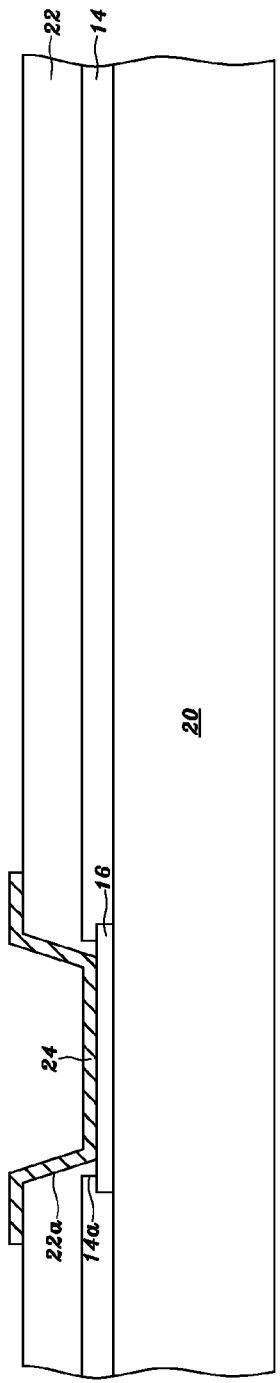
FIGS. 2A through 2S are cross-sectional views showing a process according to one embodiment of the present invention.
Figure 2I:
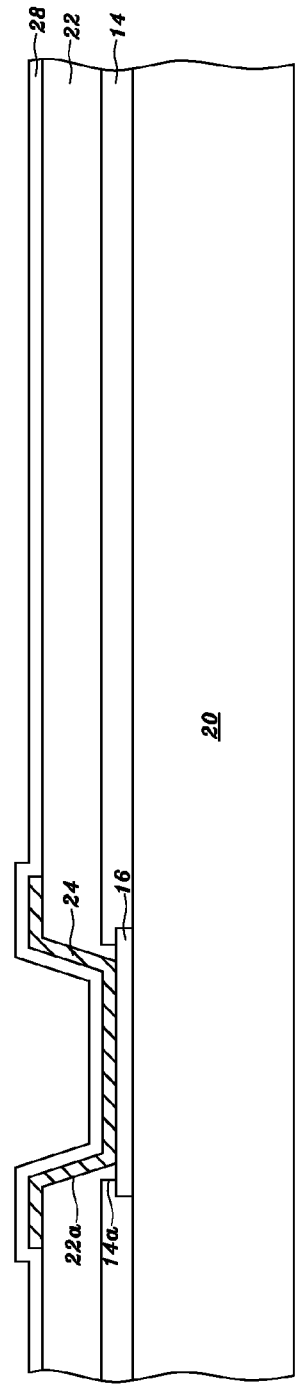
Figure 2J:
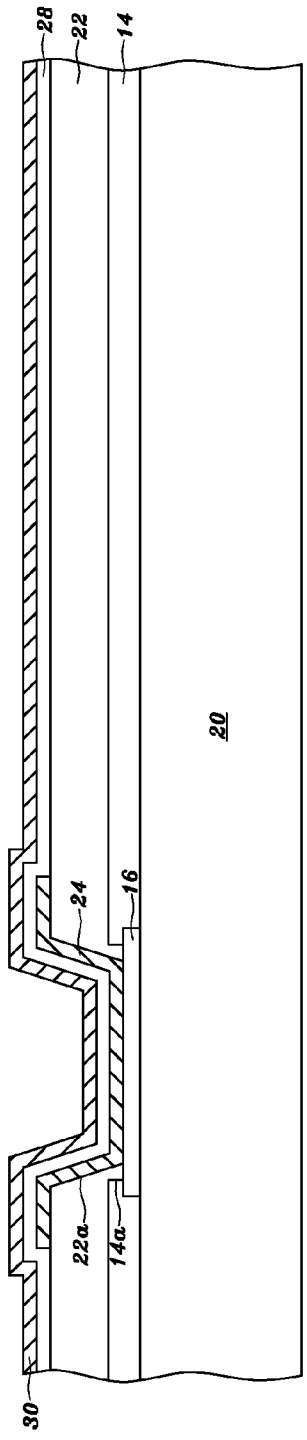
Figure 2K:
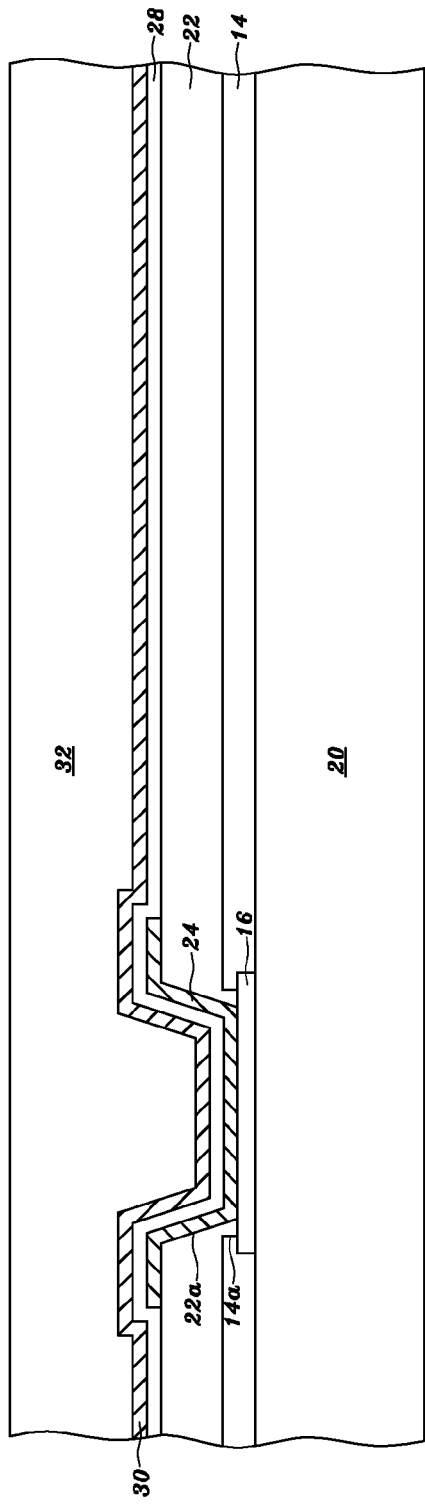
Figure 2L:
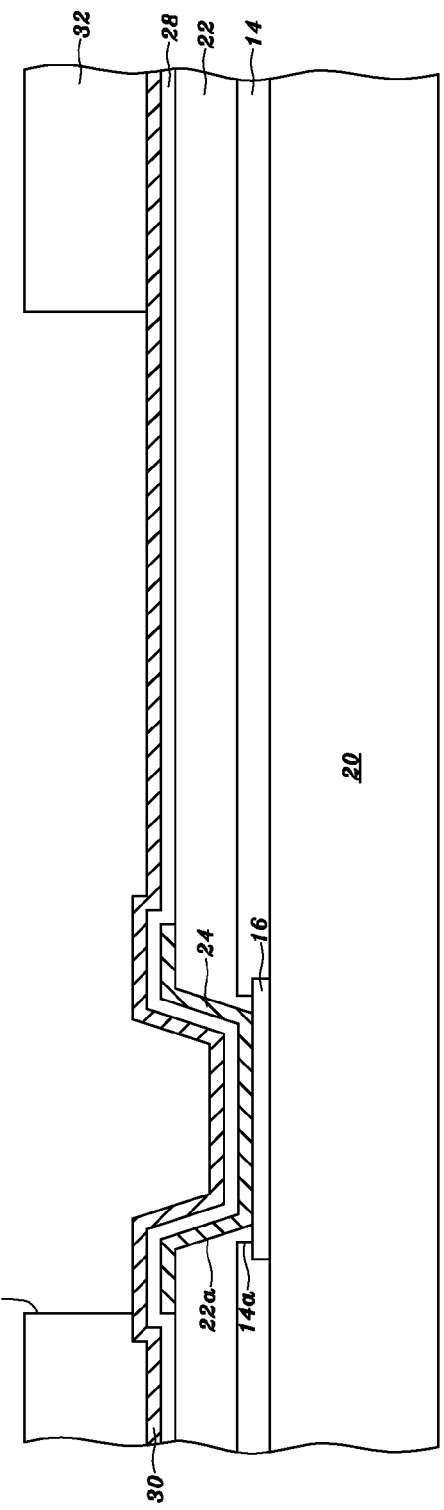
Figure 2Q:
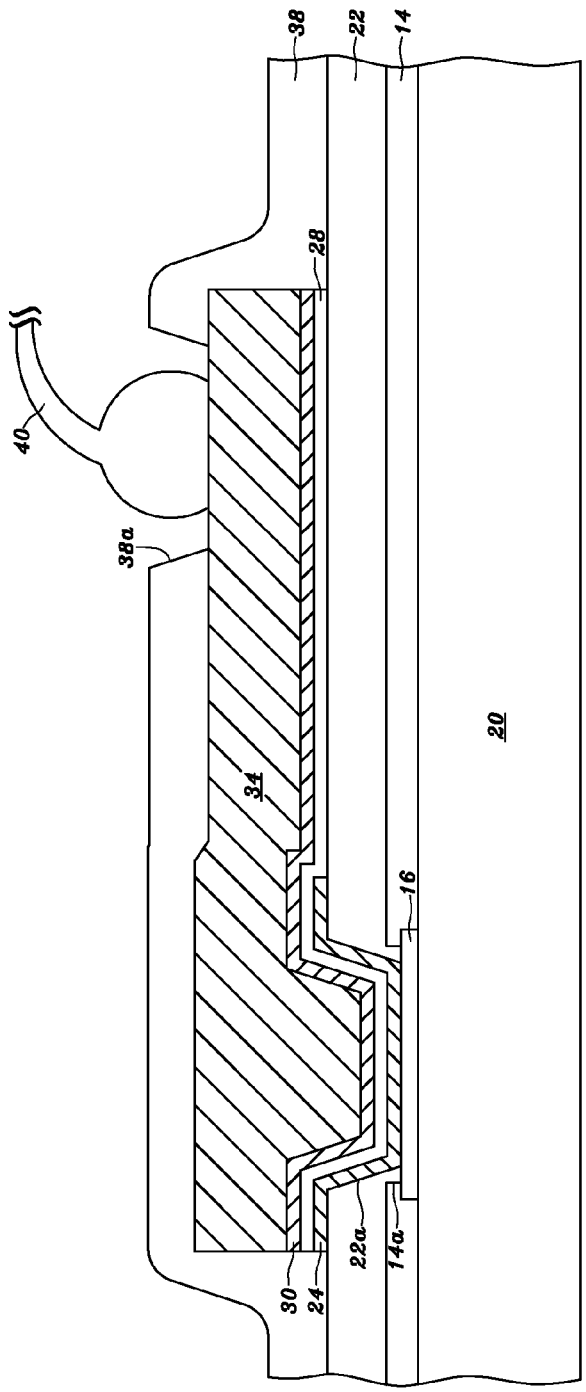
Figure 2R:
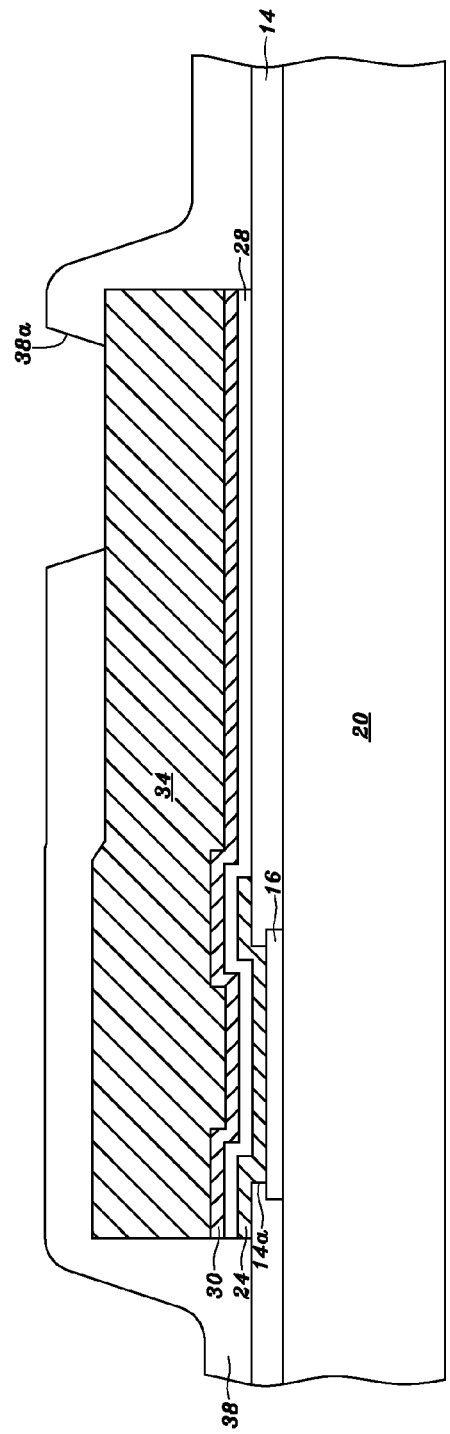

FIGS. 2A through 2R are cross-sectional views showing a process according to one embodiment of the present invention. In this embodiment, the pad 16 is an aluminum-containing layer, and the opening 14a in the passivation layer 14 exposes the aluminum-containing layer.

Referring to FIG. 2A, a polymer layer 22 can be formed on the passivation layer 14, and at least one opening 22a is formed in the polymer layer 22 by patterning the polymer layer 22 to expose at least one pad 16, as shown in FIG. 2B and FIG. 2C. The pad 16 may include a center portion exposed by an opening 22a and a peripheral portion covered with the polymer layer 22, as shown in FIG. 2B. Alternatively, the opening 22a may expose the entire upper surface of the pad 16 exposed by the opening 14a in the passivation layer 14 and further may expose the upper surface of the passivation layer 14 near the pad 16, as shown in FIG. 2C. The descriptions of this embodiment in FIGS. 2D-2Q are based on the structure shown in FIG. 2B. Alternatively, the embodiments in FIGS. 2D-2Q can be applied to the structure shown in FIG. 2C.

The material of the polymer layer 22 may include benzocyclobutane (BCB), polyimide (PI), polyurethane, epoxy resin, a parylene-based polymer, a solder-mask material, an elastomer, or a porous dielectric material. The polymer layer 22 has a thickness of between 3 and 25 µm or between 3 and 26 µm.

The polymer layer 22 can be formed by a spin-on coating process, a lamination process or a screen-printing process. Below, the process of forming a patterned polymer layer 22 is exemplified with the case of spin-on coating a polyimide layer on the passivation layer 14 and then patterning the polyimide layer. Alternatively, the polymer layer 22 can be formed by spin-on coating a layer of benzocyclobutane, polyurethane, epoxy resin, a parylene-based polymer, a solder-mask material, an elastomer or a porous dielectric material on the passivation layer 14, and then patterning the layer.

For example, the polymer layer 22 can be formed by spin-on coating a positive-type photosensitive polyimide layer having a thickness of between 3 and 50 µm, and preferably of between 6 and 24 µm, on the passivation layer 14, then baking the spin-on coated polyimide layer, then exposing the baked polyimide layer using a 1× stepper or 1× contact aligner with at least two of G-line having a wavelength ranging from 434 to 438 nm, H-line having a wavelength ranging from 403 to 407 nm, and I-line having a wavelength ranging from 363 to 367 nm, illuminating the baked polyimide layer, that is, G-line and H-line, G-line and I-line, H-line and I-line, or G-line, H-line and I-line illuminate the baked polyimide layer, then developing the exposed polyimide layer, an opening in the developed polyimide layer exposing the pad 16, then curing or heating the developed polyimide layer at a peak temperature of between 250 and 400° C. for a time of between 10 and 200 minutes in a nitrogen ambient or in an oxygen-free ambient, the cured polyimide layer having a thickness of between 3 and 26 µm, and preferably between 3 and 12 µm, and then removing the residual polymeric material or other contaminants on the upper surface of the pad 16 exposed by the opening in the cured polyimide layer with an $O_2$ plasma or a plasma containing fluorine of below 200 PPM and oxygen, such that the polyimide layer can be patterned with at least one opening in the polyimide layer exposing at least one pad 16 of the circuit structure 6.

Referring to FIG. 2D, a titanium-containing layer 24 having a thickness of between 0.005 and 1 µm, and preferably between 0.01 and 0.7 µm, is formed on the polymer layer 22 and on the pad 16, including aluminum, exposed by the opening 22a. The titanium-containing layer 24 may be a titanium-tungsten-alloy layer or a titanium-nitride layer. The titanium-containing layer 24 may be formed by a sputtering method, an evaporation method, or a chemical vapor deposition (CVD) method.

For example, the titanium-containing layer 24 may be formed by sputtering a titanium-tungsten-alloy layer with a thickness of between 0.1 and 1 µm, and preferably between 0.3 and 0.5 µm, on the polymer layer 22 and on the pad 16, including aluminum, exposed by the opening 22a. Alternatively, the titanium-containing layer 24 may be formed by sputtering a titanium layer with a thickness of between 0.005 and 1 µm, and preferably between 0.01 and 0.7 µm, on the polymer layer 22 and on the pad 16, including aluminum, exposed by the opening 22a. Alternatively, the titanium-containing layer 24 may be formed by sputtering a titanium-nitride layer with a thickness of between 0.01 and 0.7 µm, and preferably between 0.01 and 0.2 µm or between 0.05 and 0.1 µm, on the polymer layer 22 and on the pad 16, including aluminum, exposed by the opening 22a. Alternatively, the titanium-containing layer 24 may be formed by chemical vapor depositing (CVD) a titanium-nitride layer with a thickness of between 0.005 and 0.1 µm, and preferably between 0.01 and 0.05 µm, on the polymer layer 22 and on the pad 16, including aluminum, exposed by the opening 22a.

For example, the titanium-containing layer 24 may be formed by sputtering a titanium-tungsten-alloy layer with a thickness of between 0.1 and 1 µm, and preferably between 0.3 and 0.5 µm, on the polymer layer 22 and on the pad 16, principally made of copper, exposed by the opening 22a. Alternatively, the titanium-containing layer 24 may be formed by sputtering a titanium layer with a thickness of between 0.005 and 1 µm, and preferably between 0.01 and 0.7 µm, on the polymer layer 22 and on the pad 16, principally made of copper, exposed by the opening 22a. Alternatively, the titanium-containing layer 24 may be formed by sputtering a titanium-nitride layer with a thickness of between 0.01 and 0.7 µm, and preferably between 0.01 and 0.2 µm or between 0.05 and 0.1 µm, on the polymer layer 22 and on the pad 16, principally made of copper, exposed by the opening 22a. Alternatively, the titanium-containing layer 24 may be formed by chemical vapor depositing (CVD) a titanium-nitride layer with a thickness of between 0.005 and 0.1 µm, and preferably between 0.01 and 0.05 µm, on the polymer layer 22 and on the pad 16, principally made of copper, exposed by the opening 22a.

Alternatively, the above process of forming the titanium-containing layer 24 may be applied to the structure shown in FIG. 1B; that is, the polymer layer 22 can be first formed on the passivation layer 14, an opening in the polymer layer 22 exposing the metal cap 18, and then the titanium-containing layer 24 can be formed on the meta cap 18 exposed by the opening in the polymer layer 22 and on the polymer layer 22. For example, the titanium-containing layer 24 may be formed by sputtering a titanium-tungsten-alloy layer with a thickness of between 0.1 and 1 µm, and preferably between 0.3 and 0.5 µm, on the polymer layer 22 and on an aluminum -containing layer of the metal cap 18 over the pad 16, principally made of copper, exposed by the opening 22a. Alternatively, the titanium-containing layer 24 may be formed by sputtering a titanium layer with a thickness of between 0.005 and 1 µm, and preferably between 0.01 and 0.7 µm, on the polymer layer 22 and on an aluminum-containing layer of the metal cap 18 over the pad 16, principally made of copper, exposed by the opening 22a. Alternatively, the titanium-containing layer 24 may be formed by sputtering a titanium-nitride layer with a thickness of between 0.01 and 0.7 µm, and preferably between 0.01 and 0.2 µm or between 0.05 and 0.1 µm, on the polymer layer 22 and on an aluminum-containing layer of the metal cap 18 over the pad 16, principally made of copper, exposed by the opening 22a. Alternatively, the titanium-containing layer 24 may be formed by chemical vapor depositing (CVD) a titanium-nitride layer with a thickness of between 0.005 and 0.1 µm, and preferably between 0.01 and 0.05 µm, on the polymer layer 22 and on an aluminum -containing layer of the metal cap 18 over the pad 16, principally made of copper, exposed by the opening 22a.

Alternatively, the above-mentioned titanium-containing layer 24 can be replaced by a tantalum nitride (TaN) layer, that is, the tantalum-nitride layer having a thickness of between 0.01 and 0.2 µm, and preferably between 0.05 and 0.1 µm, may be sputtered on the polymer layer 22 and on the pad 16 exposed by the opening 22a for the scheme shown in FIG. 1A, or sputtered on the polymer layer 22 and on the metal cap 18 exposed by an opening in the polymer layer 22 for the scheme shown in FIG. 1B. Alternatively, the tantalum-nitride layer having a thickness of between 0.005 and 0.1 µm, and preferably between 0.01 and 0.05 µm, may be chemical vapor deposited on the polymer layer 22 and on the pad 16 exposed by the opening 22a for the scheme shown in FIG. 1A, or chemical vapor deposited on the polymer layer 22 and on the metal cap 18 exposed by an opening in the polymer layer 22 for the scheme shown in FIG. 1B. Alternatively, the above-mentioned titanium-containing layer 24 can be replaced by a tantalum layer, that is, the tantalum layer having a thickness of between 0.1 and 0.8 µm, and preferably between 0.2 and 0.6 µm, may be sputtered on the polymer layer 22 and on the pad 16 exposed by the opening 22a for the scheme shown in FIG. 1A, or sputtered on the polymer layer 22 and on the metal cap 18 exposed by an opening in the polymer layer 22 for the scheme shown in FIG. 1B.

Referring to FIG. 2E, a photoresist layer 26 can be formed on the titanium-containing layer 24 by a spin coating process or a lamination process. Referring to FIG. 2F, the photoresist layer 26 is patterned with the processes of exposure, development, etc., to form a photoresist cap 26a on the above-mentioned titanium-containing layer or tantalum-containing layer 24 over the pad 16 exposed by the opening 22a for the scheme shown in FIG. 1A or over the metal cap 18 for the scheme in FIG. 1B. For example, the patterned photoresist cap 26 can be formed by spin-on coating a positive -type photosensitive polymer layer having a thickness of between 5 and 30 microns, and preferably of between 7 and 15 µm, on the above-mentioned titanium-containing layer or tantalum -containing layer 24, then exposing the photosensitive polymer layer using a 1× stepper or 1× contact aligner with at least two of G-line having a wavelength ranging from 434 to 438 nm, H-line having a wavelength ranging from 403 to 407 nm, and I-line having a wavelength ranging from 363 to 367 nm, illuminating the photosensitive polymer layer, that is, G-line and H-line, G-line and I-line, H -line and I-line, or G-line, H-line and I-line illuminate the photosensitive polymer layer, and then developing the exposed polymer layer.

Referring to FIG. 2G, the above-mentioned titanium-containing layer or tantalum-containing layer 24 not under the photoresist cap 26a is removed with a dry etching method or a wet etching method. For example, the titanium-containing layer or tantalum-containing layer 24, made of titanium, titanium-tungsten alloy, titanium nitride, tantalum or tantalum nitride, not under the photoresist cap 26a is removed with a reactive ion etching (RIE) process.

Referring to FIG. 2H, most of the photoresist cap 26a can be removed using an organic solution with amide after the titanium-containing layer or tantalum-containing layer 24 not under the photoresist cap 26a is removed. However, some residuals from the photoresist cap 26a could remain on the titanium-containing layer or tantalum-containing layer 24. Thereafter, the residuals can be removed from the titanium-containing layer or tantalum-containing layer 24 with a plasma, such as $O_2$ plasma or plasma containing fluorine of below 200 PPM and oxygen.

Alternatively, the structure of FIG. 2H may be achieved via the following description. A hard mask, such as gold layer having a thickness of between 500 and 2,000 angstroms, can be formed on the titanium-containing layer 24. Next, a patterned photoresist cap is formed on the hard mask over the pad 16 exposed by the opening 22a or over the metal cap 18 over the pad 16. For example, the patterned photoresist cap can be formed by spin-on coating a positive-type photosensitive polymer layer having a thickness of between 5 and 30 microns, and preferably of between 7 and 15 microns, on the hard mask, then exposing the photosensitive polymer layer using a 1× stepper or 1× contact aligner with at least two of G-line having a wavelength ranging from 434 to 438 nm, H-line having a wavelength ranging from 403 to 407 nm, and I-line having a wavelength ranging from 363 to 367 nm, illuminating the photosensitive polymer layer, that is, G-line and H-line, G-line and I-line, H -line and I-line, or G-line, H-line and I-line illuminate the photosensitive polymer layer, and then developing the exposed polymer layer. Next, the hard mask not under the patterned photoresist cap is removed with a dry etching method or a wet etching method, only the hard mask over the metal pad 16 exposed by the opening 22a or over the metal cap 18 over the pad 16 being left. For example, when the hard mask is a gold layer, it can be etched with an iodine-containing solution, such as solution containing potassium iodide. Next, the patterned photoresist cap is removed. Next, the titanium-containing layer or tantalum-containing layer 24 not under the hard mask is removed with a dry etching method or a wet etching method. For example, when the titanium-containing layer or tantalum-containing layer 24 is a titanium-tungsten-alloy layer, it can be etched with an RIE process or with a solution containing hydrogen peroxide. Next, the hard mask can be removed with a dry etching method or a wet etching method. For example, when the hard mask is a gold layer, it can be etched with an ion milling process or with an iodine-containing solution, such as solution containing potassium iodide.

After the step shown in FIG. 2H, if the titanium-containing layer or tantalum-containing layer 24 is made of titanium, a titanium-tungsten alloy or tantalum, an annealing process is performed by heating the titanium-containing layer or tantalum-containing layer 24 at a temperature of between 300 and 410° C., and preferably between 350 and 400° C., for a time of between 20 and 150 minutes, and preferably between 50 and 100 minutes in a nitrogen ambient with a nitrogen purity of great than 99%, and preferably with a nitrogen purity of great than 99.99%. Thereby, a reaction of nitrogen and the titanium-containing layer or tantalum-containing layer 24 occurs at a surface thereof. The titanium-containing layer or tantalum-containing layer 24 contains nitrogen at a surface layer thereof with a thickness of less than 2,500 angstroms, such as between 5 and 500 angstroms.

Next, referring to FIG. 2I, a titanium-containing layer 28 having a thickness of between 0.02 and 0.5 μm can be sputtered on the polymer layer 22 and on the titanium-containing layer or tantalum-containing layer 24, such as a titanium layer with nitrogen at a surface layer thereof with a thickness of between 5 and 500 angstroms, a titanium-tungsten-alloy layer with nitrogen at a surface layer thereof with a thickness of between 5 and 500 angstroms, a titanium-nitride layer, a tantalum layer with nitrogen at a surface layer thereof with a thickness of between 5 and 500 angstroms, or a tantalum-nitride layer. The titanium-containing layer 28 acts as an adhesion layer providing a good adhesion between the titanium-containing layer or tantalum-containing layer 24 and sequentially-formed metallization structure and between the polymer layer 22 and the sequentially-formed metallization structure. The titanium-containing layer 28 may be a titanium-tungsten-alloy layer or a titanium layer. Alternatively, the titanium-containing layer 28 can be formed by an evaporation process.

For example, the titanium-containing layer 28 may be formed by sputtering a titanium layer on the polymer layer 22 and on the titanium-containing layer 24 made of titanium with nitrogen at a surface layer thereof with a thickness of between 5 and 500 angstroms. Alternatively, the titanium-containing layer 28 may be formed by sputtering a titanium layer on the polymer layer 22 and on the titanium-containing layer 24 made of a titanium-tungsten alloy with nitrogen at a surface layer thereof with a thickness of between 5 and 500 angstroms. Alternatively, the titanium-containing layer 28 may be formed by sputtering a titanium layer on the polymer layer 22 and on the titanium-containing layer 24 made of titanium nitride. Alternatively, the titanium-containing layer 28 may be formed by sputtering a titanium layer on the polymer layer 22 and on the tantalum-containing layer 24 made of tantalum nitride. Alternatively, the titanium-containing layer 28 may be formed by sputtering a titanium layer on the polymer layer 22 and on the tantalum-containing layer 24 made of tantalum with nitrogen at a surface layer thereof with a thickness of between 5 and 500 angstroms. Alternatively, the titanium -containing layer 28 may be formed by sputtering a titanium-tungsten-alloy layer on the polymer layer 22 and on the titanium-containing layer 24 made of titanium with nitrogen at a surface layer thereof with a thickness of between 5 and 500 angstroms. Alternatively, the titanium-containing layer 28 may be formed by sputtering a titanium-tungsten-alloy layer on the polymer layer 22 and on the titanium-containing layer 24 made of a titanium-tungsten alloy with nitrogen at a surface layer thereof with a thickness of between 5 and 500 angstroms. Alternatively, the titanium -containing layer 28 may be formed by sputtering a titanium-tungsten-alloy layer on the polymer layer 22 and on the titanium-containing layer 24 made of titanium nitride. Alternatively, the titanium -containing layer 28 may be formed by sputtering a titanium-tungsten-alloy layer on the polymer layer 22 and on the tantalum-containing layer 24 made of tantalum nitride. Alternatively, the titanium -containing layer 28 may be formed by sputtering a titanium-tungsten-alloy layer on the polymer layer 22 and on the tantalum-containing layer 24 made of tantalum with nitrogen at a surface layer thereof with a thickness of between 5 and 500 angstroms.

Referring to FIG. 2J, a seed layer 30 having a thickness of between 0.05 and 0.3 μm can be sputtered on the titanium-containing layer 28. Alternatively, the seed layer 30 can be formed by a vapor deposition method, an electroless plating method or a PVD (Physical Vapor Deposition) method. The seed layer 30 is beneficial to electroplating a metal layer thereon. Thus, the material of the seed layer 30 varies with the material of the electroplated metal layer formed on the seed layer 30. When a gold layer is to be electroplated on the seed layer 30, gold is a preferable material to the seed layer 30. When a copper layer is to be electroplated on the seed layer 30, copper is a preferable material to the seed layer 30.

For example, when the titanium-containing layer 28 is formed by sputtering a titanium layer with a thickness of between 0.02 and 0.5 μm, the seed layer 30 can be formed by sputtering a gold layer with a thickness of between 0.05 and 0.3 μm on the titanium layer. When the titanium-containing layer 28 is formed by sputtering a titanium-tungsten-alloy layer with a thickness of between 0.02 and 0.5 μm, the seed layer 30 can be formed by sputtering a gold layer with a thickness of between 0.05 and 0.3 μm on the titanium-tungsten-alloy layer. When the titanium-containing layer 28 is formed by sputtering a titanium layer with a thickness of between 0.02 and 0.5 μm, the seed layer 30 can be formed by sputtering a copper layer with a thickness of between 0.05 and 0.5 μm on the titanium layer. When the titanium-containing layer 28 is formed by sputtering a titanium-tungsten-alloy layer with a thickness of between 0.02 and 0.5 μm, the seed layer 30 can be formed by sputtering a copper layer with a thickness of between 0.05 and 0.3 μm on the titanium-tungsten-alloy layer.

Referring to FIG. 2K, a photoresist layer 32 having a thickness of between 3.5 and 30 μm is formed on the seed layer 30. Referring to FIG. 2L, the photoresist layer 32 is patterned with the processes of exposure, development, etc., to form an opening 32a in the photoresist layer 32 exposing the seed layer 30. A 1× stepper or 1× contact aligner can be used to expose the photoresist layer 32 during the process of exposure.

For example, the photoresist layer 32 can be formed by spin-on coating a positive-type photosensitive polymer layer having a thickness of between 3.5 and 30 μm, and preferably of between 7 and 15 μm on the seed layer 30, then exposing the photosensitive polymer layer using a 1× stepper or 1× contact aligner with at least two of G-line having a wavelength ranging from 434 to 438 nm, H-line having a wavelength ranging from 403 to 407 nm, and I-line having a wavelength ranging from 363 to 367 nm, illuminating the photosensitive polymer layer, that is, G-line and H-line, G-line and I-line, H-line and I-line, or G-line, H-line and I-line illuminate the photosensitive polymer layer, then developing the exposed polymer layer, and then removing the residual polymeric material or other contaminants on the seed layer 30 with an $O_2$ plasma or a plasma containing fluorine of below 200 PPM and oxygen, such that the photoresist layer 32 can be patterned with an opening 32a in the photoresist layer 32 exposing the seed layer 30.

Referring to FIG. 2M, a metal layer 34 having a thickness of between 1 and 25 μm, and preferably of between 3 and 25 μm, is electroplated on the seed layer 30 exposed by the opening 32a. For example, the metal layer 34 may be formed by electroplating a gold layer having a thickness of between 1 and 25 μm, and preferably of between 3 and 25 μm, on the seed layer 30, made of gold, exposed by the opening 32a with an electroplating solution containing gold of between 1 and 20 grams per litter (g/l), and preferably between 5 and 15 g/l, and sulfite ion of 10 and 120 g/l, and preferably between 30 and 90 g/l. The electroplating solution may further comprise sodium ion, to be turned into a solution of gold sodium sulfite ($Na_3Au(SO_3)_2$), or may further comprise ammonium ion, to be turned into a solution of gold ammonium sulfite (($NH_4)_3$ [$Au(SO_3)_2$]).

The operational parameters of electroplating the gold layer are described below:

1. The above-mentioned electroplating solution can be at a temperature of between 30 and 70° C., and preferably between 45 and 65° C., to electroplate the gold layer on the seed layer 30 exposed by the opening 32a.
2. The above-mentioned electroplating solution can be used to electroplate the gold layer on the seed layer 30 exposed by the opening 32a through an electric current with a current density at between 1 and 10 mA/cm$^2$, and preferably between 4 and 6 mA/cm$^2$.
3. The above-mentioned electroplating solution may have a pH value of between 6 and 9, and preferably between 7 and 8.5, to electroplate the gold layer on the seed layer 30 exposed by the opening 32a.

Alternatively, the metal layer 34 may be formed by electroplating a gold layer having a thickness of between 1 and 25 μm, and preferably of between 3 and 25 μm on the seed layer 30, made of gold, exposed by the opening 32a with an electroplating solution containing cyanide.

Alternatively, the metal layer 34 may be formed by electroplating a copper layer having a thickness of between 1 and 20 μm on the seed layer 30, made of copper, exposed by the opening 32a, then electroplating a nickel layer having a thickness of between 0.5 and 5 microns on the copper layer in the opening 32a, and then electroplating a gold layer having a thickness of between 0.01 and 2 microns on the nickel layer in the opening 32a.

Referring to FIG. 2N, after the metal layer 34 is formed, most of the photoresist layer 32 can be removed using an organic solution with amide. However, some residuals from the photoresist layer 32 could remain on the metal layer 34 and on the seed layer 30. Thereafter, the residuals can be removed from the metal layer 34 and from the seed layer 30 with a plasma, such as $O_2$ plasma or plasma containing fluorine of below 200 PPM and oxygen.

Thereafter, referring to FIG. 2O, the seed layer 30 and the titanium-containing layer 28 not under the metal layer 34 are subsequently removed with a dry etching method or a wet etching method. As to the wet etching methods, when the titanium-containing layer 28 is a titanium-tungsten-alloy layer, it can be etched with a solution containing hydrogen peroxide; when the titanium-containing layer 28 is a titanium layer, it can be etched with a solution containing hydrogen fluoride; when the seed layer 30 is a gold layer, it can be etched with an iodine -containing solution, such as solution containing potassium iodide. As to the dry etching methods, when the titanium-containing layer 28 is a titanium layer or a titanium-tungsten-alloy layer, it can be etched with a chlorine-containing plasma etching process or with an RIE process; when the seed layer 30 is a gold layer, it can be removed with an ion milling process or with an Ar sputtering etching process. Generally, the dry etching method to etch the seed layer 30 and the titanium-containing layer 28 not under the metal layer 34 may include a chemical plasma etching process, a sputtering etching process, such as argon sputter process, or a chemical vapor etching process.

Thereby, in this embodiment, a metal trace 36 can be formed on the polymer layer 22 and on the pad 16 exposed by the opening 22a for the scheme shown in FIG. 1A. Alternatively, referring to FIG. 2S, the metal trace 36 can be formed on the polymer layer 22 and on the metal cap 18 exposed by an opening in the polymer layer 22 for the scheme shown in FIG. 1B. The metal trace 36 can be formed of the titanium-containing layer or tantalum-containing layer 24, the titanium-containing layer 28 on the titanium-containing layer or tantalum-containing layer 24, the seed layer 30 on the titanium-containing layer 28 and the electroplated metal layer 34 on the seed layer 30.

For example, the metal trace 36 may be formed of a first titanium-tungsten-alloy layer 24 having a thickness of between 0.005 and 1 μm, and preferably between 0.01 and 0.7 μm, with nitrogen at a surface layer thereof having a thickness of between 5 and 500 angstroms, a second titanium-tungsten-alloy layer 28 having a thickness of between 0.02 and 0.5 microns on the first titanium-tungsten-alloy layer 24 and on the polymer layer 22, a seed layer 30 made of sputtered gold having a thickness of between 0.05 and 0.3 microns on the second titanium-tungsten -alloy layer 28, and an electroplated gold layer 34 having a thickness of between 1 and 25 microns, and preferably between 3 and 25 μm, on the seed layer 30.

Alternatively, the metal trace 36 may be formed of a titanium-tungsten-alloy layer 24 having a thickness of between 0.005 and 1 μm, and preferably between 0.01 and 0.7 μm, with nitrogen at a surface layer thereof having a thickness of between 5 and 500 angstroms, a titanium layer 28 having a thickness of between 0.02 and 0.5 microns on the titanium-tungsten-alloy layer 24 and on the polymer layer 22, a seed layer 30 made of sputtered gold having a thickness of between 0.05 and 0.3 microns on the titanium layer 28, and an electroplated gold layer 34 having a thickness of between 1 and 25 microns, and preferably between 3 and 25 μm, on the seed layer 30.

Alternatively, the metal trace 36 may be formed of a titanium-nitride layer 24 having a thickness of between 0.005 and 1 μm, and preferably between 0.01 and 0.7 μm, a titanium-tungsten-alloy layer 28 having a thickness of between 0.02 and 0.5 microns on the titanium-nitride layer 24 and on the polymer layer 22, a seed layer 30 made of sputtered gold having a thickness of between 0.05 and 0.3 microns on the titanium-tungsten-alloy layer 28, and an electroplated gold layer 34 having a thickness of between 1 and 25 microns, and preferably between 3 and 25 μm, on the seed layer 30.

Alternatively, the metal trace 36 may be formed of a titanium-nitride layer 24 having a thickness of between 0.005 and 1 μm, and preferably between 0.01 and 0.7 μm, a titanium layer 28 having a thickness of between 0.02 and 0.5 microns on the titanium-nitride layer 24 and on the polymer layer 22, a seed layer 30 made of sputtered gold having a thickness of between 0.05 and 0.3 microns on the titanium layer 28, and an electroplated gold layer 34 having a thickness of between 1 and 25 microns, and preferably between 3 and 25 μm, on the seed layer 30.

Alternatively, the metal trace 36 may be formed of a titanium layer 24 having a thickness of between 0.005 and 1 μm, and preferably between 0.01 and 0.7 μm, with nitrogen at a surface layer thereof having a thickness of between 5 and 500 angstroms, a titanium-tungsten-alloy layer 28 having a thickness of between 0.02 and 0.5 microns on the titanium layer 24 and on the polymer layer 22, a seed layer 30 made of sputtered gold having a thickness of between 0.05 and 0.3 microns on the second titanium-tungsten-alloy layer 28, and an electroplated gold layer 34 having a thickness of between 1 and 25 microns, and preferably between 3 and 25 μm, on the seed layer 30.

Alternatively, the metal trace 36 may be formed of a first titanium layer 24 having a thickness of between 0.005 and 1 μm, and preferably between 0.01 and 0.7 μm, with nitrogen at a surface layer thereof having a thickness of between 5 and 500 angstroms, a second titanium layer 28 having a thickness of between 0.02 and 0.5 microns on the first titanium layer 24 and on the polymer layer 22, a seed layer 30 made of sputtered gold having a thickness of between 0.05 and 0.3 microns on the second titanium layer 28, and an electroplated gold layer 34 having a thickness of between 1 and 25 microns, and preferably between 3 and 25 μm, on the seed layer 30.

Alternatively, the metal trace 36 may be formed of a tantalum-nitride layer 24 having a thickness of between 0.005 and 1 μm, and preferably between 0.01 and 0.7 μm, a titanium-tungsten-alloy layer 28 having a thickness of between 0.02 and 0.5 microns on the tantalum-nitride layer 24 and on the polymer layer 22, a seed layer 30 made of sputtered gold having a thickness of between 0.05 and 0.3 microns on the titanium-tungsten-alloy layer 28, and an electroplated gold layer 34 having a thickness of between 1 and 25 microns, and preferably between 3 and 25 μm, on the seed layer 30.

Alternatively, the metal trace 36 may be formed of a tantalum-nitride layer 24 having a thickness of between 0.005 and 1 μm, and preferably between 0.01 and 0.7 μm, a titanium layer 28 having a thickness of between 0.02 and 0.5 microns on the tantalum-nitride layer 24 and on the polymer layer 22, a seed layer 30 made of sputtered gold having a thickness of between 0.05 and 0.3 microns on the titanium layer 28, and an electroplated gold layer 34 having a thickness of between 1 and 25 microns, and preferably between 3 and 25 μm, on the seed layer 30.

Alternatively, the metal trace 36 may be formed of a tantalum layer 24 having a thickness of between 0.1 and 0.5 microns with nitrogen at a surface layer thereof having a thickness of between 5 and 500 angstroms, a titanium-tungsten-alloy layer 28 having a thickness of between 0.1 and 0.5 microns on the tantalum layer 24 and on the polymer layer 22, a seed layer 30 made of sputtered gold having a thickness of between 0.05 and 0.3 microns on the second titanium-tungsten-alloy layer 28, and an electroplated gold layer 34 having a thickness of between 1 and 15 microns on the seed layer 30.

Alternatively, the metal trace 36 may be formed of a tantalum layer 24 having a thickness of between 0.1 and 0.5 microns with nitrogen at a surface layer thereof having a thickness of between 5 and 500 angstroms, a titanium layer 28 having a thickness of between 0.1 and 0.5 microns on the tantalum layer 24 and on the polymer layer 22, a seed layer 30 made of sputtered gold having a thickness of between 0.05 and 0.3 microns on the titanium layer 28, and an electroplated gold layer 34 having a thickness of between 1 and 15 microns on the seed layer 30.

Alternatively, the metal trace 36 may be formed of a first titanium-tungsten-alloy layer 24 having a thickness of between 0.1 and 0.5 microns with nitrogen at a surface layer thereof having a thickness of between 5 and 500 angstroms, a second titanium-tungsten-alloy layer 28 having a thickness of between 0.1 and 0.5 microns on the first titanium-tungsten-alloy layer 24 and on the polymer layer 22, a seed layer 30 made of sputtered copper having a thickness of between 0.05 and 0.5 microns on the second titanium-tungsten-alloy layer 28, an electroplated copper layer having a thickness of between 1 and 15 microns on the seed layer 30, an electroplated nickel layer having a thickness of between 0.5 and 5 microns on the electroplated copper layer, and an electroplated gold layer having a thickness of between 0.05 and 2 microns on the electroplated nickel layer.

Alternatively, the metal trace 36 may be formed of a titanium-tungsten-alloy layer 24 having a thickness of between 0.1 and 0.5 microns with nitrogen at a surface layer thereof having a thickness of between 5 and 500 angstroms, a titanium layer 28 having a thickness of between 0.1 and 0.5 microns on the titanium-tungsten-alloy layer 24 and on the polymer layer 22, a seed layer 30 made of sputtered copper having a thickness of between 0.05 and 0.5 microns on the titanium layer 28, an electroplated copper layer having a thickness of between 1 and 15 microns on the seed layer 30, an electroplated nickel layer having a thickness of between 0.5 and 5 microns on the electroplated copper layer, and an electroplated gold layer having a thickness of between 0.05 and 2 microns on the electroplated nickel layer.

Alternatively, the metal trace 36 may be formed of a titanium-nitride layer 24 having a thickness of between 0.05 and 0.3 microns, a titanium-tungsten-alloy layer 28 having a thickness of between 0.1 and 0.5 microns on the titanium-nitride layer 24 and on the polymer layer 22, a seed layer 30 made of sputtered copper having a thickness of between 0.05 and 0.5 microns on the titanium-tungsten-alloy layer 28, an electroplated copper layer having a thickness of between 1 and 15 microns on the seed layer 30, an electroplated nickel layer having a thickness of between 0.5 and 5 microns on the electroplated copper layer, and an electroplated gold layer having a thickness of between 0.05 and 2 microns on the electroplated nickel layer.

Alternatively, the metal trace 36 may be formed of a titanium-nitride layer 24 having a thickness of between 0.05 and 0.3 microns, a titanium layer 28 having a thickness of between 0.1 and 0.5 microns on the titanium-nitride layer 24 and on the polymer layer 22, a seed layer 30 made of sputtered copper having a thickness of between 0.05 and 0.5 microns on the titanium layer 28, an electroplated copper layer having a thickness of between 1 and 15 microns on the seed layer 30, an electroplated nickel layer having a thickness of between 0.5 and 5 microns on the electroplated copper layer, and an electroplated gold layer having a thickness of between 0.05 and 2 microns on the electroplated nickel layer.

Alternatively, the metal trace 36 may be formed of a titanium layer 24 having a thickness of between 0.1 and 0.5 microns with nitrogen at a surface layer thereof having a thickness of between 5 and 500 angstroms, a titanium-tungsten-alloy layer 28 having a thickness of between 0.1 and 0.5 microns on the titanium layer 24 and on the polymer layer 22, a seed layer 30 made of sputtered copper having a thickness of between 0.05 and 0.5 microns on the titanium-tungsten -alloy layer 28, an electroplated copper layer having a thickness of between 1 and 15 microns on the seed layer 30, an electroplated nickel layer having a thickness of between 0.5 and 5 microns on the electroplated copper layer, and an electroplated gold layer having a thickness of between 0.05 and 2 microns on the electroplated nickel layer.

Alternatively, the metal trace 36 may be formed of a first titanium layer 24 having a thickness of between 0.1 and 0.5 microns with nitrogen at a surface layer thereof having a thickness of between 5 and 500 angstroms, a second titanium layer 28 having a thickness of between 0.1 and 0.5 microns on the first titanium layer 24 and on the polymer layer 22, a seed layer 30 made of sputtered copper having a thickness of between 0.05 and 0.5 microns on the second titanium layer 28, an electroplated copper layer having a thickness of between 1 and 15 microns on the seed layer 30, an electroplated nickel layer having a thickness of between 0.5 and 5 microns on the electroplated copper layer, and an electroplated gold layer having a thickness of between 0.05 and 2 microns on the electroplated nickel layer.

Alternatively, the metal trace 36 may be formed of a tantalum-nitride layer 24 having a thickness of between 0.05 and 0.3 microns, a titanium-tungsten-alloy layer 28 having a thickness of between 0.1 and 0.5 microns on the tantalum-nitride layer 24 and on the polymer layer 22, a seed layer 30 made of sputtered copper having a thickness of between 0.05 and 0.5 microns on the titanium-tungsten-alloy layer 28, an electroplated copper layer having a thickness of between 1 and 15 microns on the seed layer 30, an electroplated nickel layer having a thickness of between 0.5 and 5 microns on the electroplated copper layer, and an electroplated gold layer having a thickness of between 0.05 and 2 microns on the electroplated nickel layer.

Alternatively, the metal trace 36 may be formed of a tantalum-nitride layer 24 having a thickness of between 0.05 and 0.3 microns, a titanium layer 28 having a thickness of between 0.1 and 0.5 microns on the tantalum-nitride layer 24 and on the polymer layer 22, a seed layer 30 made of sputtered copper having a thickness of between 0.05 and 0.5 microns on the titanium layer 28, an electroplated copper layer having a thickness of between 1 and 15 microns on the seed layer 30, an electroplated nickel layer having a thickness of between 0.5 and 5 microns on the electroplated copper layer, and an electroplated gold layer having a thickness of between 0.05 and 2 microns on the electroplated nickel layer.

Alternatively, the metal trace 36 may be formed of a tantalum layer 24 having a thickness of between 0.1 and 0.5 microns with nitrogen at a surface layer thereof having a thickness of between 5 and 500 angstroms, a titanium-tungsten-alloy layer 28 having a thickness of between 0.1 and 0.5 microns on the tantalum layer 24 and on the polymer layer 22, a seed layer 30 made of sputtered copper having a thickness of between 0.05 and 0.5 microns on the titanium-tungsten -alloy layer 28, an electroplated copper layer having a thickness of between 1 and 15 microns on the seed layer 30, an electroplated nickel layer having a thickness of between 0.5 and 5 microns on the electroplated copper layer, and an electroplated gold layer having a thickness of between 0.05 and 2 microns on the electroplated nickel layer.

Alternatively, the metal trace 36 may be formed of a tantalum layer 24 having a thickness of between 0.1 and 0.5 microns with nitrogen at a surface layer thereof having a thickness of between 5 and 500 angstroms, a titanium layer 28 having a thickness of between 0.1 and 0.5 microns on the tantalum layer 24 and on the polymer layer 22, a seed layer 30 made of sputtered copper having a thickness of between 0.05 and 0.5 microns on the titanium layer 28, an electroplated copper layer having a thickness of between 1 and 15 microns on the seed layer 30, an electroplated nickel layer having a thickness of between 0.5 and 5 microns on the electroplated copper layer, and an electroplated gold layer having a thickness of between 0.05 and 2 microns on the electroplated nickel layer.

Referring to FIG. 2P, after the seed layer 30 and the titanium-containing layer 28 not under the metal layer 34 are removed, a polymer layer 38 can be optionally formed on the metal layer 34 of the metal trace 36 and on the polymer layer 22, at least one opening 38a in the polymer layer 38 exposing the metal layer 34 of the metal trace 36. The material of the polymer layer 38 may include polyimide, benzocyclobutane, polyurethane, a parylene-based polymer, a solder-mask material, epoxy resin, an elastomer, or a porous dielectric material. The polymer layer 38 has a thickness of between 3 and 26 μm or between 3 and 25 μm.

The polymer layer 38 can be formed by a spin-on coating process, a lamination process or a screen-printing process. Below, the process of forming a patterned polymer layer 38 is exemplified with the case of spin-on coating a polyimide layer on the polymer layer 22 and on the metal layer 34, and then patterning the polyimide layer. Alternatively, the polymer layer 38 can be formed by spin-on coating a layer of benzocyclobutane, polyurethane, a parylene-based polymer, a solder -mask material, epoxy resin, an elastomer or a porous dielectric material, and then patterning the layer.

For example, the polymer layer 38 can be formed by spin-on coating a positive-type photosensitive polyimide layer having a thickness of between 3 and 50 μm, and preferably of between 6 and 24 μm, on the polymer layer 22 and on the metal layer 34, then baking the spin-on coated polyimide layer, then exposing the baked polyimide layer using a 1× stepper or 1× contact aligner with at least two of G-line having a wavelength ranging from 434 to 438 nm, H-line having a wavelength ranging from 403 to 407 nm, and I-line having a wavelength ranging from 363 to 367 nm, illuminating the baked polyimide layer, that is, G-line and H-line, G-line and I-line, H-line and I-line, or G-line, H-line and I-line illuminate the baked polyimide layer, then developing the exposed polyimide layer, an opening in the developed polyimide layer exposing the metal layer 34, then curing or heating the developed polyimide layer at a peak temperature of between 250 and 400° C. for a time of between 10 and 200 minutes in a nitrogen ambient or in an oxygen-free ambient, the cured polyimide layer having a thickness of between 3 and 26 μm, and preferably between 3 and 12 μm, and then removing the residual polymeric material or other contaminants on the upper surface of the metal layer 34 exposed by the opening in the cured polyimide layer with an $O_2$ plasma or a plasma containing fluorine of below 200 PPM and oxygen, such that the polyimide layer can be patterned with at least one opening in the polyimide layer exposing the metal layer 34 of metal trace 36.

Besides, from a top perspective view, the position of the metal layer 34 of the metal trace 36 exposed by the opening 38a may be different from that of the pad 16 the metal trace 36 is connected to.

So far, a semiconductor wafer is formed by the above-mentioned steps. Next, the semiconductor wafer can be diced into a plurality of individual IC (integrated circuit) chips, semiconductor chips. Referring to FIG. 2Q, when one of the IC chips is being packaged, one end of a wire 40 (made of gold or copper) can be ball bonded on the metal layer 34 of an IC chip by a wire-bonding process. The other end of the wire 40 can be wedge bonded with an aluminum layer provided by a pad of another IC chip, a pad over another semiconductor substrate, or a pad over a silicon substrate. Alternatively, the other end of the wire 40 can be wedge bonded with a gold layer provided by a pad of another IC chip, a pad over another semiconductor substrate, a pad over an organic substrate, a pad over a ceramic substrate, a pad over a silicon substrate, a pad over a glass substrate, or a pad over a flexible film comprising a polymer layer with a thickness of between 30 and 200 μm. Alternatively, the other end of the wire 40 can be wedge bonded with a copper layer provided by a pad of another IC chip, a pad over another semiconductor substrate, a pad over an organic substrate, a pad over a ceramic substrate, a pad over a silicon substrate, a pad over a glass substrate, or a pad over a flexible film comprising a polymer layer with a thickness of between 30 and 200 μm. Alternatively, the other end of the wire 40 can be wedge bonded with an inner lead (made of copper) of a lead frame.

In the present invention, the strength of bonding the wire 40 to the metal layer 34 of the metal trace 36 exposed by the opening 38a of an IC chip may ranges from 100 to 1000 mN, from 200 to 1000 mN, or from 200 to 500 mN. After the wire-bonding process shown in FIG. 2Q is completed, a polymeric material, such as epoxy or polyimide, can be formed to cover the wire 40.

Alternatively, after the step shown in FIG. 2P have been completed, a tin-containing layer or bump having a thickness of between 1 and 500 μm, and preferably between 3 and 250 μm can be formed over the metal layer 34 exposed by the opening 38a. So far, the process for forming a semiconductor wafer is completed. Next, the semiconductor wafer can be diced into a plurality of individual IC chips. The tin-containing layer or bump may be formed by an electroplating method, an electroless plating method or a screen printing process. The tin-containing layer or bump is, for example, a tin-lead alloy, a tin-silver alloy, a tin-silver-copper alloy, a lead-free alloy. Using a tin-lead solder for illustration, the weight ratio of tin to lead can be adjusted accordingly. A typical weight ratio of lead to tin is 90/10, 95/5, 97/3 or 37/63, etc.

Alternatively, referring to FIG. 2P, a metal bump having a titanium-containing layer with a thickness of between 0.1 and 0.7 microns on the pad exposed by the opening 38a, a copper layer with a thickness of between 1 and 10 microns on the titanium-containing layer, a nickel layer with a thickness of between 0.5 and 5 microns on the copper layer, and a tin-containing layer with a thickness of between 10 and 300 microns on the nickel layer may be formed on the pad exposed by the opening 38a, followed by dicing the semiconductor wafer into multiple semiconductor chips. The semiconductor chip may be bonded to a BGA substrate through the metal bump.

Alternatively, referring to FIG. 2P, a metal bump having a titanium-containing layer with a thickness of between 0.1 and 0.7 microns on the pad exposed by the opening 28a, and a gold layer with a thickness of between 5 and 25 microns on the titanium-containing layer may be formed on the pad exposed by the opening 38a, followed by dicing the semiconductor wafer into multiple semiconductor chips. The metal bump may connect the semiconductor chip to a glass substrate via ACF or ACP. Besides, the metal bump may connect the semiconductor chip to a printed circuit board via tape automated bonding (TAB). Besides, the metal bump may connect the semiconductor chip to a flexible substrate without glass fiber.

Referring to FIG. 2R, in this embodiment, the step of forming the polymer layer 22 on the passivation layer 14, as shown in FIGS. 2A and 2B or in FIGS. 2A and 2C, can be omitted, that is, the titanium-containing layer 24 having a thickness of between 0.005 and 1 μm, and preferably between 0.01 and 0.7 μm, can be directly formed on the pad 16 exposed by the opening 14a and on the passivation layer 14, followed by the above-mentioned steps as shown in FIGS. 2E-2P, followed by the above-mentioned step as shown in FIG. 2Q or followed by forming the tin-containing layer or the above-mentioned metal bump over the metal trace 36 exposed by the opening 38a.

Alternatively, the above-mentioned process can be applied to a wafer including multiple pads principally made of electroplated copper, and a passivation layer including a first silicon -nitride layer having a thickness of 0.2 and 1 μm, an silicon-oxide layer having a thickness of between 0.2 and 1 μm, on the first silicon-nitride layer, and a second silicon-nitride layer having a thickness of between 0.2 and 1 μm on the silicon-oxide layer, multiple openings in the passivation layer exposing the pads principally made of electroplated copper. That is, the above mentioned polymer layer 22 can be formed on the second silicon-nitride layer of the passivation layer, the opening 22a in the polymer layer 22 exposing the electroplated copper of the pad and optionally exposing the second silicon-nitride layer of the passivation layer surrounding the openings in the passivation layer, which can be referred to the above description concerning FIGS. 2A-2C, followed by forming the above-mentioned titanium-containing layer or tantalum-containing layer 24 on the polymer layer 22 and on the pads principally made of electroplated copper, as referred to in FIG. 2D, followed by the steps as referred to in FIGS. 2E-2P, followed by the above-mentioned step as shown in FIG. 2Q or followed by forming the tin-containing layer or the above-mentioned metal bump over the metal trace 36 exposed by the opening 38a. Besides, the polymer layer 22 can be omitted. That is, the above-mentioned titanium-containing layer or tantalum-containing layer 24 can be formed directly on the second silicon-nitride layer of the passivation layer and on the pads principally made of electropled copper, as referred to in FIG. 2D, followed by the steps as referred to in FIGS. 2E -2P, followed by the above-mentioned step as shown in FIG. 2Q or followed by forming the tin-containing layer or the above-mentioned metal bump over the metal trace 36 exposed by the opening 38a.

Figure 2S:
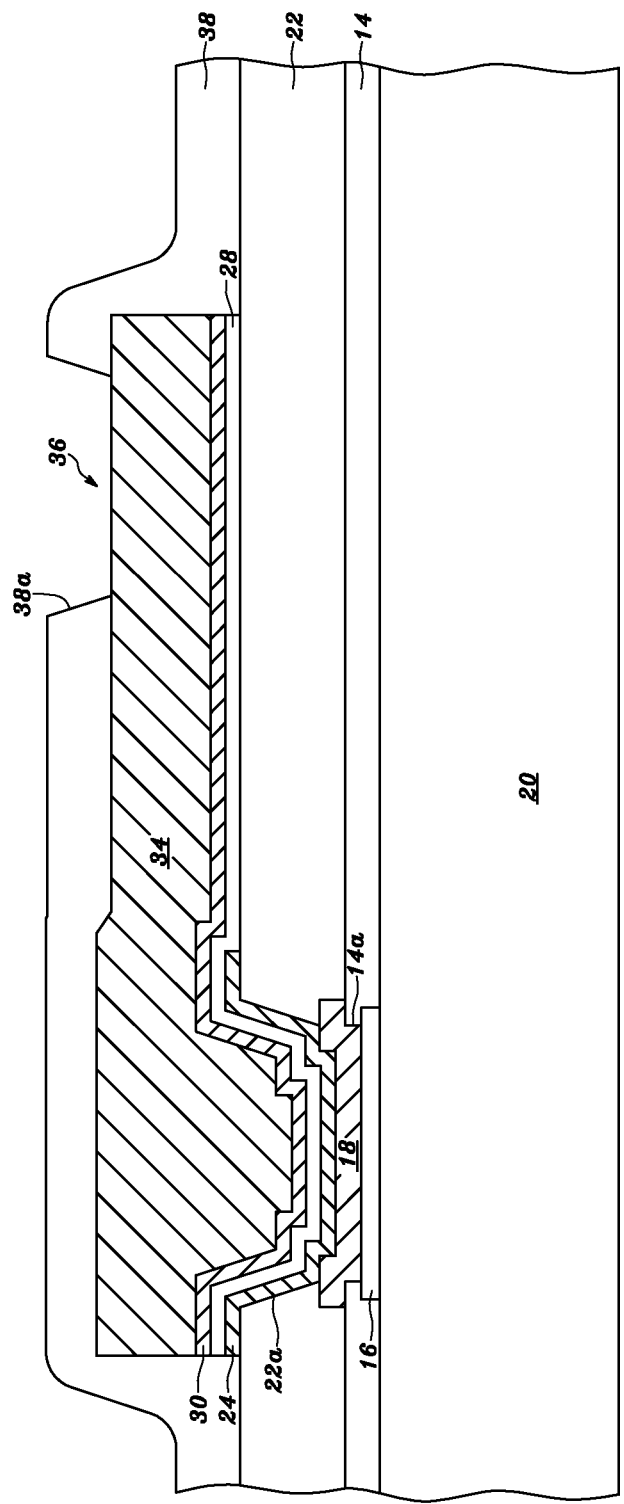

Alternatively, referring to FIG. 2S, the above-mentioned process can be applied to a wafer including multiple pads principally made of electroplated copper, a passivation layer including a first silicon-nitride layer having a thickness of 0.2 and 1 μm, an silicon-oxide layer having a thickness of between 0.2 and 1 μm, on the first silicon-nitride layer, and a second silicon-nitride layer having a thickness of between 0.2 and 1 μm on the silicon-oxide layer, multiple openings in the passivation layer exposing the pads principally made of electroplated copper, and multiple metal caps 18 including a tantalum-containing layer, such as pure tantalum or tantalum nitride, having a thickness of between 0.01 and 0.6 μm, on the pads principally made of electroplated copper, exposed by the openings in the passivation layer, and an aluminum-containing layer having a thickness of between 0.5 and 3 μm on the tantalum-containing layer. That is, the above mentioned polymer layer 22 can be formed on the second silicon-nitride layer of the passivation layer, the opening 22a in the polymer layer 22 exposing the metal cap 18, which can be referred to the above description concerning FIGS. 2A-2C, followed by forming the above-mentioned titanium-containing layer or tantalum-containing layer 24 on the polymer layer 22 and on the metal cap 18 exposed by the opening 22a, as referred to in FIG. 2D, followed by the steps as referred to in FIGS. 2E-2P, followed by the above-mentioned step as shown in FIG. 2Q or followed by forming the tin-containing layer or the above-mentioned metal bump over the metal trace 36 exposed by the opening 38a. Besides, the polymer layer 22 can be omitted. That is, the above-mentioned titanium-containing layer or tantalum-containing layer 24 can be formed directly on the second silicon-nitride layer of the passivation layer and on the metal cap 18, as referred to in FIG. 2D, followed by the steps as referred to in FIGS. 2E-2P, followed by the above-mentioned step as shown in FIG. 2Q or followed by forming the tin-containing layer or the above-mentioned metal bump over the metal trace 36 exposed by the opening 38a.

Embodiment 2

FIGS. 3A through 3J are cross-sectional views showing a process according to one embodiment of the present invention. In this embodiment, the pad 16 is an aluminum-containing layer, and the opening 14a in the passivation layer 14 exposes the aluminum-containing layer.

Referring to FIG. 3A, after the step shown in FIG. 2P is completed, an adhesion/barrier layer 42 having a thickness of between 0.02 and 0.5 μm can be sputtered on the metal layer 34 of the metal trace 36 exposed by the opening 38a and on the polymer layer 38. The material of the adhesion/barrier layer 42 may include titanium, tungsten, cobalt, nickel, titanium nitride, a titanium-tungsten alloy, a nickel-vanadium alloy, aluminum, chromium, copper, gold, protactinium, platinum, palladium, ruthenium, rhodium, silver, or a composite of the abovementioned materials. Alternatively, the adhesion/barrier layer 42 can be formed by an evaporation process.

For example, the adhesion/barrier layer 42 may be formed by sputtering a titanium-containing layer with a thickness of between 0.02 and 0.5 μm on the polymer layer 38 and on the metal layer 34, made of gold, exposed by the opening 38a. Alternatively, the adhesion/barrier layer 42 may be formed by sputtering a titanium layer with a thickness of between 0.02 and 0.5 μm on the polymer layer 38 and on the metal layer 34, made of gold, exposed by the opening 38a. Alternatively, the adhesion/barrier layer 42 may be formed by sputtering a titanium-tungsten -alloy layer with a thickness of between 0.02 and 0.5 μm on the polymer layer 38 and on the metal layer 34, made of gold, exposed by the opening 38a.

Referring to FIG. 3B, a seed layer 44 having a thickness of 0.05 and 0.3 μm can be sputtered on the adhesion/barrier layer 42. Alternatively, the seed layer 44 can be formed by a vapor deposition method, an electroless plating method or a PVD (Physical Vapor Deposition) method. The seed layer 44 is beneficial to electroplating a metal layer thereon. Thus, the material of the seed layer 44 varies with the material of the electroplated metal layer formed on the seed layer 44. When a gold layer is to be electroplated on the seed layer 44, gold is a preferable material to the seed layer 44. When a copper layer is to be electroplated on the seed layer 44, copper is a preferable material to the seed layer 44.

For example, when the adhesion/barrier layer 42 is formed by sputtering a titanium-containing layer with a thickness of between 0.02 and 0.5 μm the seed layer 44 can be formed by sputtering a gold layer with a thickness of between 0.05 and 0.3 μm on the titanium-containing layer. When the adhesion/barrier layer 42 is formed by sputtering a titanium layer with a thickness of between 0.02 and 0.5 μm the seed layer 44 can be formed by sputtering a gold layer with a thickness of between 0.05 and 0.3 μm on the titanium layer. When the adhesion/barrier layer 42 is formed by sputtering a titanium-tungsten-alloy layer with a thickness of between 0.02 and 0.5 μm, the seed layer 44 can be formed by sputtering a gold layer with a thickness of between 0.05 and 0.3 μm on the titanium-tungsten-alloy layer. When the adhesion/barrier layer 42 is formed by sputtering a titanium-containing layer with a thickness of between 0.02 and 0.5 μm the seed layer 44 can be formed by sputtering a copper layer with a thickness of between 0.05 and 0.3 μm on the titanium-containing layer. When the adhesion/barrier layer 42 is formed by sputtering a titanium layer with a thickness of between 0.02 and 0.5 μm the seed layer 44 can be formed by sputtering a copper layer with a thickness of between 0.05 and 0.3 μm on the titanium layer. When the adhesion/barrier layer 42 is formed by sputtering a titanium-tungsten-alloy layer with a thickness of between 0.02 and 0.5 μm the seed layer 44 can be formed by sputtering a copper layer with a thickness of between 0.05 and 0.3 μm on the titanium-tungsten-alloy layer.

Figure 3C:
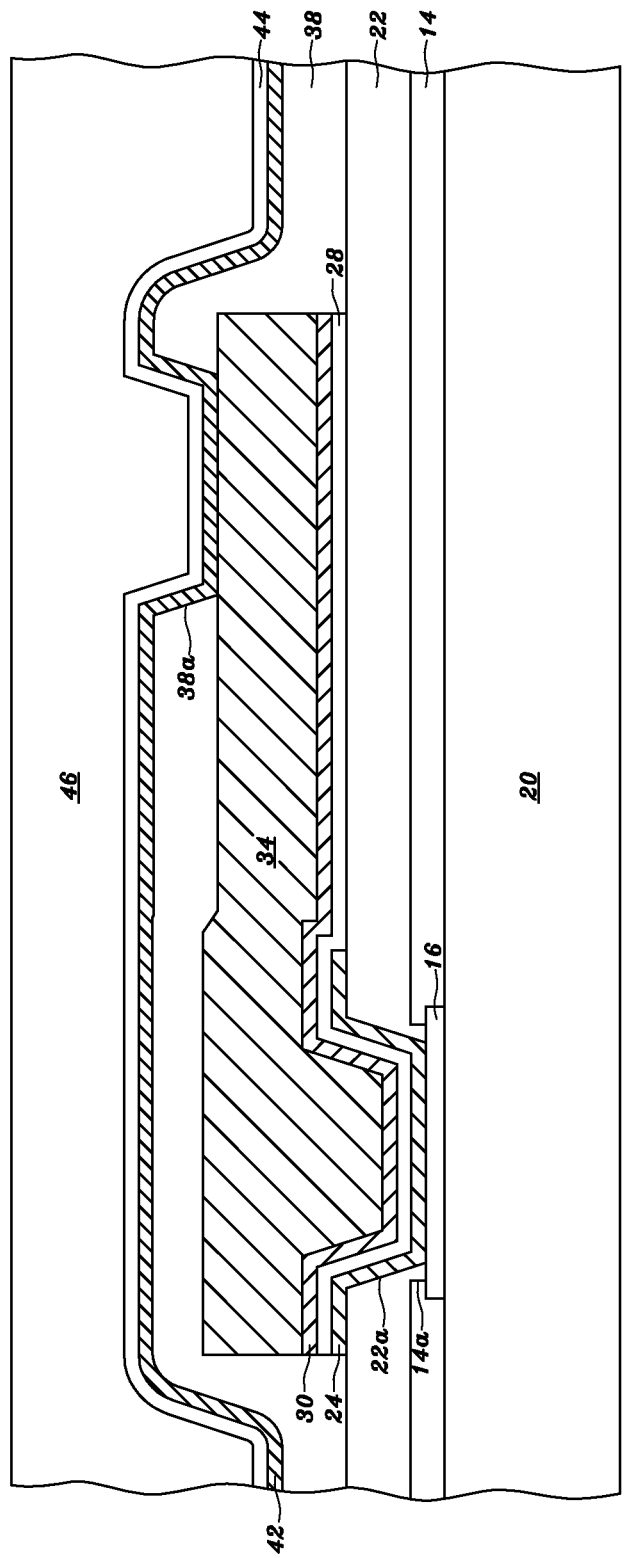
Figure 3D:
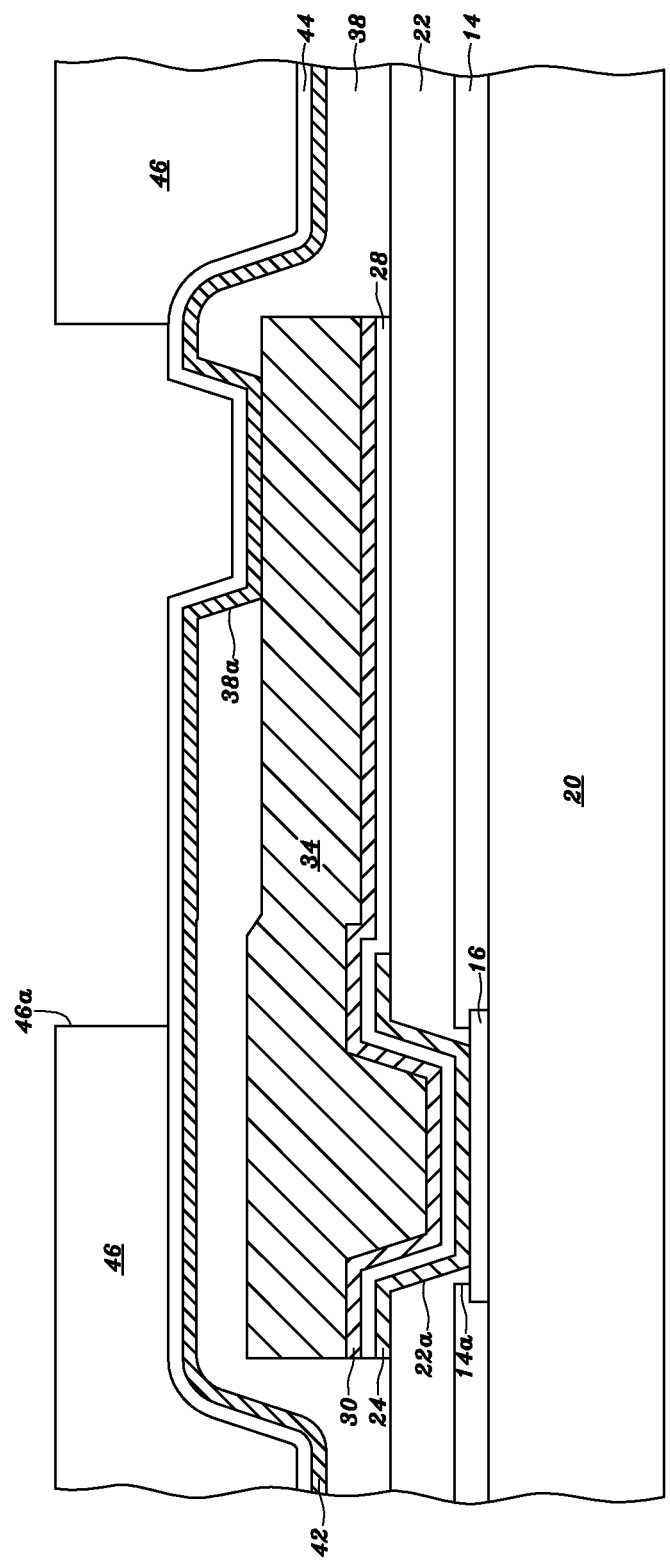

Referring to FIG. 3C, a photoresist layer 46 having a thickness of between 3.5 and 30 μm is formed on the seed layer 44. Referring to FIG. 3D, the photoresist layer 46 is patterned with the processes of exposure, development, etc., to form an opening 46a in the photoresist layer 46 exposing the seed layer 44. A 1× stepper or 1× contact aligner can be used to expose the photoresist layer 46 during the process of exposure.

For example, the photoresist layer 46 can be formed by spin-on coating a positive-type photosensitive polymer layer having a thickness of between 3.5 and 30 μm, and preferably of between 7 and 15 μm, on the seed layer 44, then exposing the photosensitive polymer layer using a 1× stepper or 1× contact aligner with at least two of G-line having a wavelength ranging from 434 to 438 nm, H-line having a wavelength ranging from 403 to 407 nm, and I-line having a wavelength ranging from 363 to 367 nm, illuminating the photosensitive polymer layer, that is, G-line and H-line, G-line and I-line, H-line and I-line, or G-line, H-line and I-line illuminate the photosensitive polymer layer, then developing the exposed polymer layer, an opening in the developed polymer layer exposing the seed layer 44, and then removing the residual polymeric material or other contaminants on the seed layer 44 exposed by the opening in the developed polymer layer, with an $O_2$ plasma or a plasma containing fluorine of below 200 PPM and oxygen, such that the photoresist layer 46 can be patterned with an opening 46a in the photoresist layer 46 exposing the seed layer 44.

Figure 3E:
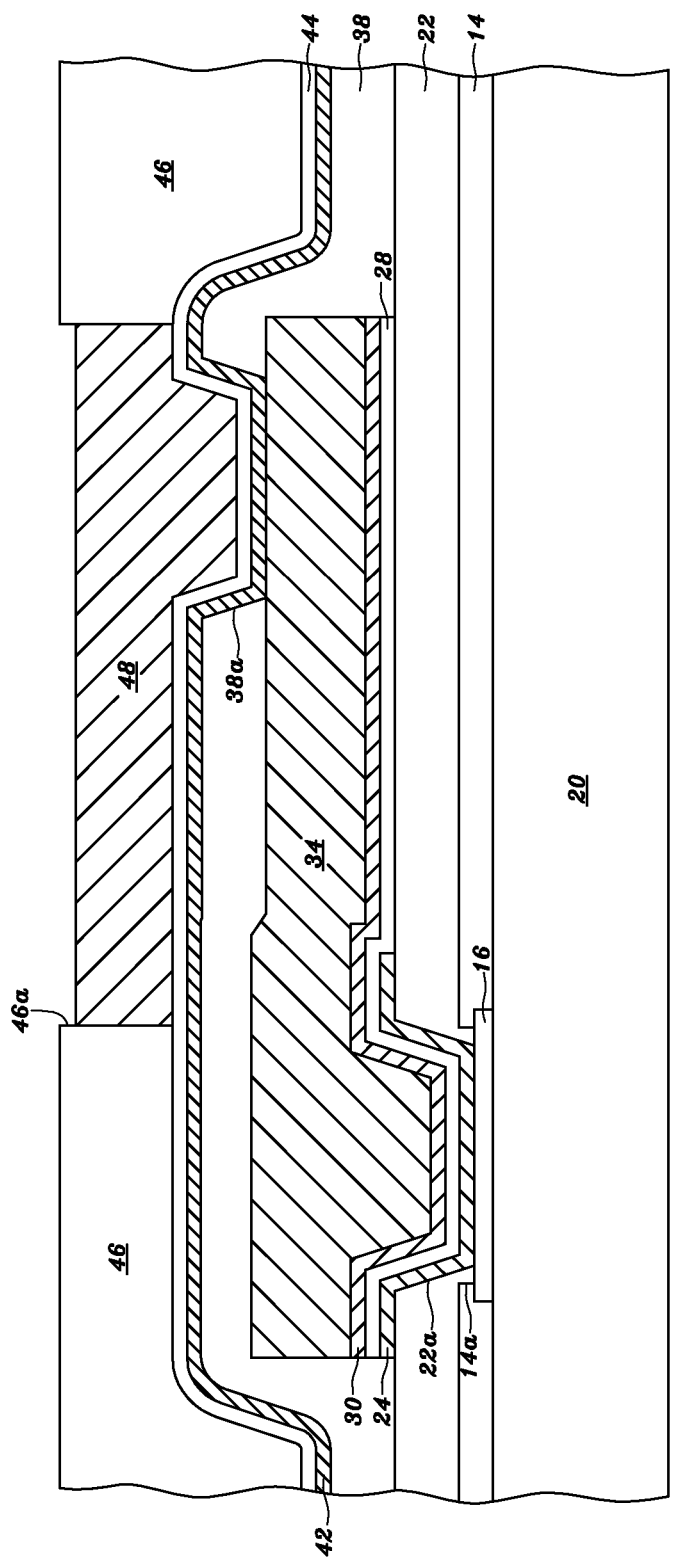

Referring to FIG. 3E, a metal layer 48 having a thickness of between 1 and 25 μm, and preferably between 3 and 15 μm, is electroplated on the seed layer 44 exposed by the opening 46a. For example, the metal layer 48 may be formed by electroplating a gold layer having a thickness of between 1 and 25 μm and preferably between 3 and 15 μm on the seed layer 44, made of gold, exposed by the opening 46a with an electroplating solution containing gold of between 1 and 20 grams per litter (g/l), and preferably between 5 and 15 g/l, and sulfite ion of 10 and 120 g/l, and preferably between 30 and 90 g/l. The electroplating solution may further comprise sodium ion, to be turned into a solution of gold sodium sulfite ($Na_3Au(SO_3)_2$), or may further comprise ammonium ion, to be turned into a solution of gold ammonium sulfite ($(NH_4)_3[Au(SO_3)_2]$).

The operational parameters of electroplating the gold layer are described below:

1. The above-mentioned electroplating solution can be at a temperature of between 30 and 70° C., and preferably between 45 and 65° C., to electroplate the gold layer on the seed layer 44 exposed by the opening 46a.
2. The above-mentioned electroplating solution can be used to electroplate the gold layer on the seed layer 44 exposed by the opening 46a through an electric current with a current density at between 1 and 10 mA/cm$^2$, and preferably between 4 and 6 mA/cm$^2$.
3. The above-mentioned electroplating solution may have a pH value of between 6 and 9, and preferably between 7 and 8.5, to electroplate the gold layer on the seed layer 44 exposed by the opening 46a.

Alternatively, the metal layer 48 may be formed by electroplating a gold layer having a thickness of between 1 and 25 μm and preferably between 3 and 15 μm on the seed layer 44, made of gold, exposed by the opening 46a with an electroplating solution containing cyanide.

Alternatively, the metal layer 48 may be formed by electroplating a copper layer having a thickness of between 1 and 20 μm on the seed layer 44, made of copper, exposed by the opening 46a, then electroplating a nickel layer having a thickness of between 0.5 and 5 microns on the copper layer in the opening 46a, and then electroplating a gold layer having a thickness of between 0.01 and 2 microns on the nickel layer in the opening 46a.

Figure 3F:
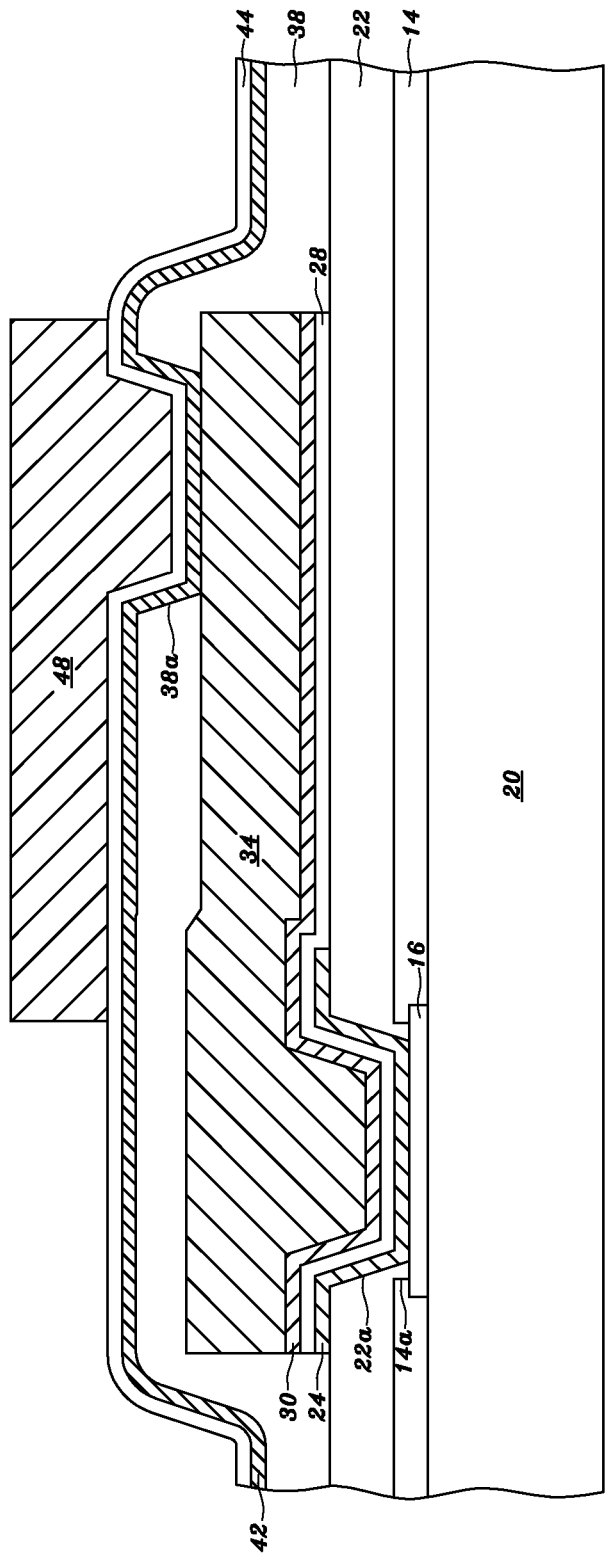

Referring to FIG. 3F, after the metal layer 48 is formed, most of the photoresist layer 46 can be removed using an organic solution with amide. However, some residuals from the photoresist layer 46 could remain on the metal layer 48 and on the seed layer 44. Thereafter, the residuals can be removed from the metal layer 48 and on the seed layer 44 with a plasma, such as an $O_2$ plasma or a plasma containing fluorine of below 200 PPM and oxygen.

Figure 3G:
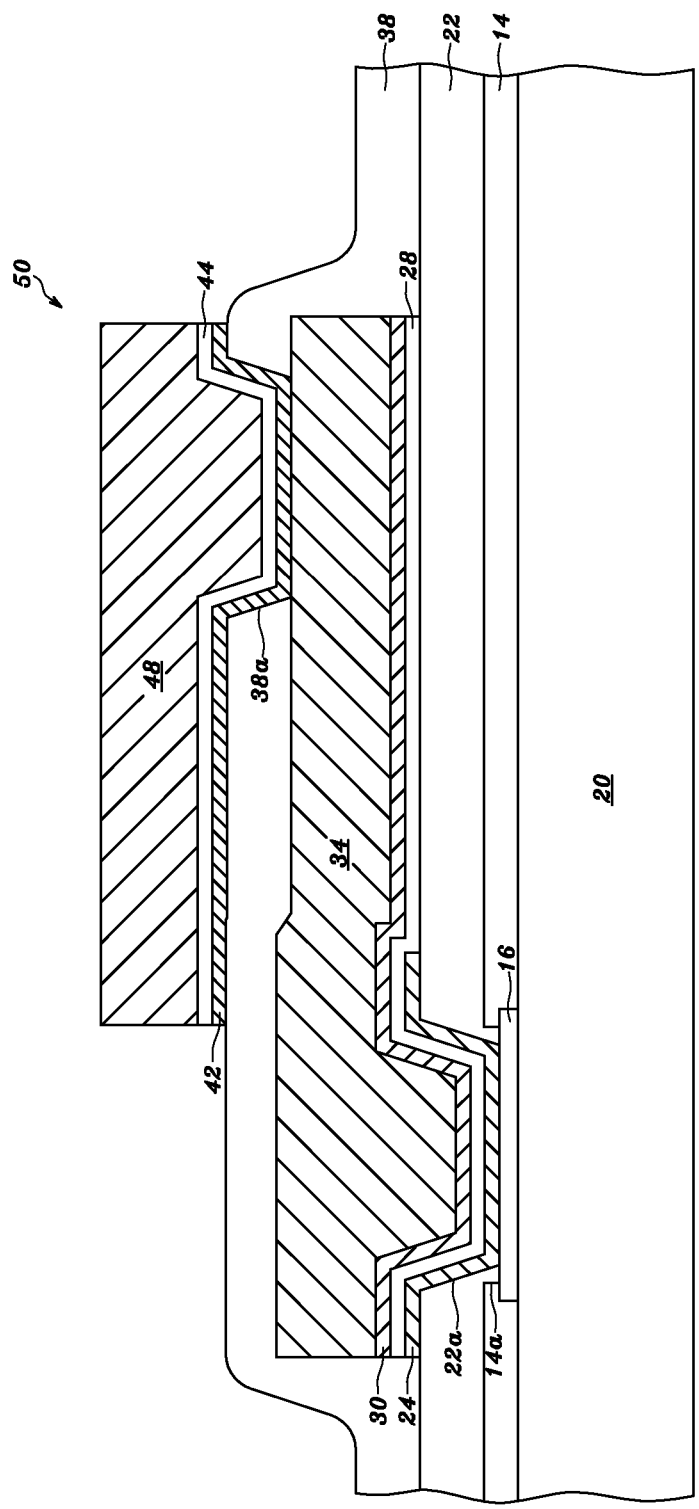

Thereafter, referring to FIG. 3G, the seed layer 44 and the adhesion/barrier layer 42 not under the metal layer 48 are subsequently removed with a dry etching method or a wet etching method. As to the wet etching methods, when the adhesion/barrier layer 42 is a titanium-tungsten-alloy layer, it can be etched with a solution containing hydrogen peroxide; when the adhesion/barrier layer 42 is a titanium layer, it can be etched with a solution containing hydrogen fluoride; when the seed layer 44 is a gold layer, it can be etched with an iodine-containing solution, such as solution containing potassium iodide. As to the dry etching methods, when the adhesion/barrier layer 42 is a titanium layer or a titanium-tungsten-alloy layer, it can be etched with a chlorine-containing plasma etching process or with an RIE process; when the seed layer 44 is a gold layer, it can be removed with an ion milling process or with an Ar sputtering etching process. Generally, the dry etching method to etch the seed layer 44 and the adhesion/barrier layer 42 not under the metal layer 48 may include a chemical plasma etching process, a sputtering etching process, such as argon sputter process, or a chemical vapor etching process.

Thereby, a metal trace 50 can be formed on the polymer layer 38 and on the metal layer 34 exposed by the opening 38a. The metal trace 50 can be formed of the adhesion/barrier layer 42, the seed layer 44 on the adhesion/barrier layer 44 and the electroplated metal layer 48 on the seed layer 44.

For example, the metal trace 50 may be formed of a titanium-tungsten-alloy layer having a thickness of between 0.1 and 0.5 microns, a seed layer 30 made of gold having a thickness of between 0.05 and 0.3 microns on the titanium-tungsten-alloy layer, and an electroplated gold layer having a thickness of between 1 and 25 μm and preferably between 3 and 15 μm on the seed layer 30 made of gold. Alternatively, the metal trace 50 may be formed of a titanium layer having a thickness of between 0.1 and 0.5 microns, a seed layer 30 made of gold having a thickness of between 0.05 and 0.3 microns on the titanium layer, and an electroplated gold layer having a thickness of between 1 and 25 μm and preferably between 3 and 15 μm on the seed layer 30 made of gold. Alternatively, the metal trace 50 may be formed of a titanium-tungsten-alloy layer having a thickness of between 0.1 and 0.5 microns, a seed layer 30 made of copper having a thickness of between 0.05 and 0.5 microns on the titanium-tungsten-alloy layer, an electroplated copper layer having a thickness of between 1 and 20 microns on the seed layer 30 made of copper, an electroplated nickel layer having a thickness of between 0.5 and 5 microns on the electroplated copper layer, and an electroplated gold layer having a thickness of between 0.01 and 2 microns on the electroplated nickel layer. Alternatively, the metal trace 50 may be formed of a titanium layer having a thickness of between 0.1 and 0.5 microns, a seed layer 30 made of copper having a thickness of between 0.05 and 0.5 microns on the titanium layer, an electroplated copper layer having a thickness of between 1 and 20 microns on the seed layer 30 made of copper, an electroplated nickel layer having a thickness of between 0.5 and 5 microns on the electroplated copper layer, and an electroplated gold layer having a thickness of between 0.01 and 2 microns on the electroplated nickel layer. Above-mentioned various kinds of the metal traces 50 can be formed over above-mentioned various kinds of the metal traces 56.

Figure 3H:
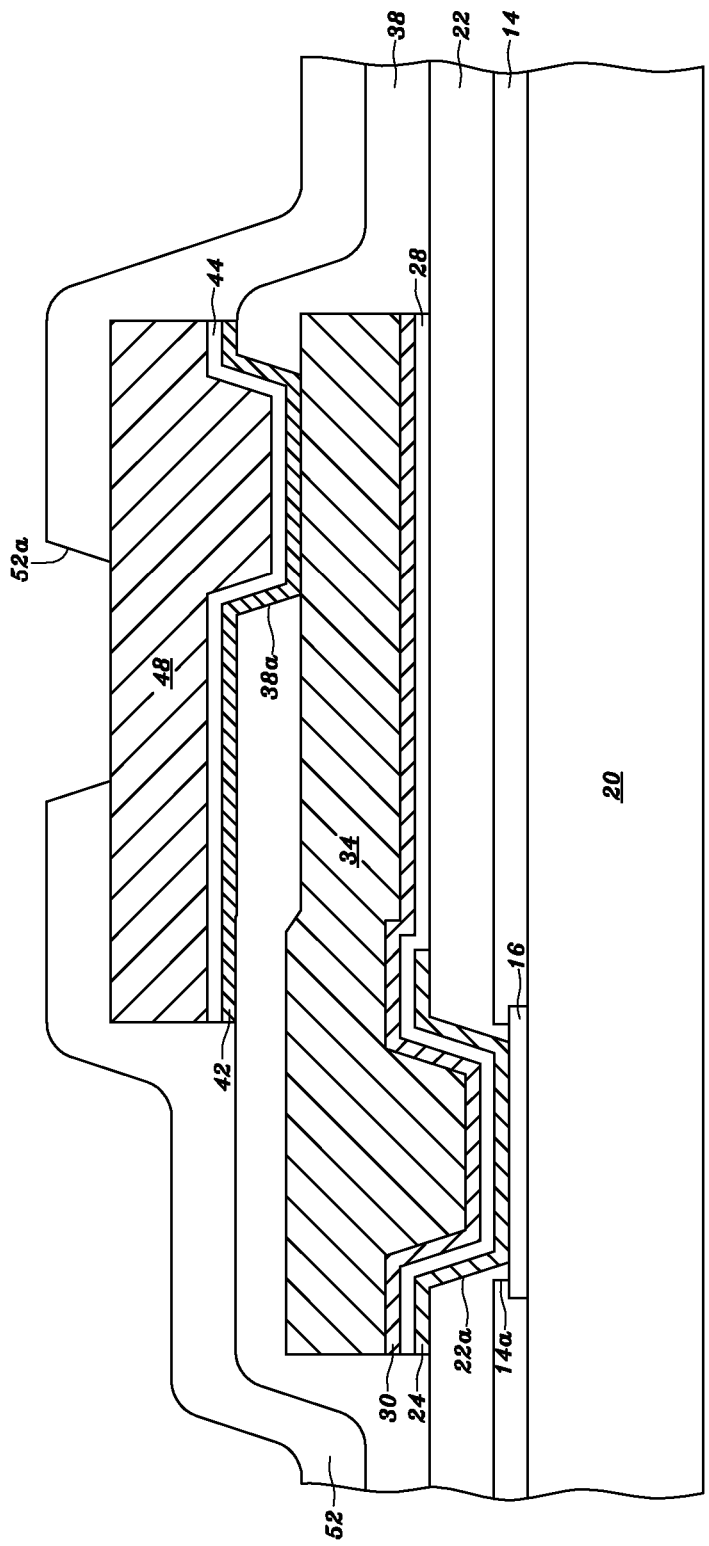

Referring to FIG. 3H, after the seed layer 44 and the adhesion/barrier layer 42 not under the metal layer 48 are removed, a polymer layer 52 can be optionally formed on the metal layer 48 of the metal trace 50 and on the polymer layer 38, and at least one opening 52a can be formed in the polymer layer 52, exposing the metal layer 48 of the metal trace 50. The material of the polymer layer 52 may include polyimide, benzocyclobutane, polyurethane, a parylene-based polymer, a solder-mask material, epoxy resin, an elastomer, or a porous dielectric material. The polymer layer 52 has a thickness of between 3 and 26 μm or between 3 and 25 μm.

The polymer layer 52 can be formed by a spin-on coating process, a lamination process or a screen-printing process. Below, the process of forming a patterned polymer layer 52 is exemplified with the case of spin-on coating a polyimide layer on the polymer layer 38 and on the metal layer 48 of the metal trace 50, and then patterning the polyimide layer. Alternatively, the polymer layer 52 can be formed by spin-on coating a layer of benzocyclobutane, polyurethane, a parylene-based polymer, a solder-mask material, epoxy resin, an elastomer or a porous dielectric material, and then patterning the layer.

For example, the polymer layer 52 can be formed by spin-on coating a positive-type photosensitive polyimide layer having a thickness of between 6 and 52 μm, and preferably of between 6 and 24 μm, on the polymer layer 38 and on the metal layer 48, then baking the spin-on coated polyimide layer, then exposing the baked polyimide layer using a 1× stepper or 1× contact aligner with at least two of G-line having a wavelength ranging from 434 to 438 nm, H-line having a wavelength ranging from 403 to 407 nm, and I-line having a wavelength ranging from 363 to 367 nm, illuminating the baked polyimide layer, that is, G-line and H-line, G-line and I-line, H-line and I-line, or G-line, H-line and I-line illuminate the baked polyimide layer, then developing the exposed polyimide layer, an opening in the developed polyimide layer exposing the metal layer 48, then curing or heating the developed polyimide layer at a peak temperature of between 250 and 400° C. for a time of between 10 and 200 minutes in a nitrogen ambient or in an oxygen-free ambient, the cured polyimide layer having a thickness of between 3 and 26 μm, and preferably between 3 and 12 μm, and then removing the residual polymeric material or other contaminants on the upper surface of the metal layer 48 exposed by the opening in the cured polyimide layer with an $O_2$ plasma or a plasma containing fluorine of below 200 PPM and oxygen, such that the polyimide layer can be patterned with at least one opening in the polyimide layer exposing the metal layer 48 of metal trace 50.

Besides, from a top perspective view, the position of the metal layer 48 of the metal trace 50 exposed by the opening 52a may be different from that of the metal layer 34 of the metal trace 36 exposed by the opening 38a.

Figure 3I:
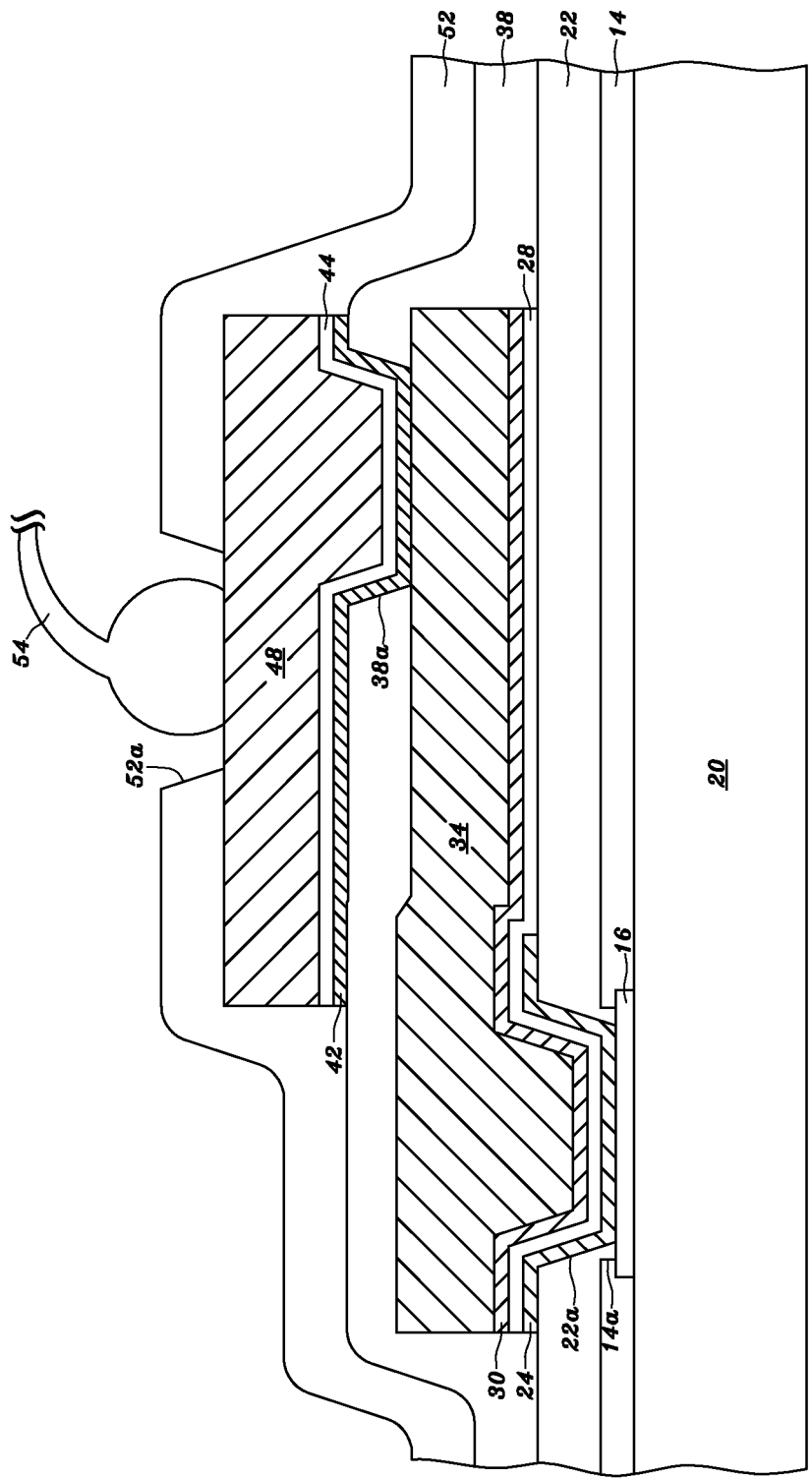

So far, a semiconductor wafer is formed by the above-mentioned steps. Next, the semiconductor wafer can be diced into a plurality of individual IC chips, semiconductor chips. Referring to FIG. 3I, when one of the IC chips is being packaged, one end of a wire 54 (made of gold or copper) can be ball bonded on the metal layer 48 of an IC chip by a wire-bonding process. The other end of the wire 54 can be wedge bonded with an aluminum layer provided by a pad of another IC chip, a pad over another semiconductor substrate, or a pad over a silicon substrate. Alternatively, the other end of the wire 54 can be wedge bonded with a gold layer provided by a pad of another IC chip, a pad over another semiconductor substrate, a pad over an organic substrate, a pad over a ceramic substrate, a pad over a silicon substrate, a pad over a glass substrate, or a pad over a flexible film comprising a polymer layer with a thickness of between 30 and 200 μm. Alternatively, the other end of the wire 54 can be wedge bonded with a copper layer provided by a pad of another IC chip, a pad over another semiconductor substrate, a pad over an organic substrate, a pad over a ceramic substrate, a pad over a silicon substrate, a pad over a glass substrate, or a pad over a flexible film comprising a polymer layer with a thickness of between 30 and 200 μm. Alternatively, the other end of the wire 54 can be wedge bonded with an inner lead (made of copper) of a lead frame.

In this embodiment, the strength of bonding the wire 54 to the metal layer 48 of the metal trace 50 exposed by the opening 38*a* of an IC chip may ranges from 100 to 1000 mN, from 200 to 1000 mN, or from 200 to 500 mN. After the wire-bonding process shown in FIG. 3I is completed, a polymeric material, such as epoxy or polyimide, can be formed to cover the wire 54.

Alternatively, after the step shown in FIG. 3H have been completed, a tin-containing layer or bump having a thickness of between 1 and 500 μm, and preferably between 3 and 250 μm, can be formed over the metal layer 48 exposed by the opening 52*a*. So far, the process for forming a semiconductor wafer is completed. Next, the semiconductor wafer can be diced into a plurality of individual IC chips. The tin-containing layer or bump may be formed by an electroplating method, an electroless plating method or a screen printing process. The tin-containing metal layer or bump is, for example, a tin-lead alloy, a tin-silver alloy, a tin-silver-copper alloy, a lead-free alloy. Using a tin-lead solder for illustration, the weight ratio of tin to lead can be adjusted accordingly. A typical weight ratio of lead to tin is 90/10, 95/5, 97/3 or 37/63, etc.

Alternatively, referring to FIG. 3H, a metal bump having a titanium-containing layer with a thickness of between 0.1 and 0.7 microns on the pad exposed by the opening 52*a*, a copper layer with a thickness of between 1 and 10 microns on the titanium-containing layer, a nickel layer with a thickness of between 0.5 and 5 microns on the copper layer, and a tin-containing layer with a thickness of between 10 and 300 microns on the nickel layer may be formed on the pad exposed by the opening 38*a*, followed by dicing the semiconductor wafer into multiple semiconductor chips. The semiconductor chip may be bonded to a BGA substrate through the metal bump.

Alternatively, referring to FIG. 3H, a metal bump having a titanium-containing layer with a thickness of between 0.1 and 0.7 microns on the pad exposed by the opening 52*a*, and a gold layer with a thickness of between 5 and 25 microns on the titanium-containing layer may be formed on the pad exposed by the opening 38*a*, followed by dicing the semiconductor wafer into multiple semiconductor chips. The metal bump may connect the semiconductor chip to a glass substrate via ACF or ACP. Besides, the metal bump may connect the semiconductor chip to a printed circuit board via tape automated bonding (TAB). Besides, the metal bump may connect the semiconductor chip to a flexible substrate without glass fiber.

Figure 3J:
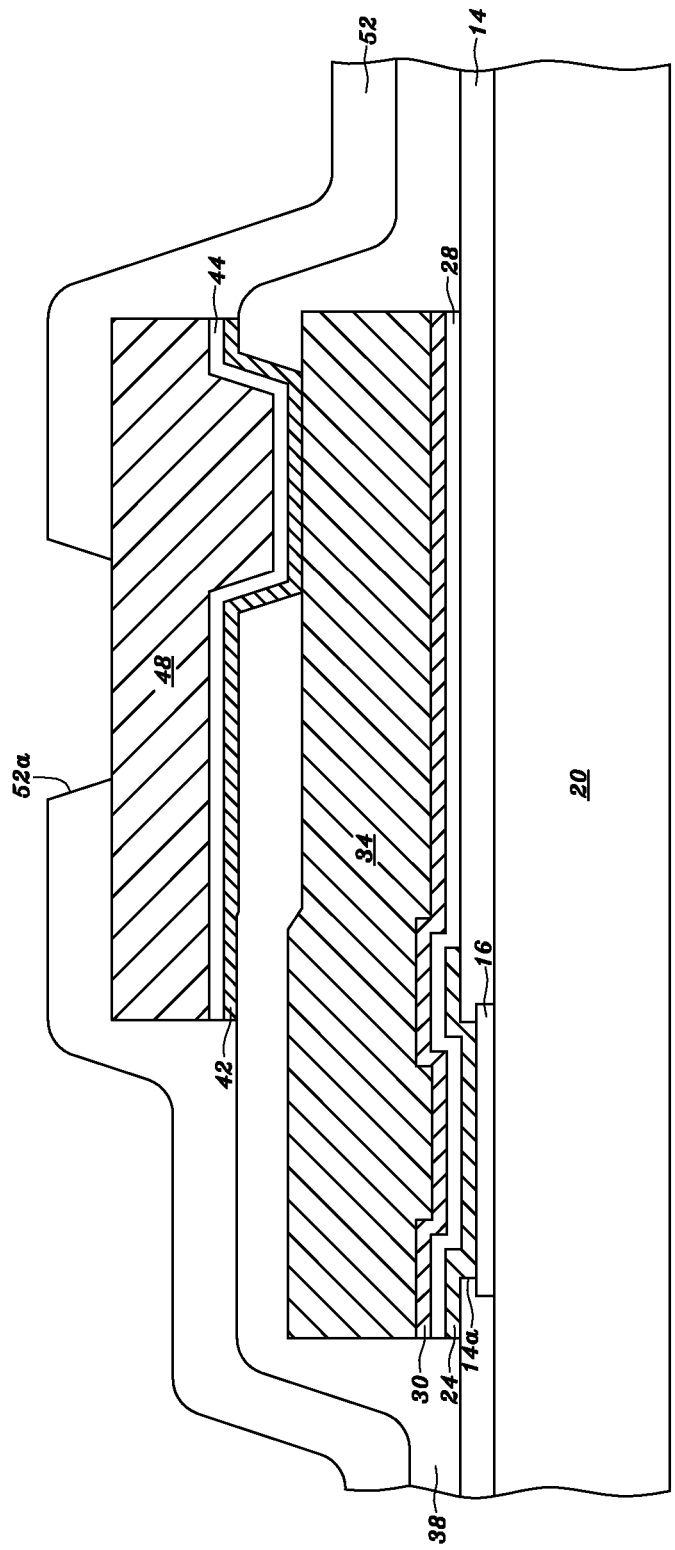

Referring to FIG. 3J, in this embodiment, the step of forming the polymer layer 22 on the passivation layer 14, as shown in FIGS. 2A and 2B or in FIGS. 2A and 2C, can be omitted, that is, the titanium-containing layer 24 having a thickness of between 0.005 and 1 μm, and preferably between 0.01 and 0.7 μm can be directly formed on the passivation layer 14 and on the pad 16 exposed by the opening 14*a*, followed by the above-mentioned steps as shown in FIGS. 2E-2P and FIGS. 3A-3H, followed by the above-mentioned step as shown in FIG. 3I or followed by forming the tin-containing layer or the above-mentioned metal bump over the metal trace 50 exposed by the opening 52*a*.

Alternatively, the above-mentioned process can be applied to a wafer including multiple pads principally made of electroplated copper, and a passivation layer including a first silicon-nitride layer having a thickness of 0.2 and 1 μm, an silicon-oxide layer having a thickness of between 0.2 and 1 μm, on the first silicon-nitride layer, and a second silicon-nitride layer having a thickness of between 0.2 and 1 μm on the silicon-oxide layer, multiple openings in the passivation layer exposing the pads principally made of electroplated copper. That is, the above mentioned polymer layer 22 can be formed on the second silicon-nitride layer of the passivation layer, the opening 22*a* in the polymer layer 22 exposing the electroplated copper of the pad and optionally exposing the second silicon-nitride layer of the passivation layer surrounding the openings in the passivation layer, which can be referred to the above description concerning FIGS. 2A-2C, followed by forming the above-mentioned titanium-containing layer or tantalum-containing layer 24 on the polymer layer 22 and on the pads principally made of electroplated copper, as referred to in FIG. 2D, followed by the steps as referred to in FIGS. 2E-2P and FIGS. 3A-3H, followed by the above-mentioned step as shown in FIG. 3I or followed by forming the tin-containing layer or the above-mentioned metal bump over the metal trace 50 exposed by the opening 52*a*. Besides, the polymer layer 22 can be omitted. That is, the above-mentioned titanium-containing layer or tantalum-containing layer 24 can be formed directly on the second silicon-nitride layer of the passivation layer and on the pads principally made of electropled copper, as referred to in FIG. 2D, followed by the steps as referred to in FIGS. 2E-2P and FIGS. 3A-3H, followed by the above-mentioned step as shown in FIG. 3I or followed by forming the tin-containing layer or the above-mentioned metal bump over the metal trace 50 exposed by the opening 52*a*.

Figure 3K:
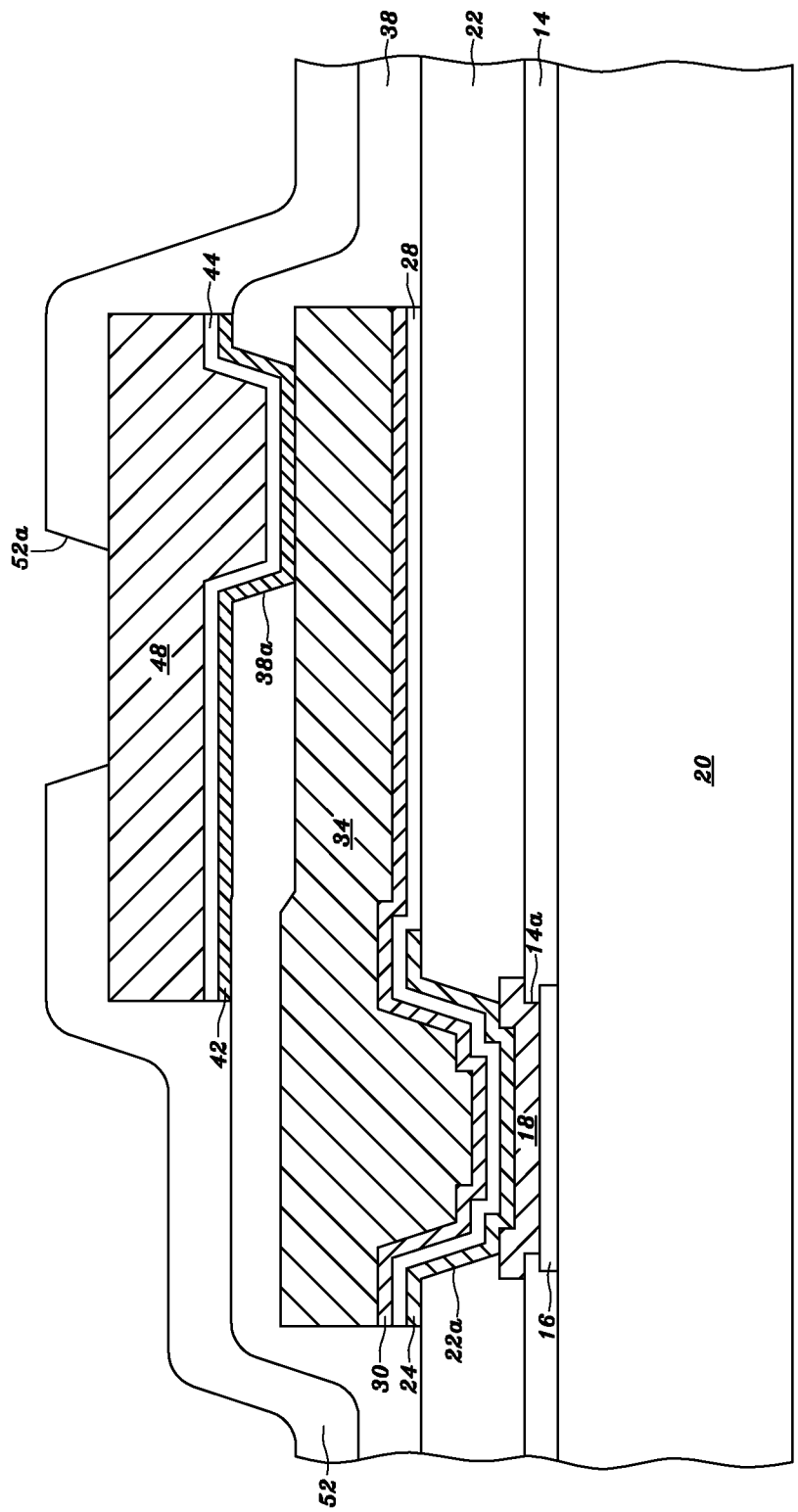

Alternatively, referring to FIG. 3K, the above-mentioned process can be applied to a wafer including multiple pads 16 principally made of electroplated copper, a passivation layer 14 including a first silicon-nitride layer having a thickness of 0.2 and 1 μm, an silicon-oxide layer having a thickness of between 0.2 and 1 μm, on the first silicon-nitride layer, and a second silicon-nitride layer having a thickness of between 0.2 and 1 μm on the silicon-oxide layer, multiple openings 14*a* in the passivation layer 14 exposing the pads 16 principally made of electroplated copper, and multiple metal caps 18 including a tantalum-containing layer, such as pure tantalum or tantalum nitride, having a thickness of between 0.01 and 0.6 μm, on the pads 16 principally made of electroplated copper, exposed by the openings 14*a* in the passivation layer 14, and an aluminum-containing layer having a thickness of between 0.5 and 3 μm on the tantalum-containing layer. That is, the above mentioned polymer layer 22 can be formed on the second silicon-nitride layer of the passivation layer 14, the opening 22*a* in the polymer layer 22 exposing the metal cap 18, which can be referred to the above description concerning FIGS. 2A-2C, followed by forming the above-mentioned titanium-containing layer or tantalum-containing layer 24 on the polymer layer 22 and on the metal cap 18, as referred to in FIG. 2D, followed by the steps as referred to in FIGS. 2E-2P and FIGS. 3A-3H, followed by the above-mentioned step as shown in FIG. 3I or followed by forming the tin-containing layer or the above-mentioned metal bump over the metal trace 50 exposed by the opening 52a. Besides, the polymer layer 22 can be omitted. That is, the above-mentioned titanium-containing layer or tantalum-containing layer 24 can be formed directly on the second silicon-nitride layer of the passivation layer 14 and on the metal cap 18, as referred to in FIG. 2D, followed by the steps as referred to in FIGS. 2E-2P and FIGS. 3A-3H, followed by the above-mentioned step as shown in FIG. 3I or followed by forming the tin-containing layer or the above-mentioned metal bump over the metal trace 50 exposed by the opening 52a.

Embodiment 3

FIGS. 4A through 4J are cross-sectional views showing a process according to one embodiment of the present invention. In this embodiment, the pad 16 is an aluminum-containing layer, and the opening 14a in the passivation layer 14 exposes the aluminum-containing layer.

After the steps shown in FIG. 2D, if the titanium-containing layer or tantalum-containing layer 24 is made of titanium, a titanium-tungsten alloy or tantalum, an annealing process is performed by heating the titanium-containing layer or tantalum-containing layer 24 at a temperature of between 300 and 410° C., and preferably between 350 and 400° C., for a time of between 20 and 150 minutes, and preferably between 50 and 100 minutes in a nitrogen ambient with a nitrogen purity of great than 99%, and preferably with a nitrogen purity of great than 99.99%. Thereby, a reaction of nitrogen and the titanium-containing layer or tantalum-containing layer 24 occurs at a surface of the titanium-containing layer 24. The titanium-containing layer or tantalum-containing layer 24 contains nitrogen at a surface layer thereof with a thickness of less than 2,500 angstroms, such as between 5 and 500 angstroms.

Figure 4A:
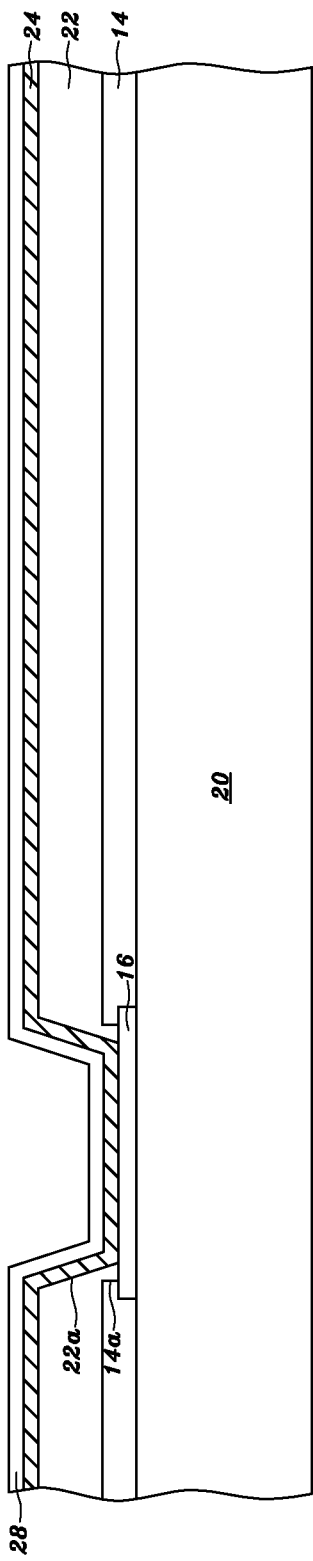

Next, referring to FIG. 4A, a titanium-containing layer 28 having a thickness of between 0.02 and 0.5 µm is sputtered on the titanium-containing layer or tantalum-containing layer 24, such as a titanium layer with nitrogen at a surface layer thereof with a thickness of between 5 and 500 angstroms, a titanium-tungsten-alloy layer with nitrogen at a surface layer thereof with a thickness of between 5 and 500 angstroms, a titanium-nitride layer, a tantalum layer with nitrogen at a surface layer thereof with a thickness of between 5 and 500 angstroms, or a tantalum-nitride layer. The titanium-containing layer 28 acts as an adhesion layer providing a good adhesion between the titanium-containing layer or tantalum-containing layer 24 and sequentially-formed metallization structure. The titanium-containing layer 28 may be a titanium-tungsten-alloy layer or a titanium layer. Alternatively, the titanium-containing layer 28 can be formed by an evaporation process.

For example, the titanium-containing layer 28 may be formed by sputtering a titanium layer on the titanium-containing layer 24 made of titanium with nitrogen at a surface layer thereof with a thickness of between 5 and 500 angstroms. Alternatively, the titanium-containing layer 28 may be formed by sputtering a titanium layer on the titanium-containing layer 24 made of a titanium-tungsten alloy with nitrogen at a surface layer thereof with a thickness of between 5 and 500 angstroms. Alternatively, the titanium-containing layer 28 may be formed by sputtering a titanium layer on the titanium-containing layer 24 made of titanium nitride. Alternatively, the titanium-containing layer 28 may be formed by sputtering a titanium layer on the tantalum-containing layer 24 made of tantalum nitride. Alternatively, the titanium-containing layer 28 may be formed by sputtering a titanium layer on the tantalum-containing layer 24 made of tantalum with nitrogen at a surface layer thereof with a thickness of between 5 and 500 angstroms. Alternatively, the titanium-containing layer 28 may be formed by sputtering a titanium-tungsten-alloy layer on the titanium-containing layer 24 made of titanium with nitrogen at a surface layer thereof with a thickness of between 5 and 500 angstroms. Alternatively, the titanium-containing layer 28 may be formed by sputtering a titanium-tungsten-alloy layer on the titanium-containing layer 24 made of titanium-tungsten alloy. Alternatively, the titanium-containing layer 28 may be formed by sputtering a titanium-tungsten-alloy layer on the titanium-containing layer 24 made of titanium nitride. Alternatively, the titanium-containing layer 28 may be formed by sputtering a titanium-tungsten-alloy layer on the tantalum-containing layer 24 made of tantalum nitride. Alternatively, the titanium-containing layer 28 may be formed by sputtering a titanium-tungsten-alloy layer on the tantalum-containing layer 24 made of tantalum with nitrogen at a surface layer thereof with a thickness of between 5 and 500 angstroms.

Figure 4B:
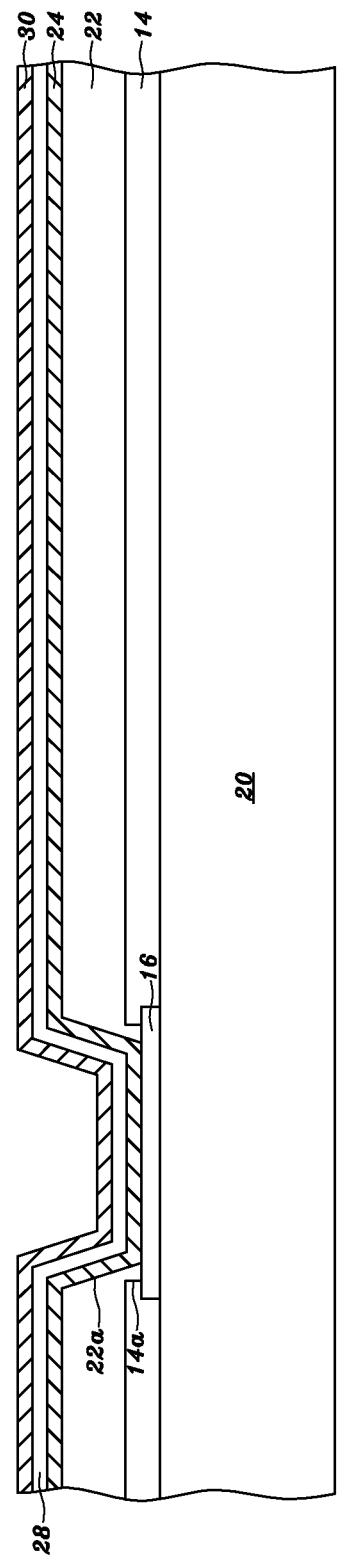

Referring to FIG. 4B, a seed layer 30 having a thickness of between 0.05 and 0.3 µm can be is sputtered on the titanium-containing layer 28. Alternatively, the seed layer 30 can be formed by a vapor deposition method, an electroless plating method or a PVD (Physical Vapor Deposition) method. The seed layer 30 is beneficial to electroplating a metal layer thereon. Thus, the material of the seed layer 30 varies with the material of the electroplated metal layer formed on the seed layer 30. When a gold layer is to be electroplated on the seed layer 30, gold is a preferable material to the seed layer 30. When a copper layer is to be electroplated on the seed layer 30, copper is a preferable material to the seed layer 30.

For example, when the titanium-containing layer 28 is formed by sputtering a titanium layer with a thickness of between 0.02 and 0.5 µm the seed layer 30 can be formed by sputtering a gold layer with a thickness of between 0.05 and 0.3 µm on the titanium layer. When the titanium-containing layer 28 is formed by sputtering a titanium-tungsten-alloy layer with a thickness of between 0.02 and 0.5 µm the seed layer 30 can be formed by sputtering a gold layer with a thickness of between 0.05 and 0.3 µm on the titanium-tungsten-alloy layer. When the titanium-containing layer 28 is formed by sputtering a titanium layer with a thickness of between 0.02 and 0.5 µm, the seed layer 30 can be formed by sputtering a copper layer with a thickness of between 0.05 and 0.5 µm on the titanium layer. When the titanium-containing layer 28 is formed by sputtering a titanium-tungsten-alloy layer with a thickness of between 0.02 and 0.5 µm, the seed layer 30 can be formed by sputtering a copper layer with a thickness of between 0.05 and 0.3 µm on the titanium-tungsten-alloy layer.

Figure 4C:
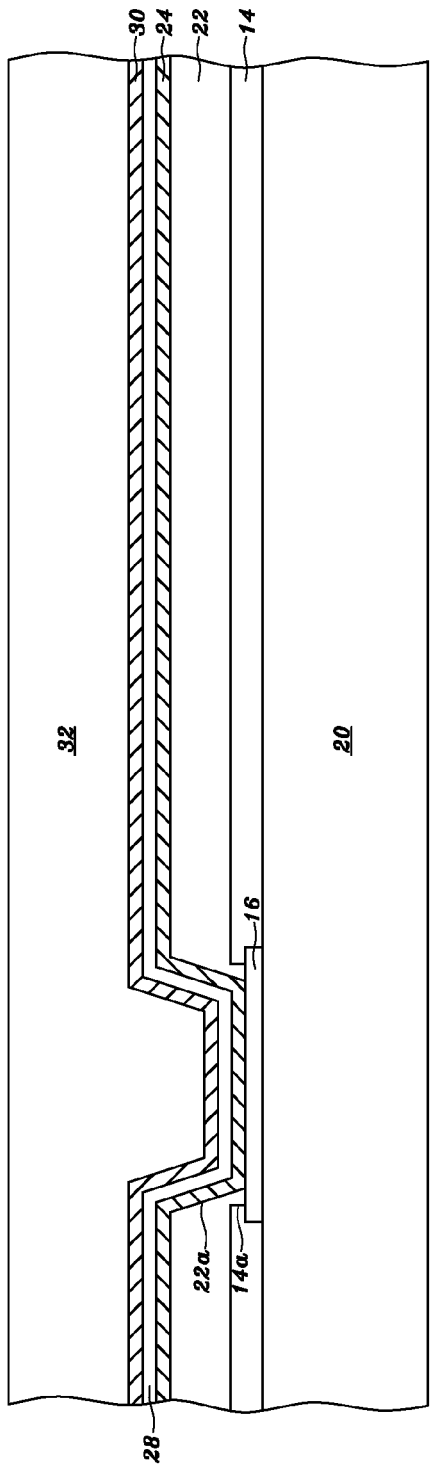
Figure 4D:
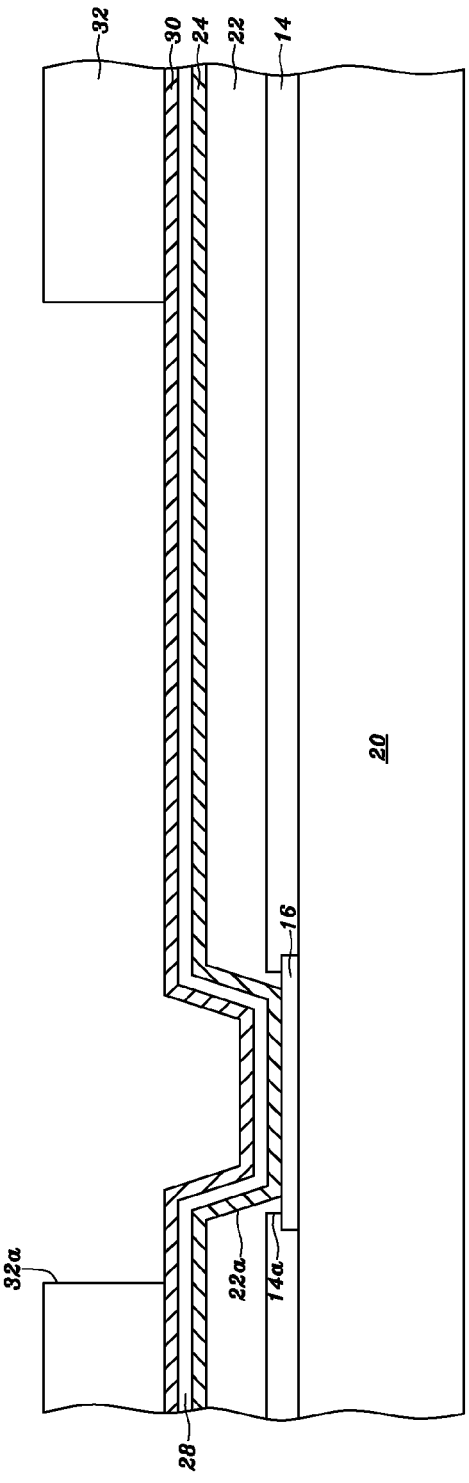

Referring to FIG. 4C, a photoresist layer 32 having a thickness of between 3.5 and 30 µm is formed on the seed layer 30. Referring to FIG. 4D, the photoresist layer 32 is patterned with the processes of exposure, development, etc., to form an opening 32a in the photoresist layer 32 exposing the seed layer 30. A 1× stepper or 1× contact aligner can be used to expose the photoresist layer 32 during the process of exposure.

For example, the photoresist layer 32 can be formed by spin-on coating a positive-type photosensitive polymer layer having a thickness of between 3.5 and 30 µm, and preferably of between 7 and 15 µm on the seed layer 30, then exposing the photosensitive polymer layer using a 1× stepper or 1× contact aligner with at least two of G-line having a wavelength ranging from 434 to 438 nm, H-line having a wavelength ranging from 403 to 407 nm, and I-line having a wavelength ranging from 363 to 367 nm, illuminating the photosensitive polymer layer, that is, G-line and H-line, G-line and I-line, H-line and I-line, or G-line, H-line and I-line illuminate the photosensitive polymer layer, then developing the exposed polymer layer, and then removing the residual polymeric material or other contaminants on the seed layer 30 with an $O_2$ plasma or a plasma containing fluorine of below 200 PPM and oxygen, such that the photoresist layer 32 can be patterned with an opening 32a in the photoresist layer 32 exposing the seed layer 30.

Figure 4E:
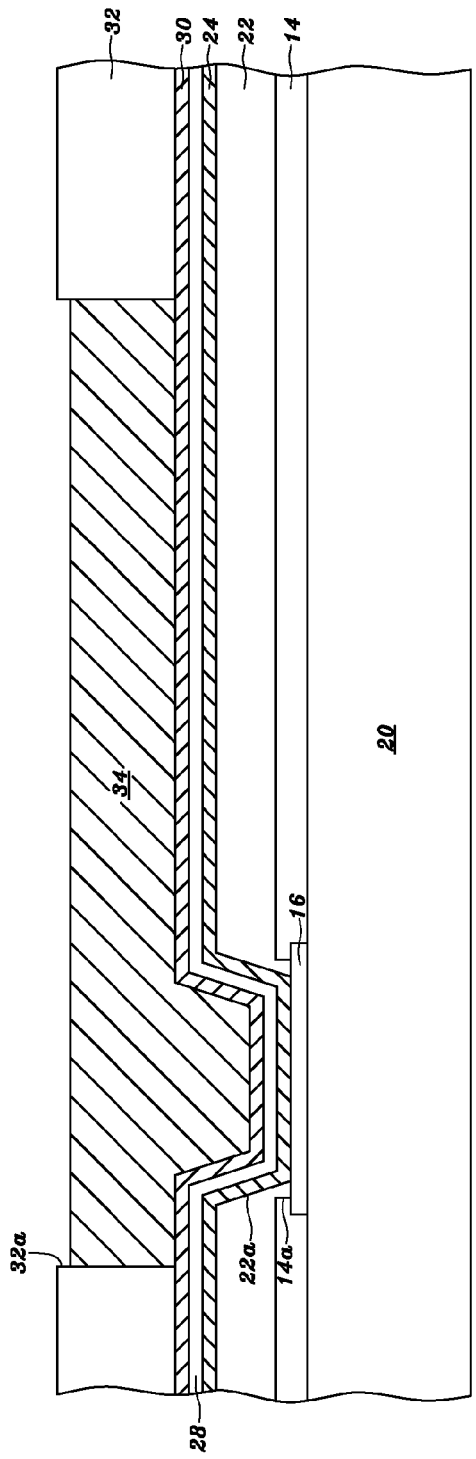

Referring to FIG. 4E, a metal layer 34 having a thickness of between 1 and 25 μm and preferably between 3 and 25 μm, is electroplated on the seed layer 30 exposed by the opening 32a. For example, the metal layer 34 may be formed by electroplating a gold layer having a thickness of between 1 and 25 μm and preferably between 3 and 25 μm on the seed layer 30, made of gold, exposed by the opening 32a with an electroplating solution containing gold of between 1 and 20 grams per litter (g/l), and preferably between 5 and 15 g/l, and sulfite ion of 10 and 120 g/l, and preferably between 30 and 90 g/l. The electroplating solution may further comprise sodium ion, to be turned into a solution of gold sodium sulfite ($Na_3Au(SO_3)_2$), or may further comprise ammonium ion, to be turned into a solution of gold ammonium sulfite ($(NH_4)_3[Au(SO_3)_2]$).

The operational parameters of electroplating the gold layer are described below:
1. The above-mentioned electroplating solution can be at a temperature of between 30 and 70° C., and preferably between 45 and 65° C., to electroplate the gold layer on the seed layer 30 exposed by the opening 32a.
2. The above-mentioned electroplating solution can be used to electroplate the gold layer on the seed layer 30 exposed by the opening 32a through an electric current with a current density at between 1 and 10 $mA/cm^2$, and preferably between 4 and 6 $mA/cm^2$.
3. The above-mentioned electroplating solution may have a pH value of between 6 and 9, and preferably between 7 and 8.5, to electroplate the gold layer on the seed layer 30 exposed by the opening 32a.

Alternatively, the metal layer 34 may be formed by electroplating a gold layer having a thickness of between 1 and 25 μm and preferably between 3 and 25 μm on the seed layer 30, made of gold, exposed by the opening 32a with an electroplating solution containing cyanide.

Alternatively, the metal layer 34 may be formed by electroplating a copper layer having a thickness of between 1 and 20 μm on the seed layer 30, made of copper, exposed by the opening 32a, then electroplating a nickel layer having a thickness of between 0.5 and 5 microns on the copper layer in the opening 32a, and then electroplating a gold layer having a thickness of between 0.01 and 2 microns on the nickel layer in the opening 32a.

Figure 4F:
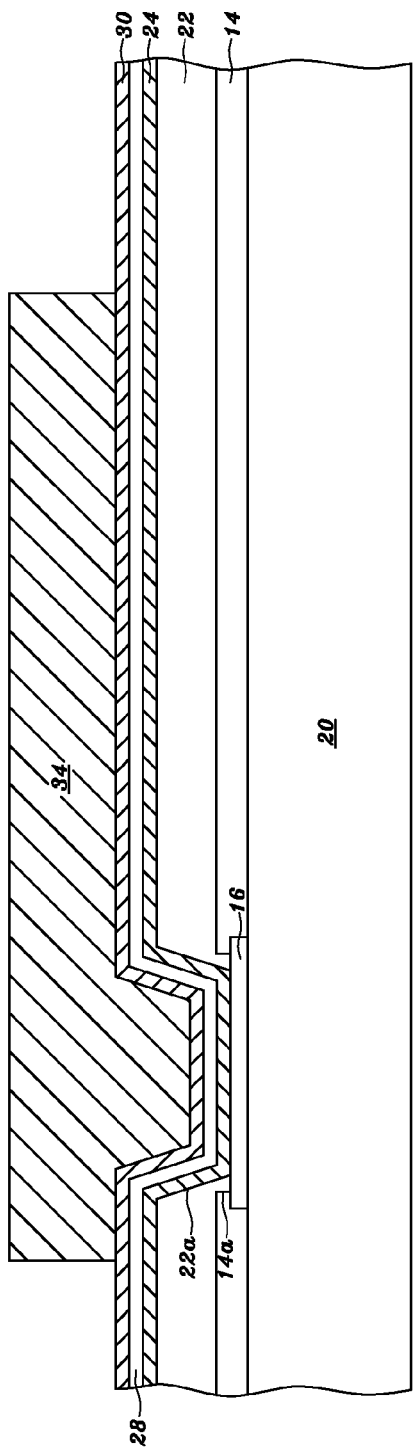

Referring to FIG. 4F, after the metal layer 34 is formed, most of the photoresist layer 32 can be removed using an organic solution with amide. However, some residuals from the photoresist layer 32 could remain on the metal layer 34 and on the seed layer 30. Thereafter, the residuals can be removed from the metal layer 34 and from the seed layer 30 with a plasma, such as an $O_2$ plasma or a plasma containing fluorine of below 200 PPM and oxygen.

Figure 4G:
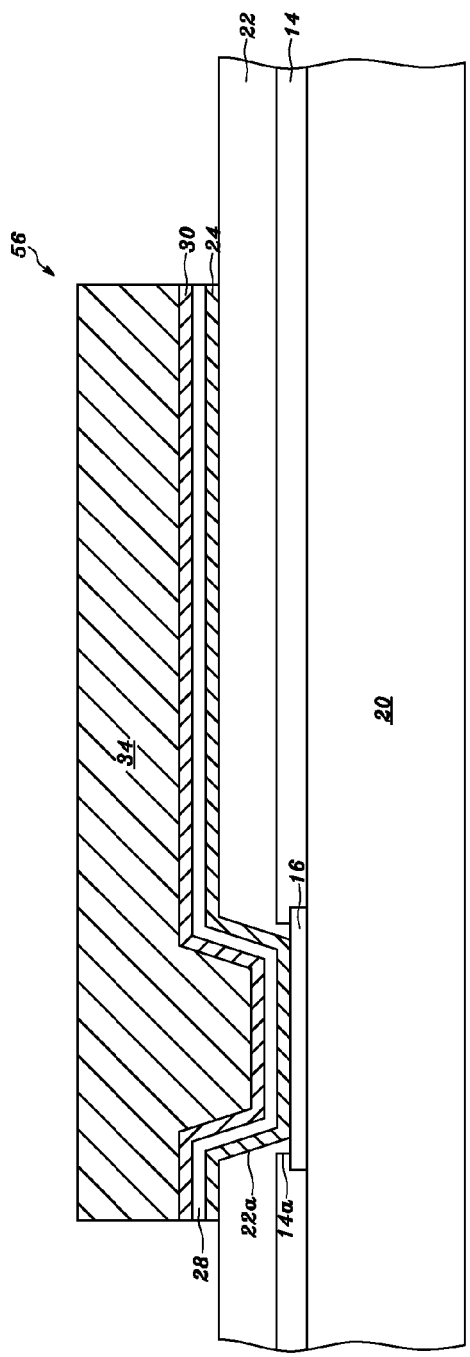

Thereafter, referring to FIG. 4G, the seed layer 30, the titanium-containing layer 28 and the titanium-containing layer 24 not under the metal layer 34 are subsequently removed with a dry etching method or a wet etching method. As to the wet etching methods, when the titanium-containing layer 28 is a titanium-tungsten-alloy layer, it can be etched with a solution containing hydrogen peroxide; when the titanium-containing layer 28 is a titanium layer, it can be etched with a solution containing hydrogen fluoride; when the seed layer 30 is a gold layer, it can be etched with an iodine-containing solution, such as solution containing potassium iodide; when the titanium-containing layer 24 is a titanium-tungsten-alloy layer, it can be etched with a solution containing hydrogen peroxide. As to the dry etching methods, when the titanium-containing layer 28 is a titanium layer or a titanium-tungsten-alloy layer, it can be etched with an RIE process or with a chlorine-containing plasma etching process; when the seed layer 30 is a gold layer, it can be removed with an ion milling process or with an Ar sputtering etching process; when the titanium-containing layer 24 is a titanium-tungsten-alloy layer or a titanium-nitride layer, it can be etched with an RIE process. Generally, the dry etching method to etch the seed layer 30 and the titanium-containing layer 28 not under the metal layer 34 may include a chemical plasma etching process, a sputtering etching process, such as argon sputter process, or a chemical vapor etching process.

Thereby, in this embodiment, a metal trace 56 can be formed on the polymer layer 22 and on the pad 16 exposed by the opening 22a for the scheme shown in FIG. 1A. Alternatively, referring to FIG. 4K, the metal trace 56 can be formed on the polymer layer 22 and on the metal cap 18 exposed by an opening in the polymer layer 22 for the scheme shown in FIG. 1B. The metal trace 56 can be formed of the titanium-containing layer or tantalum-containing layer 24, the titanium-containing layer 28 on the titanium-containing layer or tantalum-containing layer 24, the seed layer 30 on the titanium-containing layer 28 and the electroplated metal layer 34 on the seed layer 30.

For example, the metal trace 56 may be formed of a first titanium-tungsten-alloy layer 24 having a thickness of between 0.005 and 1 μm, and preferably between 0.01 and 0.7 μm, with nitrogen at a surface layer thereof having a thickness of between 5 and 500 angstroms, a second titanium-tungsten-alloy layer 28 having a thickness of between 0.02 and 0.5 microns on the first titanium-tungsten-alloy layer 24, a seed layer 30 made of sputtered gold having a thickness of between 0.05 and 0.3 microns on the second titanium-tungsten-alloy layer 28, and an gold layer 34 having a thickness of between 1 and 25 microns, and preferably between 3 and 25 μm, on the seed layer 30.

Alternatively, the metal trace 56 may be formed of a titanium-tungsten-alloy layer 24 having a thickness of between 0.005 and 1 μm, and preferably between 0.01 and 0.7 μm, with nitrogen at a surface layer thereof having a thickness of between 5 and 500 angstroms, a titanium layer 28 having a thickness of between 0.02 and 0.5 microns on the titanium-tungsten-alloy layer 24, a seed layer 30 made of sputtered gold having a thickness of between 0.05 and 0.3 microns on the titanium layer 28, and an electroplated gold layer 34 having a thickness of between 1 and 25 microns, and preferably between 3 and 25 μm, on the seed layer 30.

Alternatively, the metal trace 56 may be formed of a titanium-nitride layer 24 having a thickness of between 0.005 and 1 μm, and preferably between 0.01 and 0.7 μm, a titanium-tungsten-alloy layer 28 having a thickness of between 0.02 and 0.5 microns on the titanium-nitride layer 24, a seed layer 30 made of sputtered gold having a thickness of between 0.05 and 0.3 microns on the titanium-tungsten-alloy layer 28, and an electroplated gold layer 34 having a thickness of between 1 and 25 microns, and preferably between 3 and 25 μm, on the seed layer 30.

Alternatively, the metal trace 56 may be formed of a titanium-nitride layer 24 having a thickness of between 0.005 and 1 µm, and preferably between 0.01 and 0.7 µm, a titanium layer 28 having a thickness of between 0.02 and 0.5 microns on the titanium-nitride layer 24, a seed layer 30 made of sputtered gold having a thickness of between 0.05 and 0.3 microns on the titanium layer 28, and an electroplated gold layer 34 having a thickness of between 1 and 25 microns, and preferably between 3 and 25 µm, on the seed layer 30.

Alternatively, the metal trace 56 may be formed of a titanium layer 24 having a thickness of between 0.005 and 1 µm, and preferably between 0.01 and 0.7 µm, with nitrogen at a surface layer thereof having a thickness of between 5 and 500 angstroms, a titanium-tungsten-alloy layer 28 having a thickness of between 0.02 and 0.5 microns on the titanium layer 24, a seed layer 30 made of sputtered gold having a thickness of between 0.05 and 0.3 microns on the second titanium-tungsten-alloy layer 28, and an electroplated gold layer 34 having a thickness of between 1 and 25 microns, and preferably between 3 and 25 µm, on the seed layer 30.

Alternatively, the metal trace 56 may be formed of a first titanium layer 24 having a thickness of between 0.005 and 1 µm, and preferably between 0.01 and 0.7 µm, with nitrogen at a surface layer thereof having a thickness of between 5 and 500 angstroms, a second titanium layer 28 having a thickness of between 0.02 and 0.5 microns on the first titanium layer 24, a seed layer 30 made of sputtered gold having a thickness of between 0.05 and 0.3 microns on the second titanium layer 28, and an electroplated gold layer 34 having a thickness of between 1 and 25 microns, and preferably between 3 and 25 µm, on the seed layer 30.

Alternatively, the metal trace 56 may be formed of a tantalum-nitride layer 24 having a thickness of between 0.005 and 1 µm, and preferably between 0.01 and 0.7 µm, a titanium-tungsten-alloy layer 28 having a thickness of between 0.02 and 0.5 microns on the tantalum-nitride layer 24, a seed layer 30 made of sputtered gold having a thickness of between 0.05 and 0.3 microns on the titanium-tungsten-alloy layer 28, and an electroplated gold layer 34 having a thickness of between 1 and 25 microns, and preferably between 3 and 25 µm, on the seed layer 30.

Alternatively, the metal trace 56 may be formed of a tantalum-nitride layer 24 having a thickness of between 0.005 and 1 µm, and preferably between 0.01 and 0.7 µm, a titanium layer 28 having a thickness of between 0.02 and 0.5 microns on the tantalum-nitride layer 24, a seed layer 30 made of sputtered gold having a thickness of between 0.05 and 0.3 microns on the titanium layer 28, and an electroplated gold layer 34 having a thickness of between 1 and 25 microns, and preferably between 3 and 25 µm, on the seed layer 30.

Alternatively, the metal trace 56 may be formed of a tantalum layer 24 having a thickness of between 0.1 and 0.5 microns with nitrogen at a surface layer thereof having a thickness of between 5 and 500 angstroms, a titanium-tungsten-alloy layer 28 having a thickness of between 0.1 and 0.5 microns on the tantalum layer 24, a seed layer 30 made of sputtered gold having a thickness of between 0.05 and 0.3 microns on the second titanium-tungsten-alloy layer 28, and an electroplated gold layer 34 having a thickness of between 1 and 15 microns on the seed layer 30.

Alternatively, the metal trace 56 may be formed of a tantalum layer 24 having a thickness of between 0.1 and 0.5 microns with nitrogen at a surface layer thereof having a thickness of between 5 and 500 angstroms, a titanium layer 28 having a thickness of between 0.1 and 0.5 microns on the tantalum layer 24, a seed layer 30 made of sputtered gold having a thickness of between 0.05 and 0.3 microns on the titanium layer 28, and an electroplated gold layer 34 having a thickness of between 1 and 15 microns on the seed layer 30.

Alternatively, the metal trace 56 may be formed of a first titanium-tungsten-alloy layer 24 having a thickness of between 0.1 and 0.5 microns with nitrogen at a surface layer thereof having a thickness of between 5 and 500 angstroms, a second titanium-tungsten-alloy layer 28 having a thickness of between 0.1 and 0.5 microns on the first titanium-tungsten-alloy layer 24, a seed layer 30 made of sputtered copper having a thickness of between 0.05 and 0.5 microns on the second titanium-tungsten-alloy layer 28, an electroplated copper layer having a thickness of between 1 and 15 microns on the seed layer 30, an electroplated nickel layer having a thickness of between 0.5 and 5 microns on the electroplated copper layer, and an electroplated gold layer having a thickness of between 0.05 and 2 microns on the electroplated nickel layer.

Alternatively, the metal trace 56 may be formed of a titanium-tungsten-alloy layer 24 having a thickness of between 0.1 and 0.5 microns with nitrogen at a surface layer thereof having a thickness of between 5 and 500 angstroms, a titanium layer 28 having a thickness of between 0.1 and 0.5 microns on the titanium-tungsten-alloy layer 24, a seed layer 30 made of sputtered copper having a thickness of between 0.05 and 0.5 microns on the titanium layer 28, an electroplated copper layer having a thickness of between 1 and 15 microns on the seed layer 30, an electroplated nickel layer having a thickness of between 0.5 and 5 microns on the electroplated copper layer, and an electroplated gold layer having a thickness of between 0.05 and 2 microns on the electroplated nickel layer.

Alternatively, the metal trace 56 may be formed of a titanium-nitride layer 24 having a thickness of between 0.05 and 0.3 microns, a titanium-tungsten-alloy layer 28 having a thickness of between 0.1 and 0.5 microns on the titanium-nitride layer 24, a seed layer 30 made of sputtered copper having a thickness of between 0.05 and 0.5 microns on the titanium -tungsten-alloy layer 28, an electroplated copper layer having a thickness of between 1 and 15 microns on the seed layer 30, an electroplated nickel layer having a thickness of between 0.5 and 5 microns on the electroplated copper layer, and an electroplated gold layer having a thickness of between 0.05 and 2 microns on the electroplated nickel layer.

Alternatively, the metal trace 56 may be formed of a titanium-nitride layer 24 having a thickness of between 0.05 and 0.3 microns, a titanium layer 28 having a thickness of between 0.1 and 0.5 microns on the titanium-nitride layer 24, a seed layer 30 made of sputtered copper having a thickness of between 0.05 and 0.5 microns on the titanium layer 28, an electroplated copper layer having a thickness of between 1 and 15 microns on the seed layer 30, an electroplated nickel layer having a thickness of between 0.5 and 5 microns on the electroplated copper layer, and an electroplated gold layer having a thickness of between 0.05 and 2 microns on the electroplated nickel layer.

Alternatively, the metal trace 56 may be formed of a titanium layer 24 having a thickness of between 0.1 and 0.5 microns with nitrogen at a surface layer thereof having a thickness of between 5 and 500 angstroms, a titanium-tungsten-alloy layer 28 having a thickness of between 0.1 and 0.5 microns on the titanium layer 24, a seed layer 30 made of sputtered copper having a thickness of between 0.05 and 0.5 microns on the titanium-tungsten-alloy layer 28, an electroplated copper layer having a thickness of between 1 and 15 microns on the seed layer 30, an electroplated nickel layer having a thickness of between 0.5 and 5 microns on the electroplated copper layer, and an electroplated gold layer having a thickness of between 0.05 and 2 microns on the electroplated nickel layer.

Alternatively, the metal trace 56 may be formed of a first titanium layer 24 having a thickness of between 0.1 and 0.5 microns with nitrogen at a surface layer thereof having a thickness of between 5 and 500 angstroms, a second titanium layer 28 having a thickness of between 0.1 and 0.5 microns on the first titanium layer 24, a seed layer 30 made of sputtered copper having a thickness of between 0.05 and 0.5 microns on the second titanium layer 28, an electroplated copper layer having a thickness of between 1 and 15 microns on the seed layer 30, an electroplated nickel layer having a thickness of between 0.5 and 5 microns on the electroplated copper layer, and an electroplated gold layer having a thickness of between 0.05 and 2 microns on the electroplated nickel layer.

Alternatively, the metal trace 56 may be formed of a tantalum-nitride layer 24 having a thickness of between 0.05 and 0.3 microns, a titanium-tungsten-alloy layer 28 having a thickness of between 0.1 and 0.5 microns on the tantalum-nitride layer 24, a seed layer 30 made of sputtered copper having a thickness of between 0.05 and 0.5 microns on the titanium -tungsten-alloy layer 28, an electroplated copper layer having a thickness of between 1 and 15 microns on the seed layer 30, an electroplated nickel layer having a thickness of between 0.5 and 5 microns on the electroplated copper layer, and an electroplated gold layer having a thickness of between 0.05 and 2 microns on the electroplated nickel layer.

Alternatively, the metal trace 56 may be formed of a tantalum-nitride layer 24 having a thickness of between 0.05 and 0.3 microns, a titanium layer 28 having a thickness of between 0.1 and 0.5 microns on the tantalum-nitride layer 24, a seed layer 30 made of sputtered copper having a thickness of between 0.05 and 0.5 microns on the titanium layer 28, an electroplated copper layer having a thickness of between 1 and 15 microns on the seed layer 30, an electroplated nickel layer having a thickness of between 0.5 and 5 microns on the electroplated copper layer, and an electroplated gold layer having a thickness of between 0.05 and 2 microns on the electroplated nickel layer.

Alternatively, the metal trace 56 may be formed of a tantalum layer 24 having a thickness of between 0.1 and 0.5 microns with nitrogen at a surface layer thereof having a thickness of between 5 and 500 angstroms, a titanium-tungsten-alloy layer 28 having a thickness of between 0.1 and 0.5 microns on the tantalum layer 24, a seed layer 30 made of sputtered copper having a thickness of between 0.05 and 0.5 microns on the titanium-tungsten-alloy layer 28, an electroplated copper layer having a thickness of between 1 and 15 microns on the seed layer 30, an electroplated nickel layer having a thickness of between 0.5 and 5 microns on the electroplated copper layer, and an electroplated gold layer having a thickness of between 0.05 and 2 microns on the electroplated nickel layer.

Alternatively, the metal trace 56 may be formed of a tantalum layer 24 having a thickness of between 0.1 and 0.5 microns with nitrogen at a surface layer thereof having a thickness of between 5 and 500 angstroms, a titanium layer 28 having a thickness of between 0.1 and 0.5 microns on the tantalum layer 24, a seed layer 30 made of sputtered copper having a thickness of between 0.05 and 0.5 microns on the titanium layer 28, an electroplated copper layer having a thickness of between 1 and 15 microns on the seed layer 30, an electroplated nickel layer having a thickness of between 0.5 and 5 microns on the electroplated copper layer, and an electroplated gold layer having a thickness of between 0.05 and 2 microns on the electroplated nickel layer.

Figure 4H:
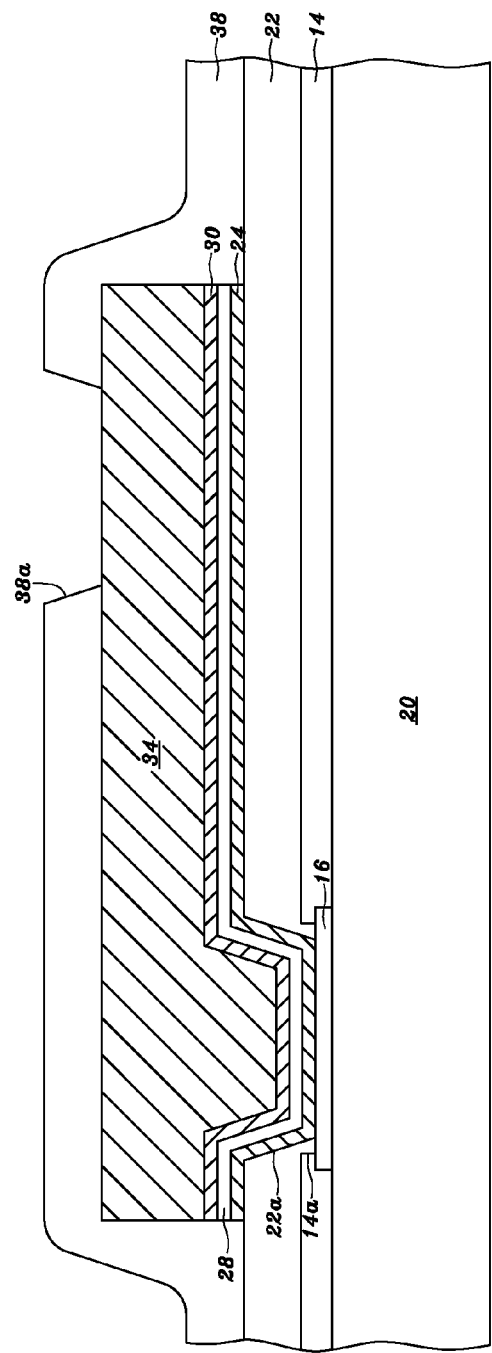

Referring to FIG. 4H, after the seed layer 30, the titanium-containing layer 28 and the titanium-containing layer 24 not under the metal layer 34 are removed, a polymer layer 38 can be optionally formed on the metal layer 34 of the metal trace 56 and on the polymer layer 22, at least one opening 38a in the polymer layer 38 exposing the metal layer 34 of the metal trace 56. The material of the polymer layer 38 may include polyimide, benzocyclobutane, polyurethane, a parylene-based polymer, a solder-mask material, epoxy resin, an elastomer, or a porous dielectric material. The polymer layer 38 has a thickness of between 3 and 26 μm or between 3 and 25 μm.

The polymer layer 38 can be formed by a spin-on coating process, a lamination process or a screen-printing process. Below, the process of forming a patterned polymer layer 38 is exemplified with the case of spin-on coating a polyimide layer on the polymer layer 22 and on the metal layer 34, and then patterning the polyimide layer. Alternatively, the polymer layer 38 can be formed by spin-on coating a layer of benzocyclobutane, polyurethane, a parylene-based polymer, a solder -mask material, an elastomer, epoxy resin or a porous dielectric material, and then patterning the layer.

For example, the polymer layer 38 can be formed by spin-on coating a positive-type photosensitive polyimide layer having a thickness of between 3 and 50 μm, and preferably of between 6 and 24 μm, on the polymer layer 22 and on the metal layer 34, then baking the spin-on coated polyimide layer, then exposing the baked polyimide layer using a 1× stepper or 1× contact aligner with at least two of G-line having a wavelength ranging from 434 to 438 nm, H-line having a wavelength ranging from 403 to 407 nm, and I-line having a wavelength ranging from 363 to 367 nm, illuminating the baked polyimide layer, that is, G-line and H-line, G-line and I-line, H-line and I-line, or G-line, H-line and I-line illuminate the baked polyimide layer, then developing the exposed polyimide layer, an opening in the developed polyimide layer exposing the metal layer 34, then curing or heating the developed polyimide layer at a peak temperature of between 250 and 400° C. for a time of between 10 and 200 minutes in a nitrogen ambient or in an oxygen-free ambient, the cured polyimide layer having a thickness of between 3 and 26 μm, and preferably between 3 and 12 μm, and then removing the residual polymeric material or other contaminants on the upper surface of the metal layer 34 exposed by the opening in the cured polyimide layer with an $O_2$ plasma or a plasma containing fluorine of below 200 PPM and oxygen, such that the polyimide layer can be patterned with at least one opening in the polyimide layer exposing the metal layer 34 of metal trace 56.

Besides, from a top perspective view, the position of the metal layer 34 of the metal trace 56 exposed by the opening 38a may be different from that of the pad 16 the metal trace 56 is connected to.

So far, a semiconductor wafer is formed by the above-mentioned steps. Next, the semiconductor wafer can be diced into a plurality of individual IC chips, semiconductor chips. Referring to FIG. 4I, when one of the IC chips is being packaged, one end of a wire 40 (made of gold or copper) can be ball bonded on the metal layer 34 of an IC chip by a wire-bonding process. The other end of the wire 40 can be wedge bonded with an aluminum layer provided by a pad of another IC chip, a pad over another semiconductor substrate, or a pad over a silicon substrate. Alternatively, the other end of the wire 40 can be wedge bonded with a gold layer provided by a pad of another IC chip, a pad over another semiconductor substrate, a pad over an organic substrate, a pad over a ceramic substrate, a pad over a silicon substrate, a pad over a glass substrate, or a pad over a flexible film comprising a polymer layer with a thickness of between 30 and 200 μm. Alternatively, the other end of the wire 40 can be wedge bonded with a copper layer provided by a pad of another IC chip, a pad over another semiconductor substrate, a pad over an organic substrate, a pad over a ceramic substrate, a pad over a silicon substrate, a pad over a glass substrate, or a pad over a flexible film comprising a polymer layer with a thickness of between 30 and 200 µm. Alternatively, the other end of the wire 40 can be wedge bonded with an inner lead (made of copper) of a lead frame.

In the present invention, the strength of bonding the wire 40 to the metal layer 34 of the metal trace 56 exposed by the opening 38a may ranges from 100 to 1000 mN, from 200 to 1000 mN, or from 200 to 500 mN. After the wire-bonding process shown in FIG. 4I is completed, a polymeric material, such as epoxy or polyimide, can be formed to cover the wire 40.

Alternatively, after the step shown in FIG. 4H have been completed, a tin-containing layer or bump having a thickness of between 1 and 500 µm, and preferably between 3 and 250 µm can be formed over the metal layer 34 of the metal trace 56 exposed by the opening 38a. So far, the process for forming a semiconductor wafer is completed. Next, the semiconductor wafer can be diced into a plurality of individual IC chips. The tin-containing layer or bump may be formed by an electroplating method, an electroless plating method or a screen printing process. The tin -containing layer or bump is, for example, a tin-lead alloy, a tin-silver alloy, a tin-silver-copper alloy, a lead-free alloy. Using a tin-lead solder for illustration, the weight ratio of tin to lead can be adjusted accordingly. Atypical weight ratio of lead to tin is 90/10, 95/5, 97/3 or 37/63, etc.

Alternatively, referring to FIG. 4H, a metal bump having a titanium-containing layer with a thickness of between 0.1 and 0.7 microns on the pad exposed by the opening 38a, a copper layer with a thickness of between 1 and 10 microns on the titanium-containing layer, a nickel layer with a thickness of between 0.5 and 5 microns on the copper layer, and a tin-containing layer with a thickness of between 10 and 300 microns on the nickel layer may be formed on the pad exposed by the opening 38a, followed by dicing the semiconductor wafer into multiple semiconductor chips. The semiconductor chip may be bonded to a BGA substrate through the metal bump.

Alternatively, referring to FIG. 4H, a metal bump having a titanium-containing layer with a thickness of between 0.1 and 0.7 microns on the pad exposed by the opening 28a, and a gold layer with a thickness of between 5 and 25 microns on the titanium-containing layer may be formed on the pad exposed by the opening 38a, followed by dicing the semiconductor wafer into multiple semiconductor chips. The metal bump may connect the semiconductor chip to a glass substrate via ACF or ACP. Besides, the metal bump may connect the semiconductor chip to a printed circuit board via tape automated bonding (TAB). Besides, the metal bump may connect the semiconductor chip to a flexible substrate without glass fiber.

Referring to FIG. 4J, in this embodiment, the step of forming the polymer layer 22 on the passivation layer 14, as shown in FIGS. 2A and 2B or in FIGS. 2A and 2C, can be omitted, that is, the titanium-containing layer 24 having a thickness of between 0.005 and 1 µm, and preferably between 0.01 and 0.7 µm can be directly formed on the passivation layer 14 and on the pad 16 exposed by the opening 14a, followed by the above-mentioned steps as shown in FIG. 2D and FIGS. 4A-4H, followed by the above-mentioned step as shown in FIG. 4I or followed by forming the tin -containing layer or the above-mentioned metal bump over the metal trace 36 exposed by the opening 38a.

Alternatively, the above-mentioned process can be applied to a wafer including multiple pads principally made of electroplated copper, and a passivation layer including a first silicon -nitride layer having a thickness of 0.2 and 1 µm, an silicon-oxide layer having a thickness of between 0.2 and 1 µm, on the first silicon-nitride layer, and a second silicon-nitride layer having a thickness of between 0.2 and 1 µm on the silicon-oxide layer, multiple openings in the passivation layer exposing the pads principally made of electroplated copper. That is, the above mentioned polymer layer 22 can be formed on the second silicon-nitride layer of the passivation layer, the opening 22a in the polymer layer 22 exposing the electroplated copper of the pad and optionally exposing the second silicon-nitride layer of the passivation layer surrounding the openings in the passivation layer, which can be referred to the above description concerning FIGS. 2A-2C, followed by forming the above-mentioned titanium-containing layer or tantalum-containing layer 24 on the polymer layer 22 and on the pads principally made of electroplated copper, as referred to in FIG. 2D, followed by the steps as referred to in FIGS. 4A-4H, followed by the above-mentioned step as shown in FIG. 4I or followed by forming the tin-containing layer or the above-mentioned metal bump over the metal trace 56 exposed by the opening 38a. Besides, the polymer layer 22 can be omitted. That is, the above-mentioned titanium-containing layer or tantalum-containing layer 24 can be formed directly on the second silicon-nitride layer of the passivation layer and on the pads principally made of electropled copper, as referred to in FIG. 2D, followed by the steps as referred to in FIGS. 4A -4H, followed by the above-mentioned step as shown in FIG. 4I or followed by forming the tin -containing layer or the above-mentioned metal bump over the metal trace 56 exposed by the opening 38a.

Figure 4K:
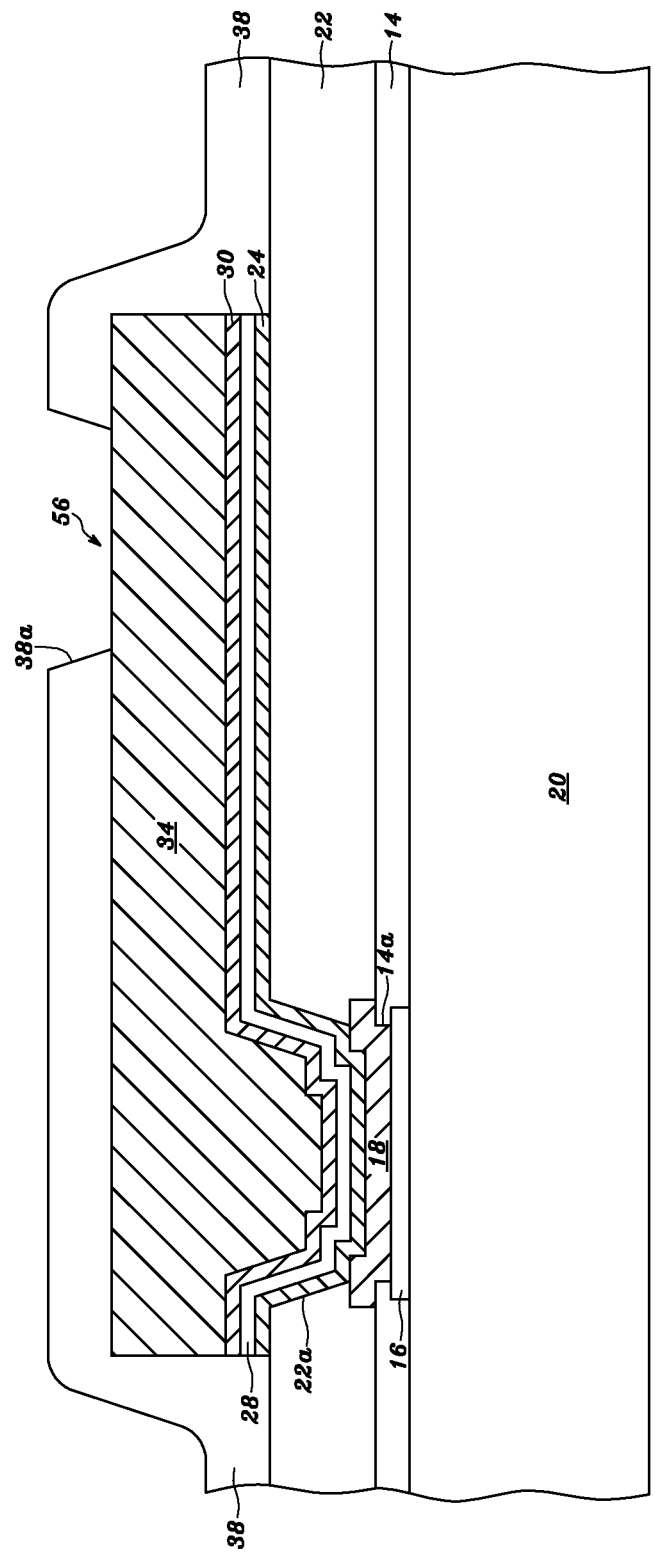

Alternatively, referring to FIG. 4K, the above-mentioned process can be applied to a wafer including multiple pads principally made of electroplated copper, a passivation layer including a first silicon-nitride layer having a thickness of 0.2 and 1 µm, an silicon-oxide layer having a thickness of between 0.2 and 1 µm, on the first silicon-nitride layer, and a second silicon-nitride layer having a thickness of between 0.2 and 1 µm on the silicon-oxide layer, multiple openings in the passivation layer exposing the pads principally made of electroplated copper, and multiple metal caps 18 including a tantalum-containing layer, such as pure tantalum or tantalum nitride, having a thickness of between 0.01 and 0.6 µm, on the pads principally made of electroplated copper, exposed by the openings in the passivation layer, and an aluminum-containing layer having a thickness of between 0.5 and 3 µm on the tantalum-containing layer. That is, the above mentioned polymer layer 22 can be formed on the second silicon-nitride layer of the passivation layer, the opening 22a in the polymer layer 22 exposing the metal cap 18, which can be referred to the above description concerning FIGS. 2A-2C, followed by forming the above-mentioned titanium-containing layer or tantalum-containing layer 24 on the polymer layer 22 and on the metal cap 18 exposed by the opening 22a, as referred to in FIG. 2D, followed by the steps as referred to in FIGS. 4A-4H, followed by the above-mentioned step as shown in FIG. 4I or followed by forming the tin -containing layer or the above-mentioned metal bump over the metal trace 56 exposed by the opening 38a. Besides, the polymer layer 22 can be omitted. That is, the above-mentioned titanium-containing layer or tantalum-containing layer 24 can be formed directly on the second silicon-nitride layer of the passivation layer and on the metal cap 18, as referred to in FIG. 2D, followed by the steps as referred to in FIGS. 4A-4H, followed by the above-mentioned step as shown in FIG. 4I or followed by forming the tin-containing layer or the above-mentioned metal bump over the metal trace 56 exposed by the opening 38a.

Embodiment 4

FIGS. 5A through 5J are cross-sectional views showing a process according to one embodiment of the present invention. In this embodiment, the pad 16 is an aluminum-containing layer, and the opening 14a in the passivation layer 14 exposes the aluminum-containing layer.

Figure 5A:
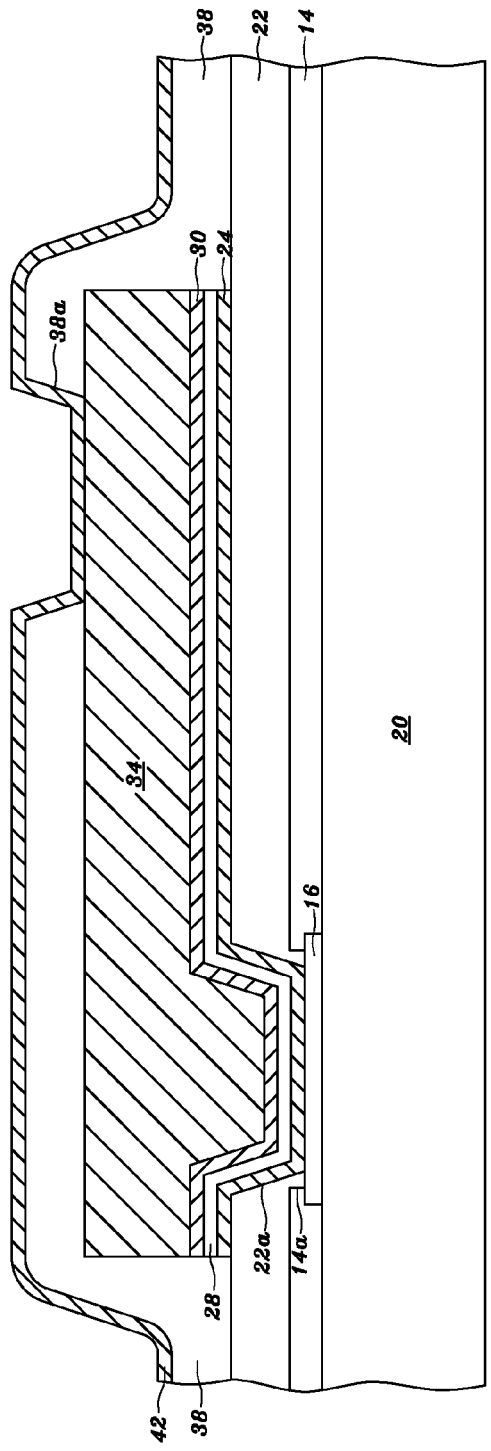
FIGS. 5A through 5K are cross-sectional views showing a process according to one embodiment of the present invention.

Referring to FIG. 5A, after the step shown in FIG. 4H is completed, an adhesion/barrier layer 42 having a thickness of between 0.02 and 0.5 μm can be sputtered on the metal layer 34 of the metal trace 56 exposed by the opening 38a and on the polymer layer 38. The material of the adhesion/barrier layer 42 may include titanium, tungsten, cobalt, nickel, titanium nitride, a titanium-tungsten alloy, a nickel-vanadium alloy, aluminum, chromium, copper, gold, protactinium, platinum, palladium, ruthenium, rhodium, silver, or a composite of the abovementioned materials. Alternatively, the adhesion/barrier layer 42 can be formed by an evaporation process.

For example, the adhesion/barrier layer 42 may be formed by sputtering a titanium-containing layer with a thickness of between 0.02 and 0.5 μm on the polymer layer 38 and on the metal layer 34, made of gold, exposed by the opening 38a. Alternatively, the adhesion/barrier layer 42 may be formed by sputtering a titanium layer with a thickness of between 0.02 and 0.5 μm on the polymer layer 38 and on the metal layer 34, made of gold, exposed by the opening 38a. Alternatively, the adhesion/barrier layer 42 may be formed by sputtering a titanium-tungsten -alloy layer with a thickness of between 0.02 and 0.5 μm on the polymer layer 38 and on the metal layer 34, made of gold, exposed by the opening 38a.

Figure 5B:
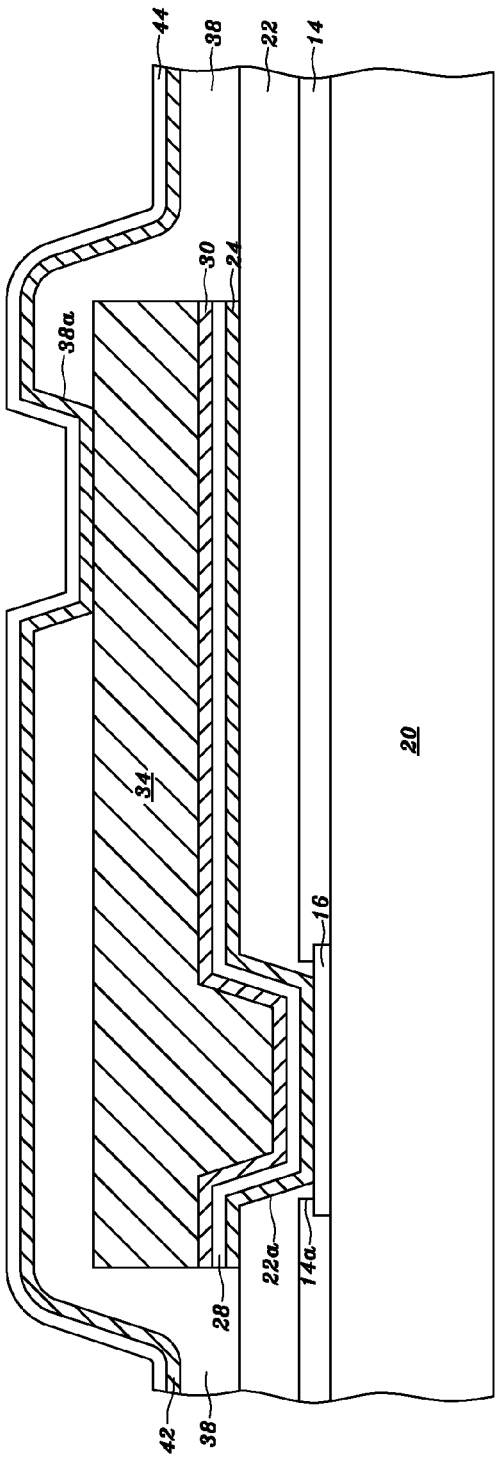

Referring to FIG. 5B, a seed layer 44 having a thickness of 0.05 and 0.3 μm can be sputtered on the adhesion/barrier layer 42. Alternatively, the seed layer 44 can be formed by a vapor deposition method, an electroless plating method or a PVD (Physical Vapor Deposition) method. The seed layer 44 is beneficial to electroplating a metal layer thereon. Thus, the material of the seed layer 44 varies with the material of the electroplated metal layer formed on the seed layer 44. When a gold layer is to be electroplated on the seed layer 44, gold is a preferable material to the seed layer 44. When a copper layer is to be electroplated on the seed layer 44, copper is a preferable material to the seed layer 44.

For example, when the adhesion/barrier layer 42 is formed by sputtering a titanium-containing layer with a thickness of between 0.02 and 0.5 μm the seed layer 44 can be formed by sputtering a gold layer with a thickness of between 0.05 and 0.3 μm on the titanium-containing layer. When the adhesion/barrier layer 42 is formed by sputtering a titanium layer with a thickness of between 0.02 and 0.5 μm the seed layer 44 can be formed by sputtering a gold layer with a thickness of between 0.05 and 0.3 μm on the titanium layer. When the adhesion/barrier layer 42 is formed by sputtering a titanium-tungsten-alloy layer with a thickness of between 0.02 and 0.5 μm, the seed layer 44 can be formed by sputtering a gold layer with a thickness of between 0.05 and 0.3 μm on the titanium-tungsten-alloy layer. When the adhesion/barrier layer 42 is formed by sputtering a titanium-containing layer with a thickness of between 0.02 and 0.5 μm the seed layer 44 can be formed by sputtering a copper layer with a thickness of between 0.05 and 0.3 μm on the titanium-containing layer. When the adhesion/barrier layer 42 is formed by sputtering a titanium layer with a thickness of between 0.02 and 0.5 μm the seed layer 44 can be formed by sputtering a copper layer with a thickness of between 0.05 and 0.3 μm on the titanium layer. When the adhesion/barrier layer 42 is formed by sputtering a titanium-tungsten-alloy layer with a thickness of between 0.02 and 0.5 μm the seed layer 44 can be formed by sputtering a copper layer with a thickness of between 0.05 and 0.3 μm on the titanium-tungsten-alloy layer.

Figure 5C:
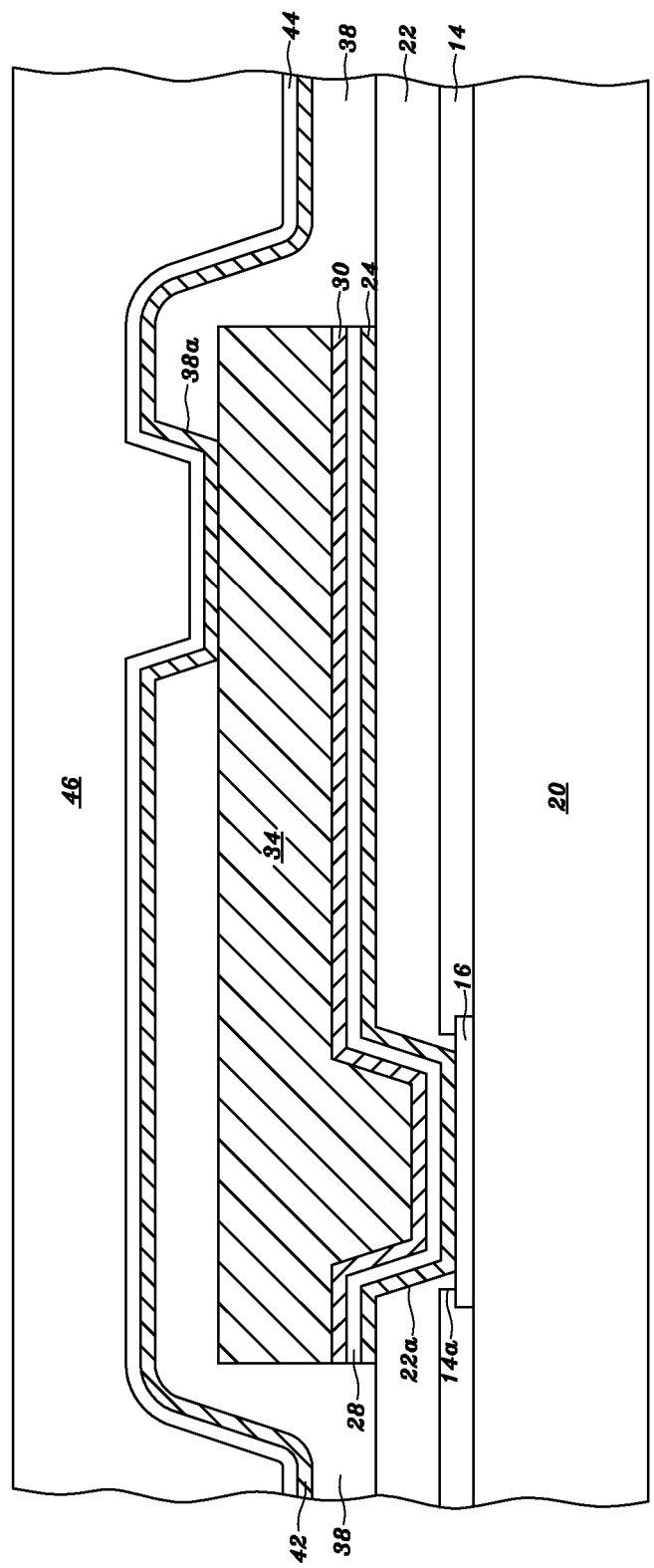
Figure 5D:
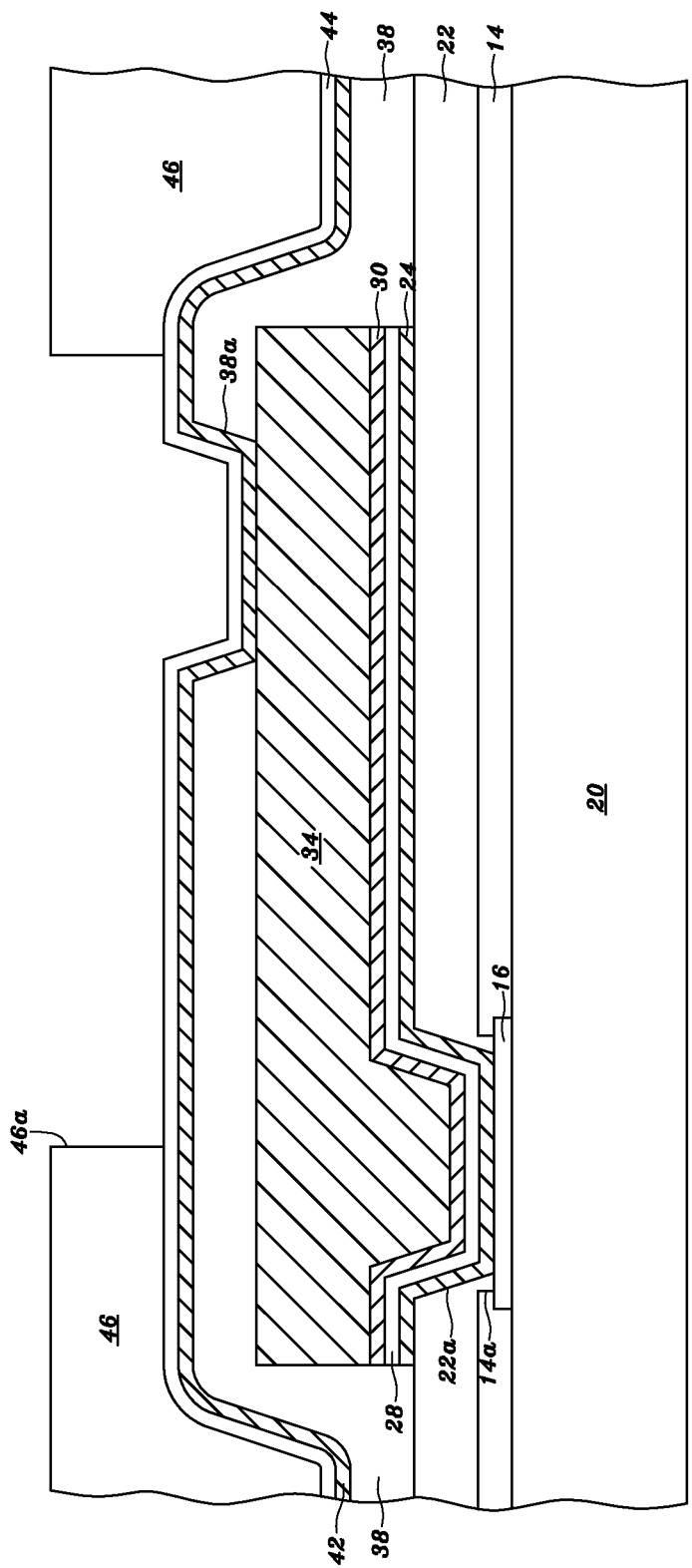

Referring to FIG. 5C, a photoresist layer 46 having a thickness of between 3.5 and 30 μm is formed on the seed layer 44. Referring to FIG. 5D, the photoresist layer 46 is patterned with the processes of exposure, development, etc., to form an opening 46a in the photoresist layer 46 exposing the seed layer 44. A 1× stepper or 1× contact aligner can be used to expose the photoresist layer 46 during the process of exposure.

For example, the photoresist layer 46 can be formed by spin-on coating a positive-type photosensitive polymer layer having a thickness of between 3.5 and 30 μm, and preferably of between 7 and 15 μm on the seed layer 44, then exposing the photosensitive polymer layer using a 1× stepper or 1× contact aligner with at least two of G-line having a wavelength ranging from 434 to 438 nm, H-line having a wavelength ranging from 403 to 407 nm, and I-line having a wavelength ranging from 363 to 367 nm, illuminating the photosensitive polymer layer, that is, G-line and H-line, G-line and I-line, H-line and I-line, or G-line, H-line and I-line illuminate the photosensitive polymer layer, then developing the exposed polymer layer, an opening in the developed polymer layer exposing the seed layer 44, and then removing the residual polymeric material or other contaminants on the seed layer 44 exposed by the opening in the developed polymer layer, with an $O_2$ plasma or a plasma containing fluorine of below 200 PPM and oxygen, such that the photoresist layer 46 can be patterned with an opening 46a in the photoresist layer 46 exposing the seed layer 44.

Figure 5E:
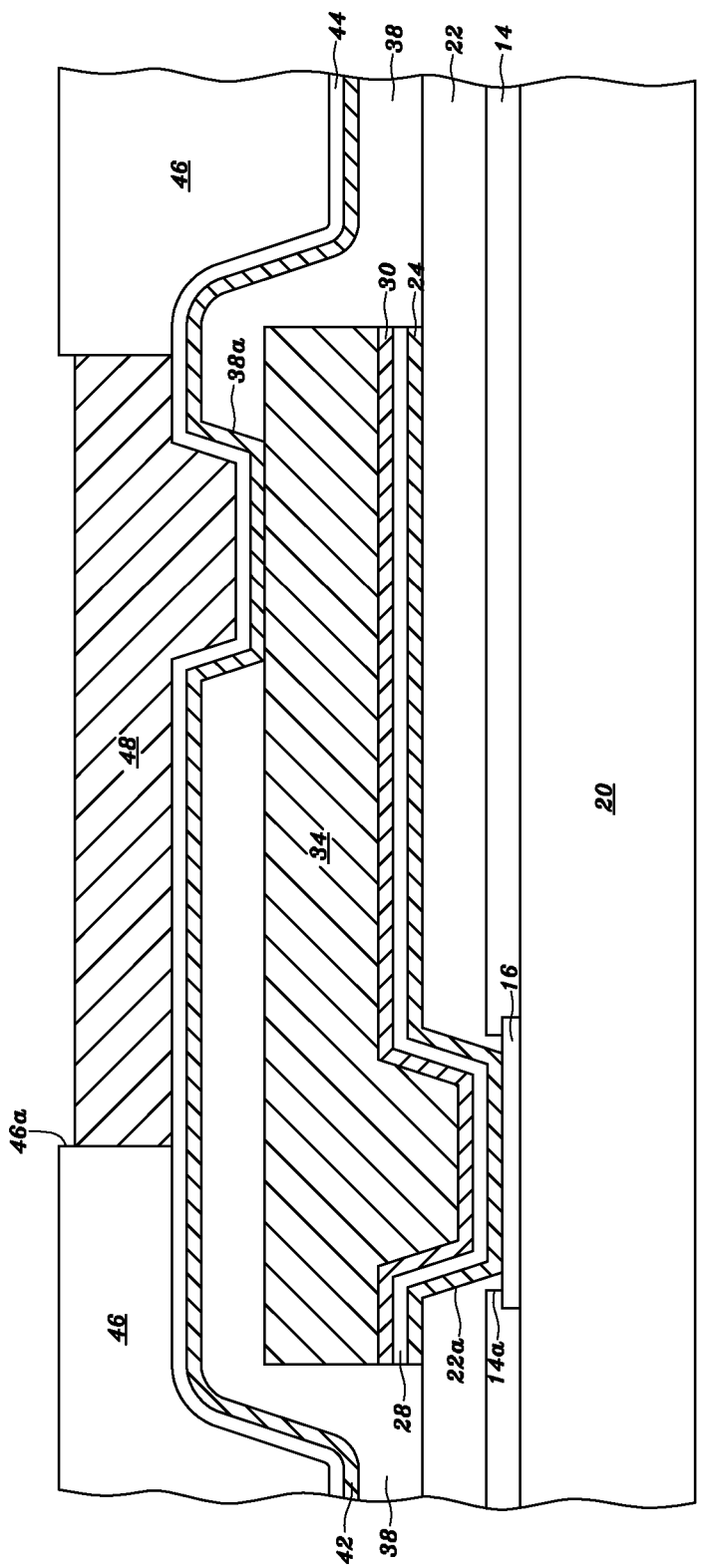

Referring to FIG. 5E, a metal layer 48 having a thickness of between 1 and 25 μm and preferably between 3 and 15 μm, is electroplated on the seed layer 44 exposed by the opening 46a. For example, the metal layer 48 may be formed by electroplating a gold layer having a thickness of between 1 and 25 μm and preferably between 3 and 15 μm on the seed layer 44, made of gold, exposed by the opening 46a with an electroplating solution containing gold of between 1 and 20 grams per litter (g/l), and preferably between 5 and 15 g/l, and sulfite ion of 10 and 120 g/l, and preferably between 30 and 90 g/l. The electroplating solution may further comprise sodium ion, to be turned into a solution of gold sodium sulfite ($Na_3Au(SO_3)_2$), or may further comprise ammonium ion, to be turned into a solution of gold ammonium sulfite ($(NH_4)_3[Au(SO_3)_2]$).

The operational parameters of electroplating the gold layer are described below:

1. The above-mentioned electroplating solution can be at a temperature of between 30 and 70° C., and preferably between 45 and 65° C., to electroplate the gold layer on the seed layer 44 exposed by the opening 46a.
2. The above-mentioned electroplating solution can be used to electroplate the gold layer on the seed layer 44 exposed by the opening 46a through an electric current with a current density at between 1 and 10 $mA/cm^2$, and preferably between 4 and 6 $mA/cm^2$.
3. The above-mentioned electroplating solution may have a pH value of between 6 and 9, and preferably between 7 and 8.5, to electroplate the gold layer on the seed layer 44 exposed by the opening 46a.

Alternatively, the metal layer 48 may be formed by electroplating a gold layer having a thickness of between 1 and 25 μm and preferably between 3 and 15 μm on the seed layer 44, made of gold, exposed by the opening 46a with an electroplating solution containing cyanide.

Alternatively, the metal layer 48 may be formed by electroplating a copper layer having a thickness of between 1 and 20 μm on the seed layer 44, made of copper, exposed by the opening 46a, then electroplating a nickel layer having a thickness of between 0.5 and 5 microns on the copper layer in the opening 46a, and then electroplating a gold layer having a thickness of between 0.01 and 2 microns on the nickel layer in the opening 46a.

Figure 5F:
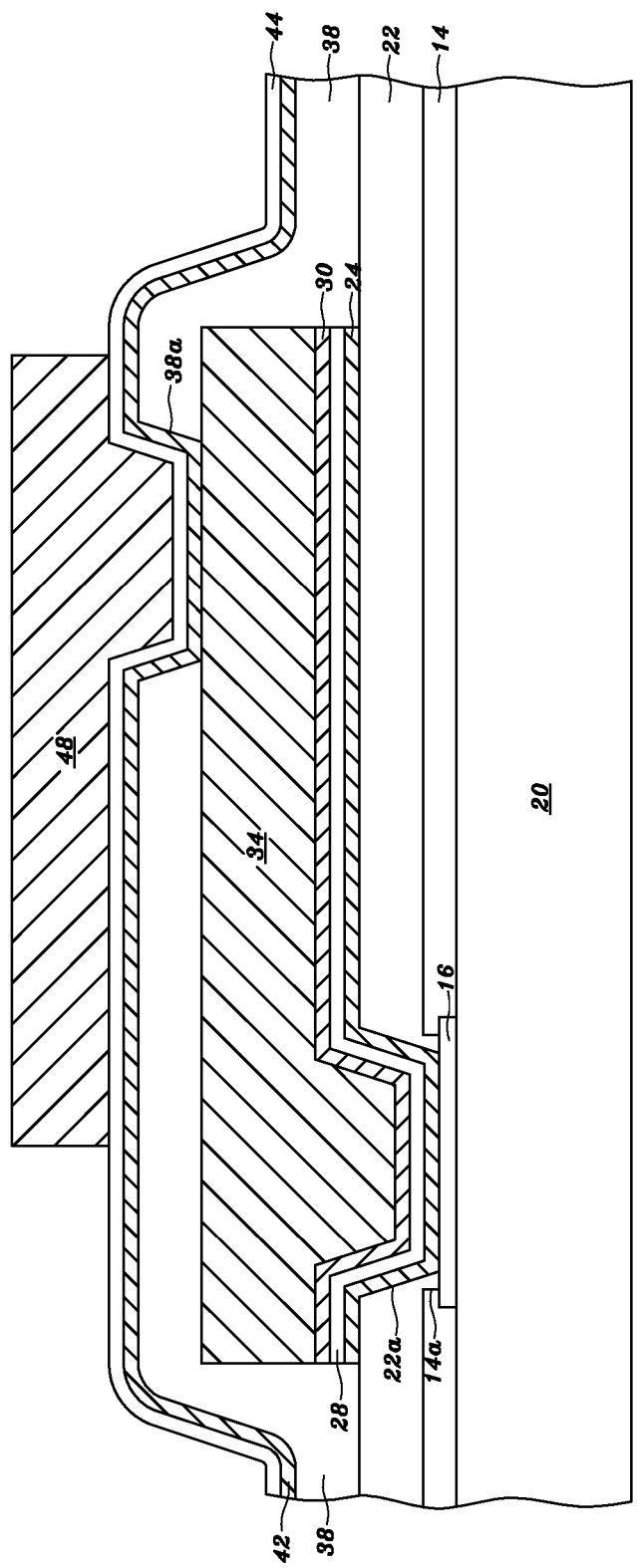

Referring to FIG. 5F, after the metal layer 48 is formed, most of the photoresist layer 46 can be removed using an organic solution with amide. However, some residuals from the photoresist layer 46 could remain on the metal layer 48 and on the seed layer 44. Thereafter, the residuals can be removed from the metal layer 48 and on the seed layer 44 with a plasma, such as an $O_2$ plasma or a plasma containing fluorine of below 200 PPM and oxygen.

Figure 5G:
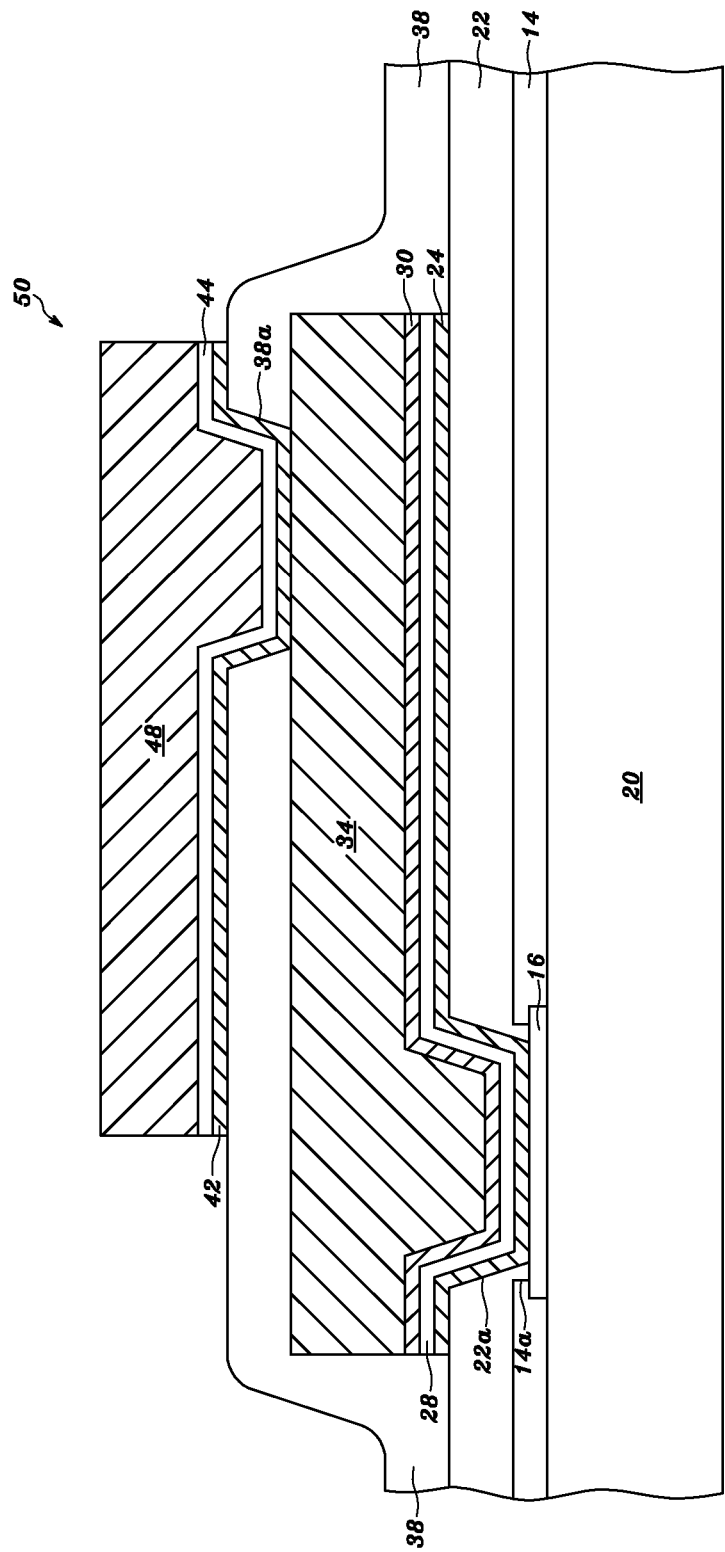

Thereafter, referring to FIG. 5G, the seed layer 44 and the adhesion/barrier layer 42 not under the metal layer 48 are subsequently removed with a dry etching method or a wet etching method. As to the wet etching methods, when the adhesion/barrier layer 42 is a titanium-tungsten-alloy layer, it can be etched with a solution containing hydrogen peroxide; when the adhesion/barrier layer 42 is a titanium layer, it can be etched with a solution containing hydrogen fluoride; when the seed layer 44 is a gold layer, it can be etched with an iodine-containing solution, such as solution containing potassium iodide. As to the dry etching methods, when the adhesion/barrier layer 42 is a titanium layer or a titanium-tungsten-alloy layer, it can be etched with a chlorine-containing plasma etching process or with an RIE process; when the seed layer 44 is a gold layer, it can be removed with an ion milling process or with an Ar sputtering etching process. Generally, the dry etching method to etch the seed layer 44 and the adhesion/barrier layer 42 not under the metal layer 48 may include a chemical plasma etching process, a sputtering etching process, such as argon sputter process, or a chemical vapor etching process.

Thereby, a metal trace 50 can be formed on the polymer layer 38 and on the metal layer 34 exposed by the opening 38a. The metal trace 50 can be formed of the adhesion/barrier layer 42, the seed layer 44 on the adhesion/barrier layer 44 and the electroplated metal layer 48 on the seed layer 44.

For example, the metal trace 50 may be formed of a titanium-tungsten-alloy layer having a thickness of between 0.1 and 0.5 microns, a seed layer 30 made of gold having a thickness of between 0.05 and 0.3 microns on the titanium-tungsten-alloy layer, and an electroplated gold layer having a thickness of between 1 and 25 μm and preferably between 3 and 15 μm, on the seed layer 30 made of gold. Alternatively, the metal trace 50 may be formed of a titanium layer having a thickness of between 0.1 and 0.5 microns, a seed layer 30 made of gold having a thickness of between 0.05 and 0.3 microns on the titanium layer, and an electroplated gold layer having a thickness of between 1 and 25 μm and preferably between 3 and 15 μm on the seed layer 30 made of gold. Alternatively, the metal trace 50 may be formed of a titanium-tungsten-alloy layer having a thickness of between 0.1 and 0.5 microns, a seed layer 30 made of copper having a thickness of between 0.05 and 0.5 microns on the titanium-tungsten-alloy layer, an electroplated copper layer having a thickness of between 1 and 20 microns on the seed layer 30 made of copper, an electroplated nickel layer having a thickness of between 0.5 and 5 microns on the electroplated copper layer, and an electroplated gold layer having a thickness of between 0.01 and 2 microns on the electroplated nickel layer. Alternatively, the metal trace 50 may be formed of a titanium layer having a thickness of between 0.1 and 0.5 microns, a seed layer 30 made of copper having a thickness of between 0.05 and 0.5 microns on the titanium layer, an electroplated copper layer having a thickness of between 1 and 20 microns on the seed layer 30 made of copper, an electroplated nickel layer having a thickness of between 0.5 and 5 microns on the electroplated copper layer, and an electroplated gold layer having a thickness of between 0.01 and 2 microns on the electroplated nickel layer. Above-mentioned various kinds of the metal traces 50 can be formed over above-mentioned various kinds of the metal traces 56.

Figure 5H:
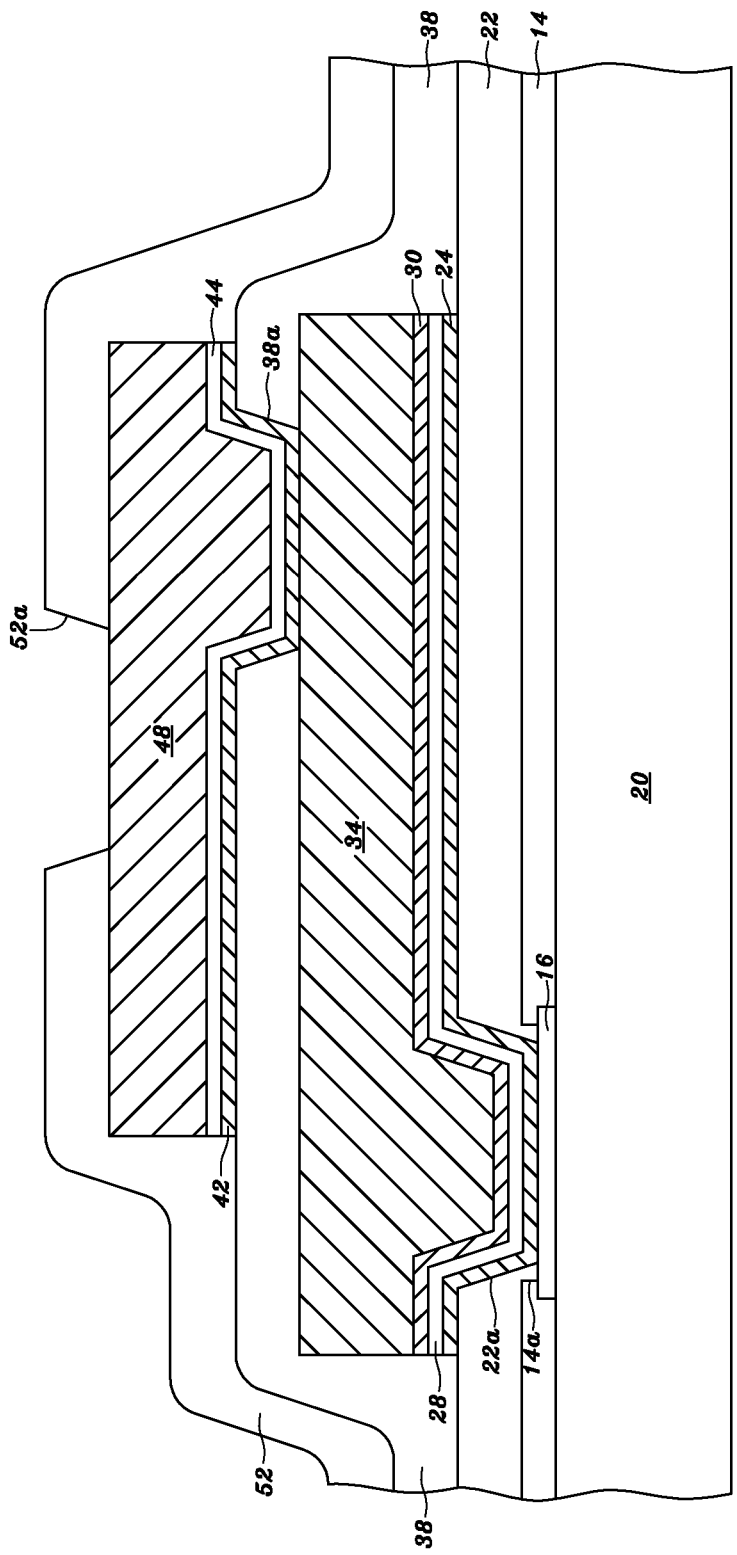

Referring to FIG. 5H, after the seed layer 44 and the adhesion/barrier layer 42 not under the metal layer 48 are removed, a polymer layer 52 can be optionally formed on the metal layer 48 of the metal trace 50 and on the polymer layer 38, and at least one opening 52a can be formed in the polymer layer 52, exposing the metal layer 48 of the metal trace 50. The material of the polymer layer 52 may include polyimide, benzocyclobutane, polyurethane, a parylene-based polymer, a solder-mask material, epoxy resin, an elastomer, or a porous dielectric material. The polymer layer 52 has a thickness of between 3 and 26 μm or between 3 and 25 μm.

The polymer layer 52 can be formed by a spin-on coating process, a lamination process or a screen-printing process. Below, the process of forming a patterned polymer layer 52 is exemplified with the case of spin-on coating a polyimide layer on the polymer layer 38 and on the metal layer 48 of the metal trace 50, and then patterning the polyimide layer. Alternatively, the polymer layer 52 can be formed by spin-on coating a layer of benzocyclobutane, polyurethane, a parylene-based polymer, a solder-mask material, epoxy resin, an elastomer or a porous dielectric material, and then patterning the layer.

For example, the polymer layer 52 can be formed by spin-on coating a positive-type photosensitive polyimide layer having a thickness of between 6 and 52 μm, and preferably of between 6 and 24 μm, on the polymer layer 38 and on the metal layer 48, then baking the spin-on coated polyimide layer, then exposing the baked polyimide layer using a 1× stepper or 1× contact aligner with at least two of G-line having a wavelength ranging from 434 to 438 nm, H-line having a wavelength ranging from 403 to 407 nm, and I-line having a wavelength ranging from 363 to 367 nm, illuminating the baked polyimide layer, that is, G-line and H-line, G-line and I-line, H-line and I-line, or G-line, H-line and I-line illuminate the baked polyimide layer, then developing the exposed polyimide layer, an opening in the developed polyimide layer exposing the metal layer 48, then curing or heating the developed polyimide layer at a peak temperature of between 250 and 400° C. for a time of between 10 and 200 minutes in a nitrogen ambient or in an oxygen-free ambient, the cured polyimide layer having a thickness of between 3 and 26 μm and preferably between 3 and 12 μm, and then removing the residual polymeric material or other contaminants on the upper surface of the metal layer 48 exposed by the opening in the cured polyimide layer with an $O_2$ plasma or a plasma containing fluorine of below 200 PPM and oxygen, such that the polyimide layer can be patterned with at least one opening in the polyimide layer exposing the metal layer 48 of metal trace 50.

Besides, from a top perspective view, the position of the metal layer 48 of the metal trace 50 exposed by the opening 52a may be different from that of the metal layer 34 of the metal trace 36 exposed by the opening 38a.

Figure 5I:
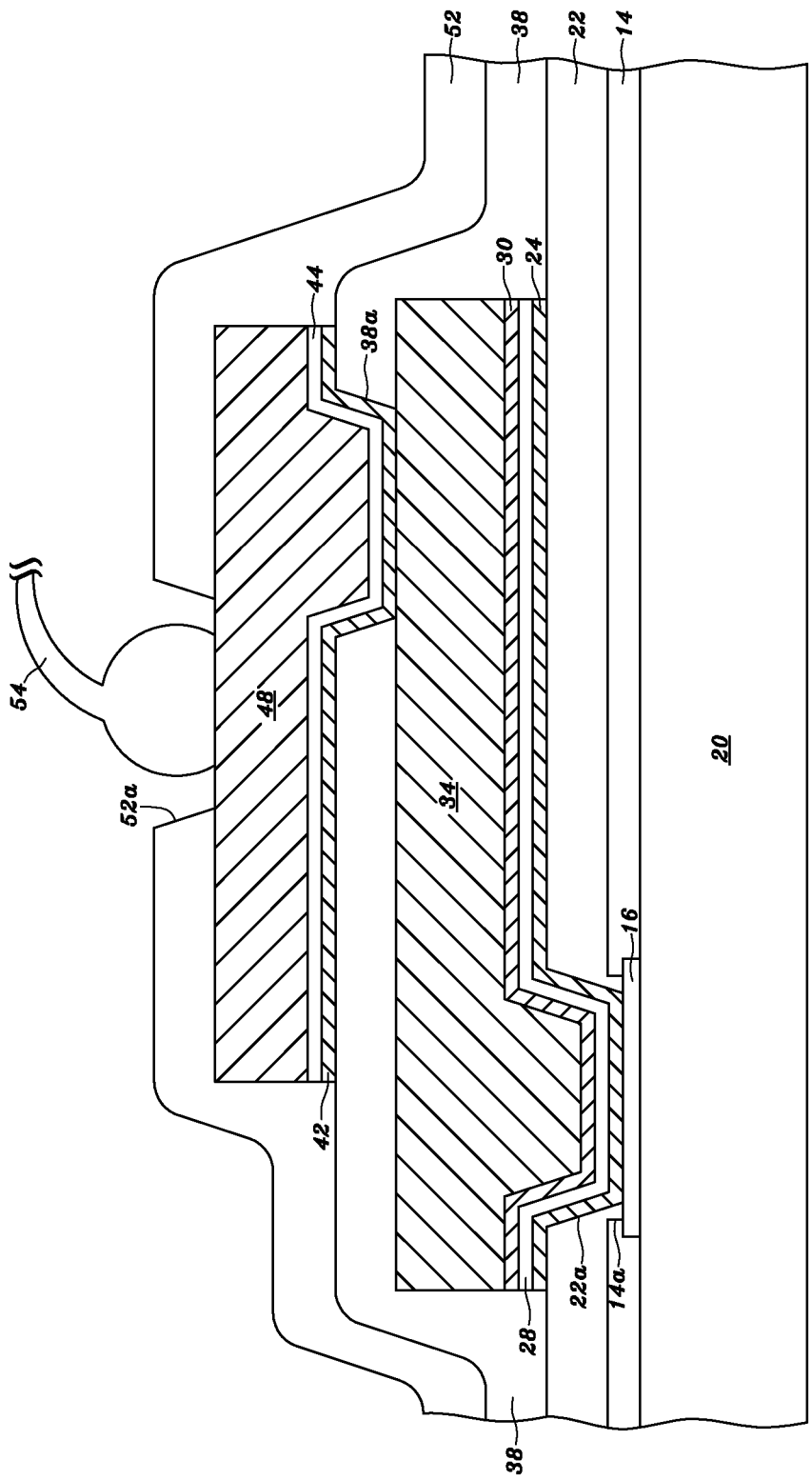

So far, a semiconductor wafer is formed by the above-mentioned steps. Next, the semiconductor wafer can be diced into a plurality of individual IC chips, semiconductor chips. Referring to FIG. 5I, when one of the IC chips is being packaged, one end of a wire 54 (made of gold or copper) can be ball bonded on the metal layer 48 of an IC chip by a wire-bonding process. The other end of the wire 54 can be wedge bonded with an aluminum layer provided by a pad of another IC chip, a pad over another semiconductor substrate, or a pad over a silicon substrate. Alternatively, the other end of the wire 54 can be wedge bonded with a gold layer provided by a pad of another IC chip, a pad over another semiconductor substrate, a pad over an organic substrate, a pad over a ceramic substrate, a pad over a silicon substrate, a pad over a glass substrate, or a pad over a flexible film comprising a polymer layer with a thickness of between 30 and 200 µm. Alternatively, the other end of the wire 54 can be wedge bonded with a copper layer provided by a pad of another IC chip, a pad over another semiconductor substrate, a pad over an organic substrate, a pad over a ceramic substrate, a pad over a silicon substrate, a pad over a glass substrate, or a pad over a flexible film comprising a polymer layer with a thickness of between 30 and 200 µm. Alternatively, the other end of the wire 54 can be wedge bonded with an inner lead (made of copper) of a lead frame.

In this embodiment, the strength of bonding the wire 54 to the metal layer 48 of the metal trace 50 exposed by the opening 38a of an IC chip may ranges from 100 to 1000 mN, from 200 to 1000 mN, or from 200 to 500 mN. After the wire-bonding process shown in FIG. 5I is completed, a polymeric material, such as epoxy or polyimide, can be formed to cover the wire 54.

Alternatively, after the step shown in FIG. 5H have been completed, a tin-containing layer or bump having a thickness of between 1 and 500 µm, and preferably between 3 and 250 µm, can be formed over the metal layer 48 of the metal trace 50 exposed by the opening 52a. So far, the process for forming a semiconductor wafer is completed. Next, the semiconductor wafer can be diced into a plurality of individual IC chips. The tin-containing layer or bump may be formed by an electroplating method, an electroless plating method or a screen printing process. The tin-containing metal layer or bump is, for example, a tin-lead alloy, a tin-silver alloy, a tin-silver-copper alloy, a lead-free alloy. Using a tin-lead solder for illustration, the weight ratio of tin to lead can be adjusted accordingly. Atypical weight ratio of lead to tin is 90/10, 95/5, 97/3 or 37/63, etc.

Alternatively, referring to FIG. 5H, a metal bump having a titanium-containing layer with a thickness of between 0.1 and 0.7 microns on the pad exposed by the opening 52a, a copper layer with a thickness of between 1 and 10 microns on the titanium-containing layer, a nickel layer with a thickness of between 0.5 and 5 microns on the copper layer, and a tin-containing layer with a thickness of between 10 and 300 microns on the nickel layer may be formed on the pad exposed by the opening 38a, followed by dicing the semiconductor wafer into multiple semiconductor chips. The semiconductor chip may be bonded to a BGA substrate through the metal bump.

Alternatively, referring to FIG. 5H, a metal bump having a titanium-containing layer with a thickness of between 0.1 and 0.7 microns on the pad exposed by the opening 52a, and a gold layer with a thickness of between 5 and 25 microns on the titanium-containing layer may be formed on the pad exposed by the opening 38a, followed by dicing the semiconductor wafer into multiple semiconductor chips. The metal bump may connect the semiconductor chip to a glass substrate via ACF or ACP. Besides, the metal bump may connect the semiconductor chip to a printed circuit board via tape automated bonding (TAB). Besides, the metal bump may connect the semiconductor chip to a flexible substrate without glass fiber.

Figure 5J:
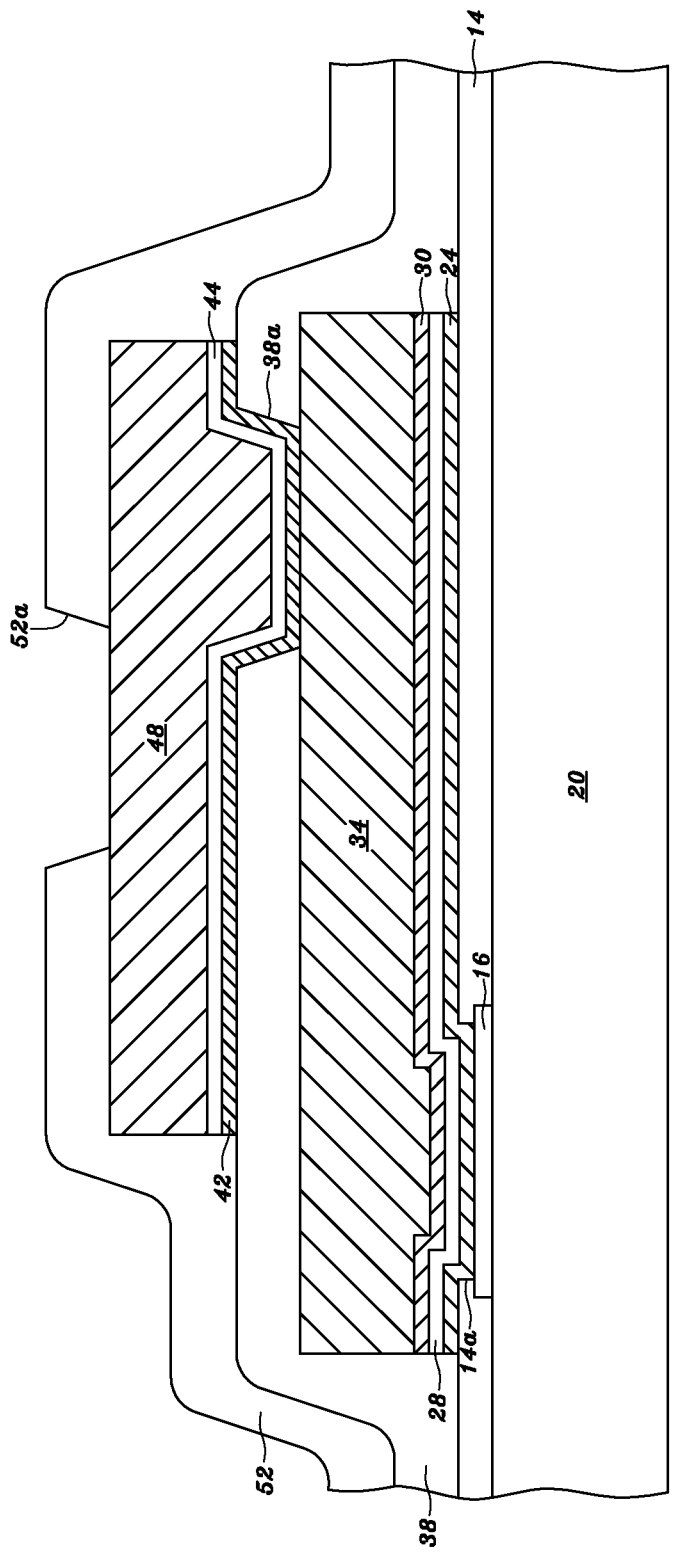

Referring to FIG. 5J, in this embodiment, the step of forming the polymer layer 22 on the passivation layer 14, as shown in FIGS. 2A and 2B or in FIGS. 2A and 2C, can be omitted, that is, the titanium-containing layer 24 having a thickness of between 0.005 and 1 µm, and preferably between 0.01 and 0.7 µm can be directly formed on the passivation layer 14 and on the pad 16 exposed by the opening 14a, followed by the above-mentioned steps as shown in FIGS. 4A-4H and FIGS. 5A-5H, followed by the above-mentioned step as shown in FIG. 5I or followed by forming the tin-containing layer or the above-mentioned metal bump over the metal trace 50 exposed by the opening 52a.

Alternatively, the above-mentioned process can be applied to a wafer including multiple pads principally made of electroplated copper, and a passivation layer including a first silicon-nitride layer having a thickness of 0.2 and 1 µm, an silicon-oxide layer having a thickness of between 0.2 and 1 µm, on the first silicon-nitride layer, and a second silicon-nitride layer having a thickness of between 0.2 and 1 µm on the silicon-oxide layer, multiple openings in the passivation layer exposing the pads principally made of electroplated copper. That is, the above mentioned polymer layer 22 can be formed on the second silicon-nitride layer of the passivation layer, the opening 22a in the polymer layer 22 exposing the electroplated copper of the pad and optionally exposing the second silicon-nitride layer of the passivation layer surrounding the openings in the passivation layer, which can be referred to the above description concerning FIGS. 2A-2C, followed by forming the above-mentioned titanium-containing layer or tantalum-containing layer 24 on the polymer layer 22 and on the pads principally made of electroplated copper, as referred to in FIG. 2D, followed by the steps as referred to in FIGS. 4A-4H and FIGS. 5A and 5H, followed by the above-mentioned step as shown in FIG. 5I or followed by forming the tin-containing layer or the above-mentioned metal bump over the metal trace 50 exposed by the opening 52a. Besides, the polymer layer 22 can be omitted. That is, the above-mentioned titanium-containing layer or tantalum-containing layer 24 can be formed directly on the second silicon-nitride layer of the passivation layer and on the pads principally made of electroplated copper, as referred to in FIG. 2D, followed by the steps as referred to in FIGS. 4A-4H and FIGS. 5A and 5H, followed by the above-mentioned step as shown in FIG. 5I or followed by forming the tin-containing layer or the above-mentioned metal bump over the metal trace 50 exposed by the opening 52a.

Figure 5K:
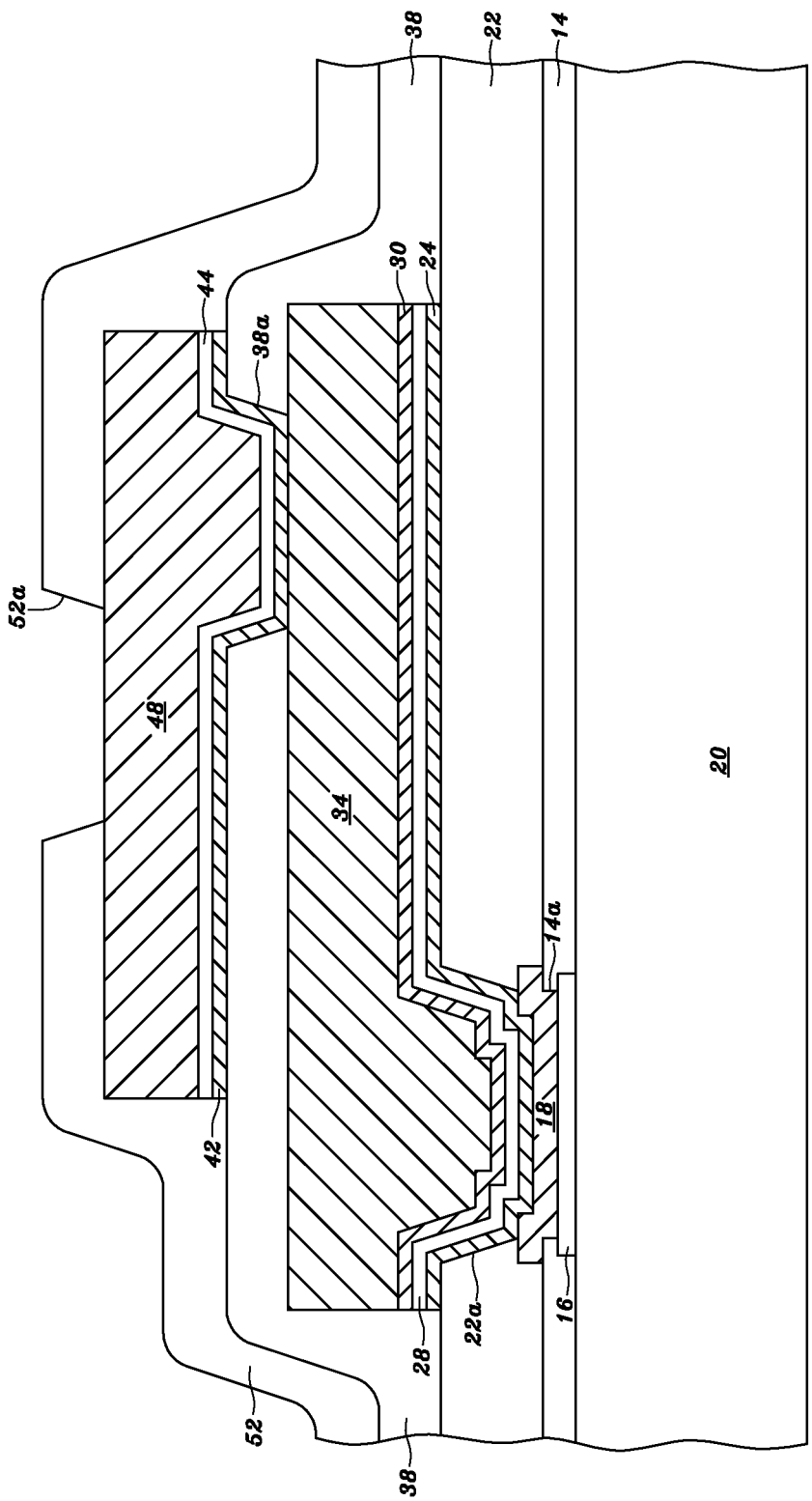

Alternatively, referring to FIG. 5K, the above-mentioned process can be applied to a wafer including multiple pads 16 principally made of electroplated copper, a passivation layer 14 including a first silicon-nitride layer having a thickness of 0.2 and 1 µm, an silicon-oxide layer having a thickness of between 0.2 and 1 µm, on the first silicon-nitride layer, and a second silicon-nitride layer having a thickness of between 0.2 and 1 µm on the silicon-oxide layer, multiple openings 14a in the passivation layer 14 exposing the pads 16 principally made of electroplated copper, and multiple metal caps 18 including a tantalum-containing layer, such as pure tantalum or tantalum nitride, having a thickness of between 0.01 and 0.6 µm, on the pads 16 principally made of electroplated copper, exposed by the openings 14a in the passivation layer 14, and an aluminum-containing layer having a thickness of between 0.5 and 3 µm, on the tantalum-containing layer. That is, the above mentioned polymer layer 22 can be formed on the second silicon-nitride layer of the passivation layer 14, the opening 22a in the polymer layer 22 exposing the metal cap 18, which can be referred to the above description concerning FIGS. 2A-2C, followed by forming the above-mentioned titanium-containing layer or tantalum-containing layer 24 on the polymer layer 22 and on the metal cap 18, as referred to in FIG. 2D, followed by the steps as referred to in FIGS. 4A-4H and FIGS. 5A and 5H, followed by the above-mentioned step as shown in FIG. 5I or followed by forming the tin-containing layer or the above-mentioned metal bump over the metal trace 50 exposed by the opening 52a. Besides, the polymer layer 22 can be omitted. That is, the above-mentioned titanium-containing layer or tantalum-containing layer 24 can be formed directly on the second silicon-nitride layer of the passivation layer 14 and on the metal cap 18, as referred to in FIG. 2D, followed by the steps as referred to in FIGS. 4A-4H and FIGS. 5A and 5H, followed by the above-mentioned step as shown in FIG. 5 or followed by forming the tin-containing layer or the above-mentioned metal bump over the metal trace 50 exposed by the opening 52a.

Those described above are the embodiments to exemplify the present invention to enable the person skilled in the art to understand, make and use the present invention. However, it is not intended to limit the scope of the present invention. Any equivalent modification and variation according to the spirit of the present invention is to be also included within the scope of the claims stated below.

What is claimed is:

1. An IC chip comprising:
a semiconductor substrate;
an aluminum-containing layer coupled to said semiconductor substrate;
a first dielectric layer coupled to said semiconductor substrate, wherein a first opening in said first dielectric layer exposes the aluminum-containing layer;
a first titanium-containing layer on a first surface of said aluminum-containing layer and a first surface of said first dielectric layer;
a second titanium-containing layer on said first titanium-containing layer and directly on the first surface of said first dielectric layer, wherein said second titanium-containing layer is coupled to said first titanium-containing layer and said first surface of said first dielectric layer;
a first conductive layer on said second titanium-containing layer; and
a polymer layer on a first surface of said first conductive layer.

2. The IC chip of claim 1, wherein said first conductive layer comprises a copper layer on said second titanium-containing layer.

3. The IC chip of claim 1, wherein said first titanium-containing layer comprises a titanium-tungsten alloy.

4. The IC chip of claim 1, wherein said first titanium-containing layer comprises titanium nitride (TiN).

5. The IC chip of claim 1, wherein said second titanium-containing layer comprises a titanium-tungsten alloy.

6. The IC chip of claim 1, wherein said first titanium-containing layer has a thickness between 0.01 and 0.7 micrometers.

7. The IC chip of claim 1, wherein said second titanium-containing layer has a thickness between 0.02 and 0.5 micrometers.

8. The IC chip of claim 1, wherein said first conductive layer comprises a gold layer on said second titanium-containing layer.

9. The IC chip of claim 1, wherein said first dielectric layer comprises a polymer.

10. The IC chip of claim 1 further comprising a second conductive layer over said semiconductor substrate, wherein said second conductive layer comprises a copper layer and a third conductive layer at a bottom and a sidewall of said copper layer, wherein said aluminum-containing layer is further over said second conductive layer.

11. The IC chip of claim 10 further comprising a second dielectric layer over said semiconductor substrate, wherein said second dielectric layer comprises an oxide, wherein a second opening in said second dielectric layer is over a contact point of said second conductive layer, and said contact point is at a bottom of said second opening, wherein said aluminum-containing layer is further over said contact point and said second dielectric layer and coupled to said contact point through said second opening.

12. An IC chip comprising:
a semiconductor substrate;
a conductive pad on a surface of the semiconductor substrate;
a first conductive layer on said conductive pad, wherein said first conductive layer comprises a first titanium-containing layer and an aluminum-containing layer on said first titanium-containing layer;
a polymer layer over said semiconductor substrate, wherein a first opening in said polymer layer is over said first conductive layer;
a second titanium-containing layer on a first surface of said first conductive layer opposite the conductive pad;
a second metal conductive layer on said second titanium-containing layer and a first surface of said polymer layer opposite the semiconductor substrate, wherein said second conductive layer is directly on said second titanium-containing layer and said first surface of said polymer layer; and
a third conductive layer on said second conductive layer.

13. The IC chip of claim 12, wherein said third conductive layer comprises a copper layer on said second conductive layer.

14. The IC chip of claim 12, wherein said first titanium-containing layer comprises a titanium-tungsten alloy.

15. The IC chip of claim 12, wherein said first titanium-containing layer comprises titanium nitride (TiN).

16. The IC chip of claim 12, wherein said second titanium-containing layer comprises a titanium-tungsten alloy.

17. The IC chip of claim 12, wherein said first titanium-containing layer has a thickness between 0.01 and 0.5 micrometers.

18. The integrated circuit of claim 12, wherein said second titanium-containing layer has a thickness between 0.01 and 0.7 micrometers.

19. The IC chip of claim 12, wherein said third conductive layer comprises a gold layer on said second conductive layer.

20. The IC chip of claim 12, wherein said second conductive layer comprises titanium.

21. The IC chip of claim 12 further comprising a fourth conductive layer over said semiconductor substrate, wherein said fourth conductive layer comprises a copper layer, and a fifth conductive layer at a bottom and a sidewall of said copper layer, wherein said forth conductive layer is further over said fifth conductive layer.

22. The IC chip of claim 21 further comprising a dielectric layer over said semiconductor substrate, wherein said dielectric layer comprises an oxide, wherein a second opening in said dielectric layer is over a contact point of said fourth conductive layer, and said contact point is at a bottom of said second opening, wherein said first conductive layer is further on said contact point and said dielectric layer and coupled to said contact point through said second opening.

* * * * *